(12) United States Patent
Osada et al.

(10) Patent No.: US 10,535,391 B2
(45) Date of Patent: Jan. 14, 2020

(54) SEMICONDUCTOR STORAGE DEVICE

(71) Applicant: TOSHIBA MEMORY CORPORATION, Minato-ku, Tokyo (JP)

(72) Inventors: Yoshiaki Osada, Kawasaki Kanagawa (JP); Kosuke Hatsuda, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/124,007

(22) Filed: Sep. 6, 2018

(65) Prior Publication Data

US 2019/0287594 A1    Sep. 19, 2019

(30) Foreign Application Priority Data

Mar. 13, 2018 (JP) ................................. 2018-045509

(51) Int. Cl.
| | |
|---|---|
| G11C 11/00 | (2006.01) |
| G11C 11/16 | (2006.01) |
| H01L 27/22 | (2006.01) |
| H01F 10/32 | (2006.01) |
| H01L 43/02 | (2006.01) |
| H01L 43/10 | (2006.01) |

(52) U.S. Cl.
CPC ........ G11C 11/1673 (2013.01); G11C 11/161 (2013.01); G11C 11/1675 (2013.01); H01F 10/3254 (2013.01); H01L 27/224 (2013.01); H01L 43/02 (2013.01); H01F 10/329 (2013.01); H01F 10/3286 (2013.01); H01L 43/10 (2013.01)

(58) Field of Classification Search
CPC .............. G11C 11/1673; G11C 11/161; G11C 11/1675; H01F 10/3254; H01F 10/3286; H01F 10/329; H01L 27/224; H01L 43/02; H01L 43/10
See application file for complete search history.

(56) References Cited

U.S. PATENT DOCUMENTS

| | | | |
|---|---|---|---|
| 7,463,509 | B2 | 12/2008 | Kim et al. |
| 8,576,616 | B2 | 11/2013 | Saida et al. |
| 10,163,977 | B1 * | 12/2018 | Fantini ................ H01L 27/2427 |
| 2014/0204661 | A1 | 7/2014 | Doyle et al. |

* cited by examiner

*Primary Examiner* — Gene N Auduong
(74) *Attorney, Agent, or Firm* — Holtz, Holtz & Volek PC

(57) ABSTRACT

According to one embodiment, a semiconductor storage device includes: a first conductor coupled to a first end of a first cell; a second conductor which couples between a second end of the first cell and a first end of a second cell; a third conductor coupled to a second end of the second cell; a first current source being capable of coupling to the first cell via the first conductor; a second current source being capable of coupling to the second cell via the third conductor; a first sense amplifier configured to read data from the first cell based on a current flowing from the first current source to the first cell; and a second sense amplifier configured to read data from the second cell based on a current flowing from the second cell to the second current source.

20 Claims, 44 Drawing Sheets

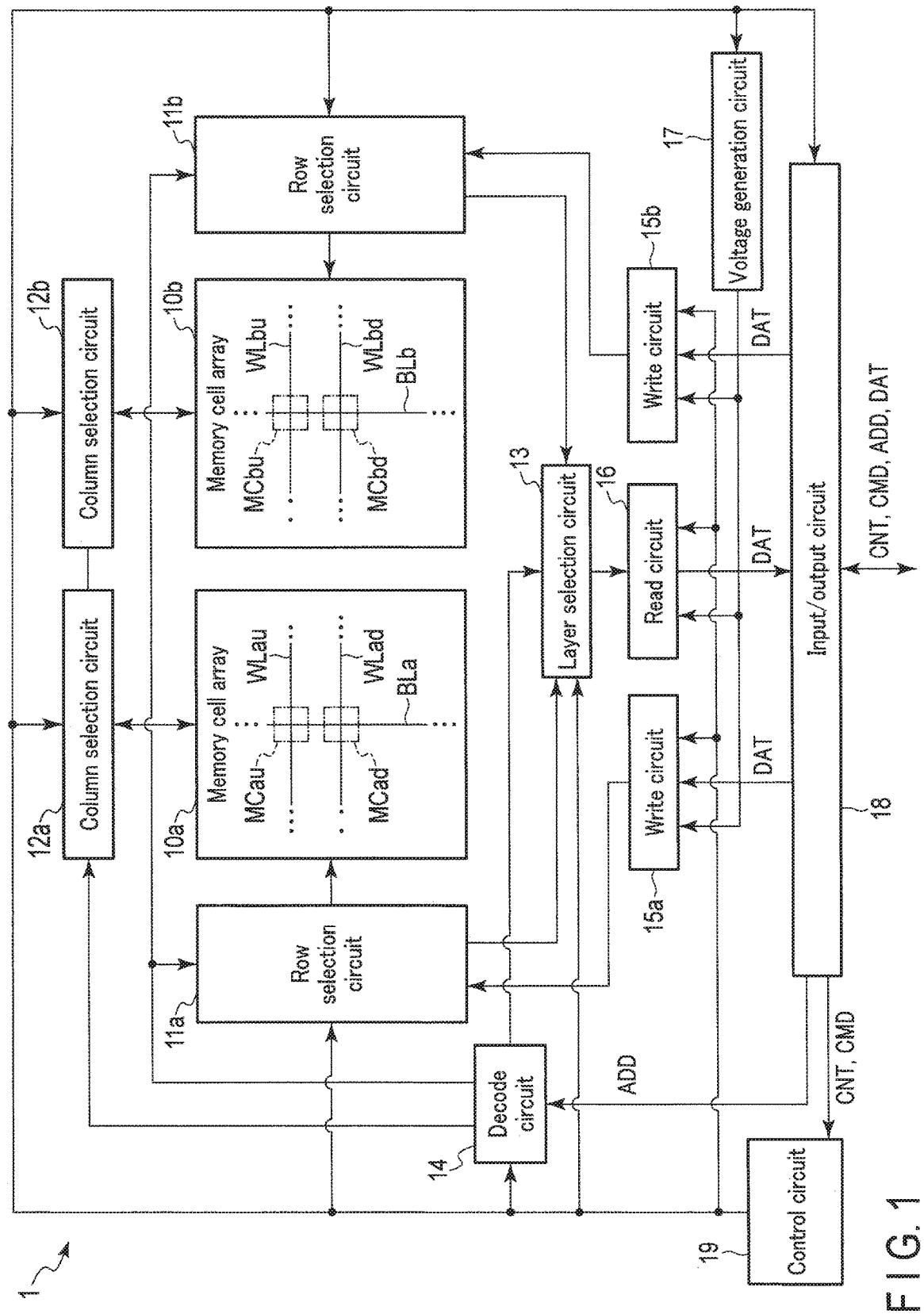
F I G. 1

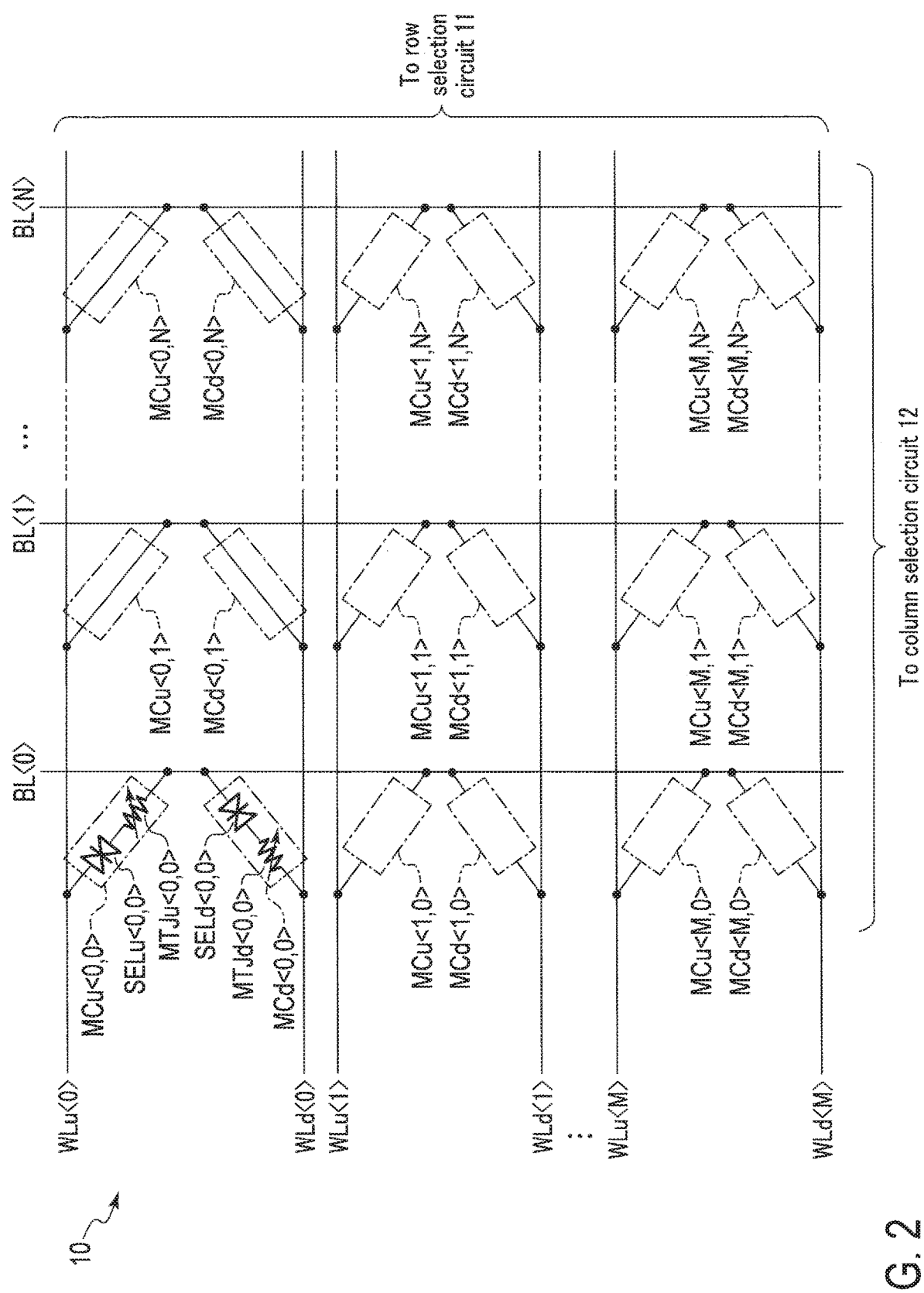
F I G. 2

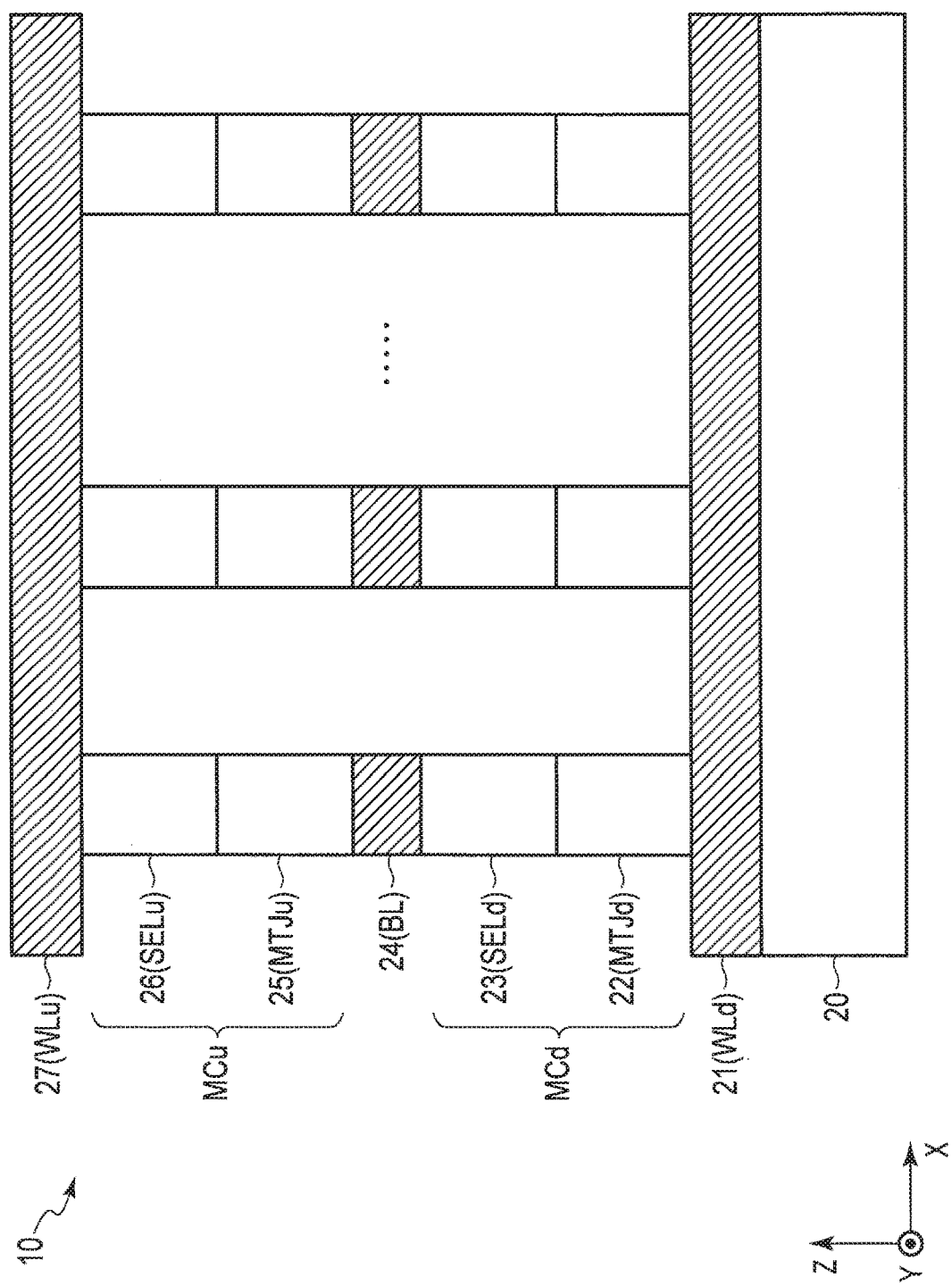
F I G. 3

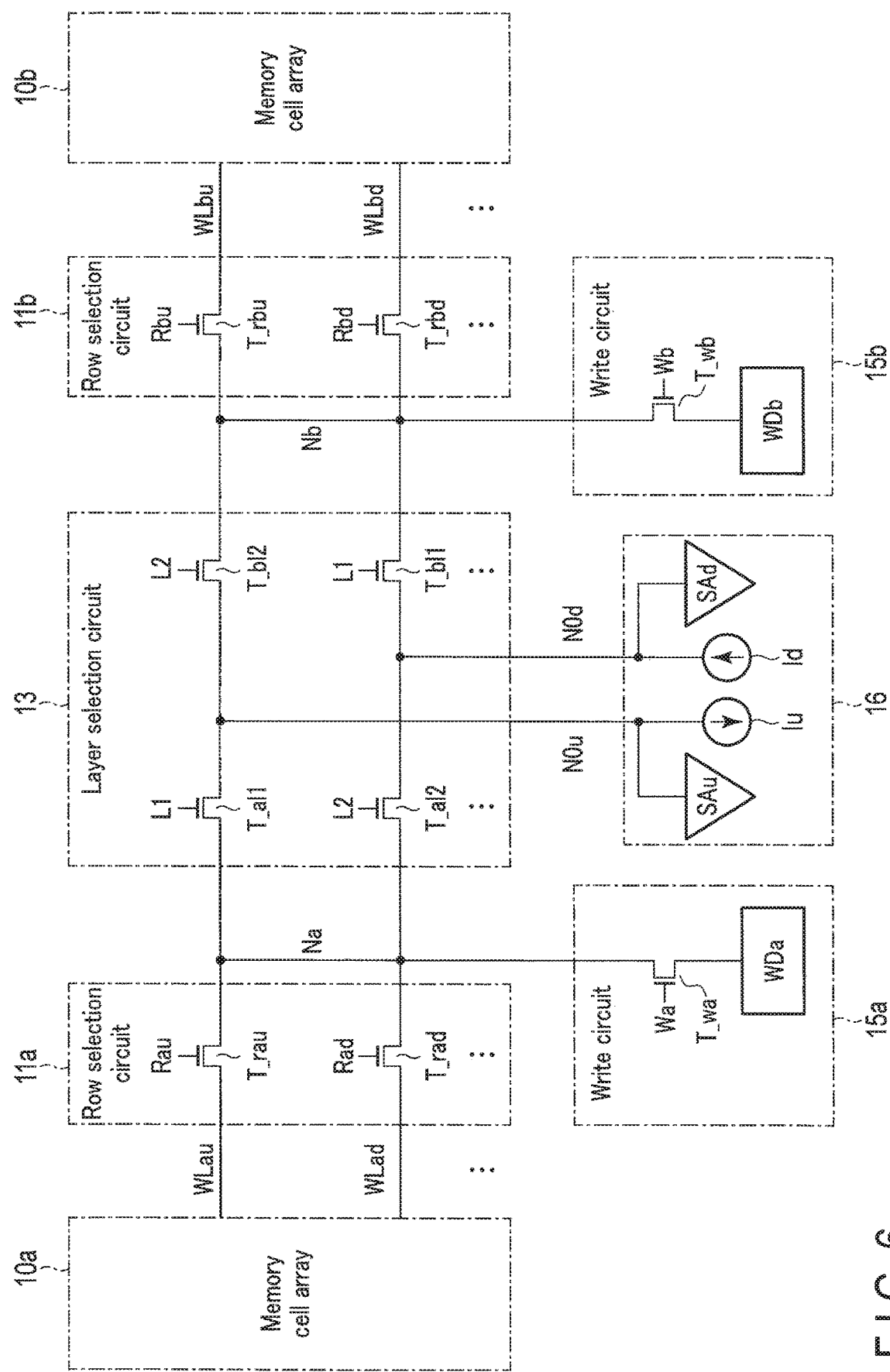
F I G. 6

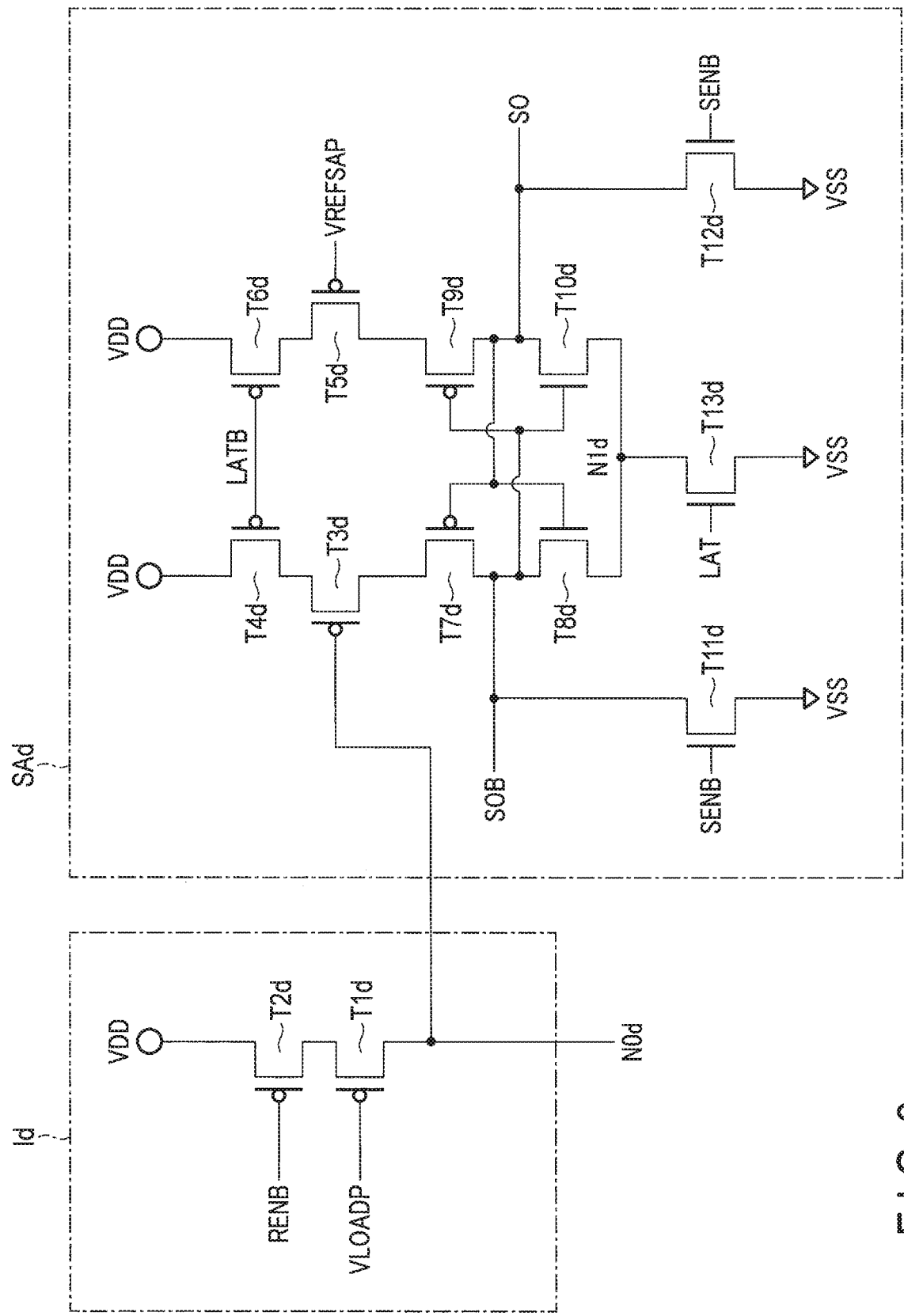
F I G. 8

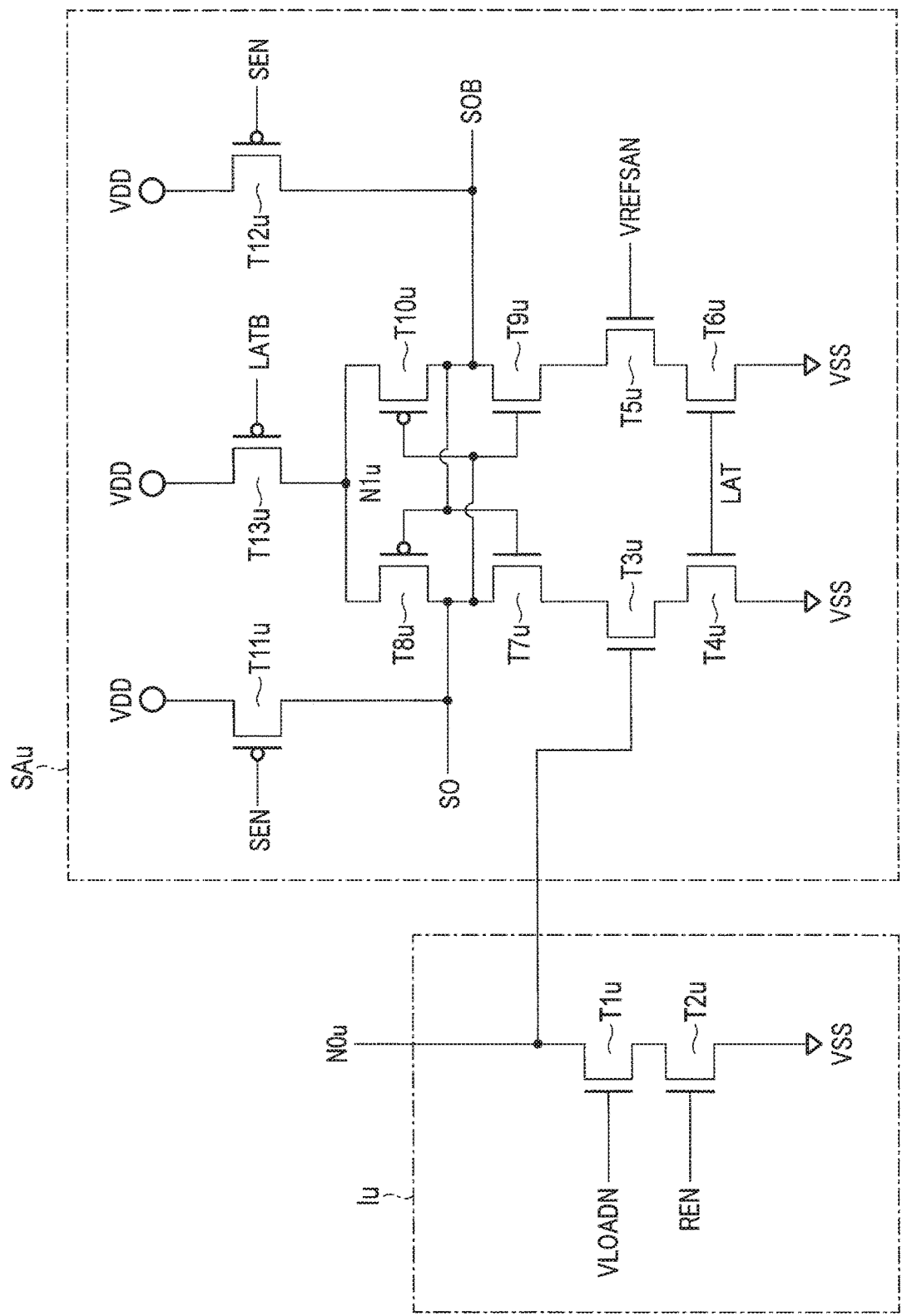
F I G. 9

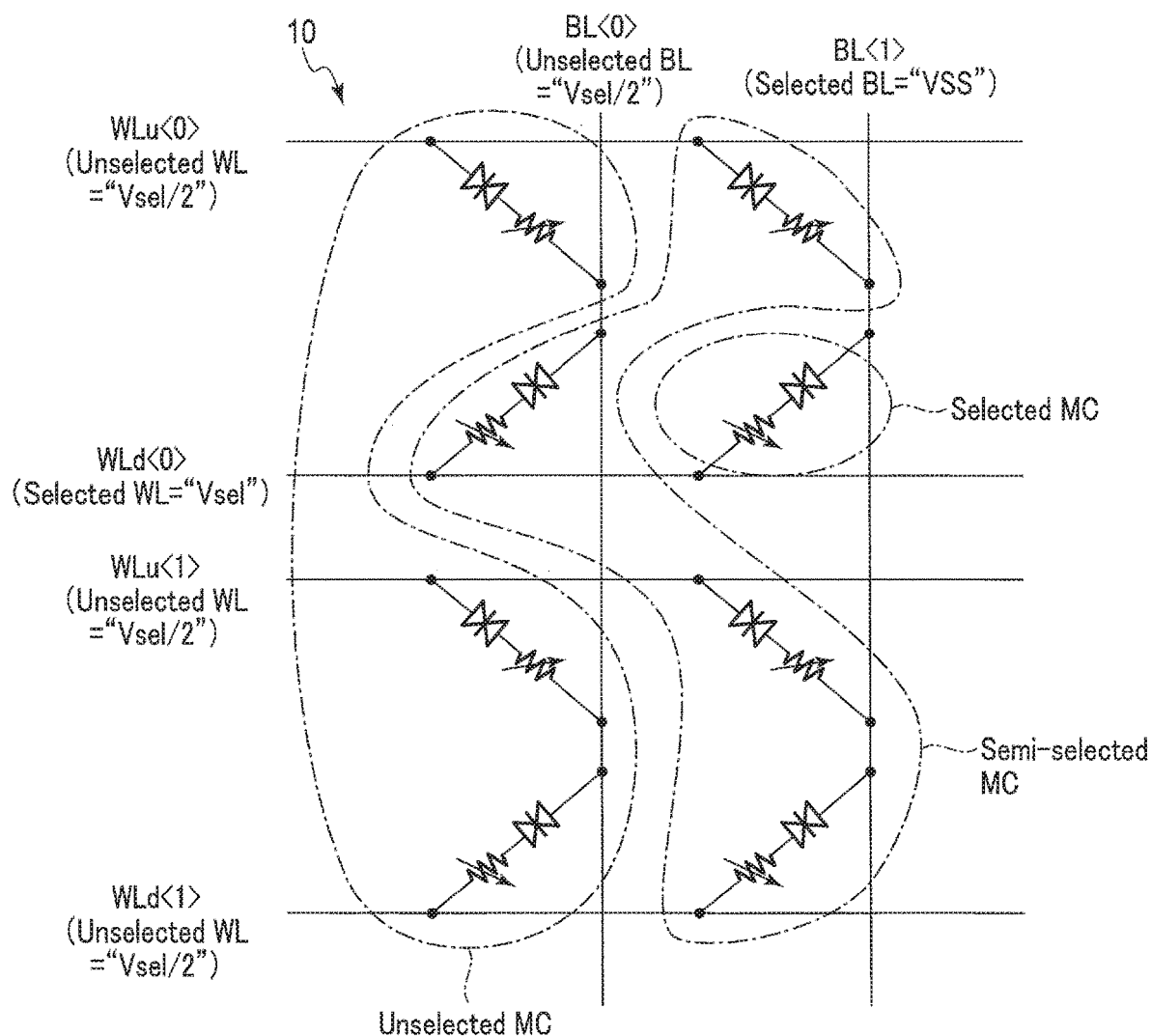
F I G. 10

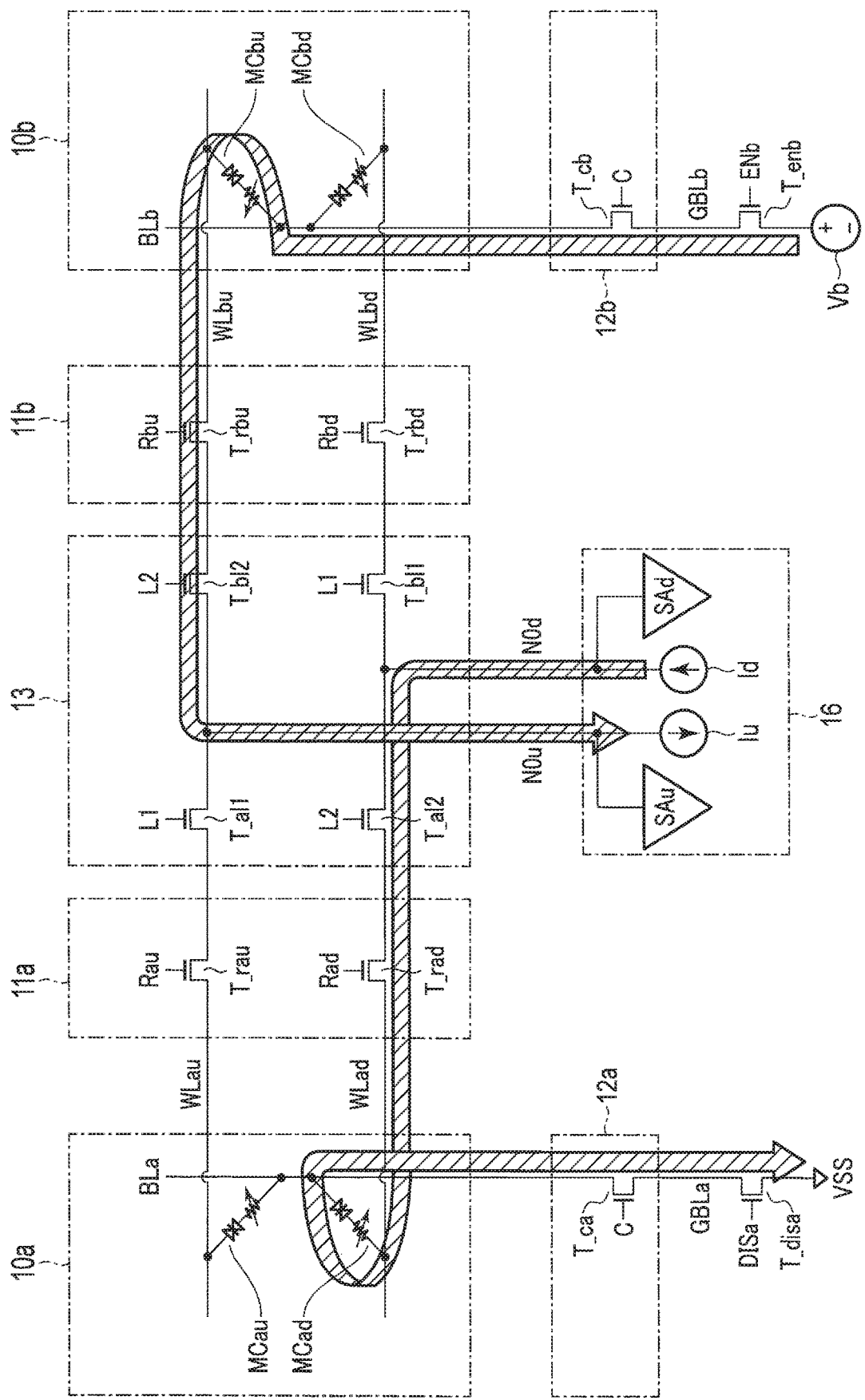
F I G. 11

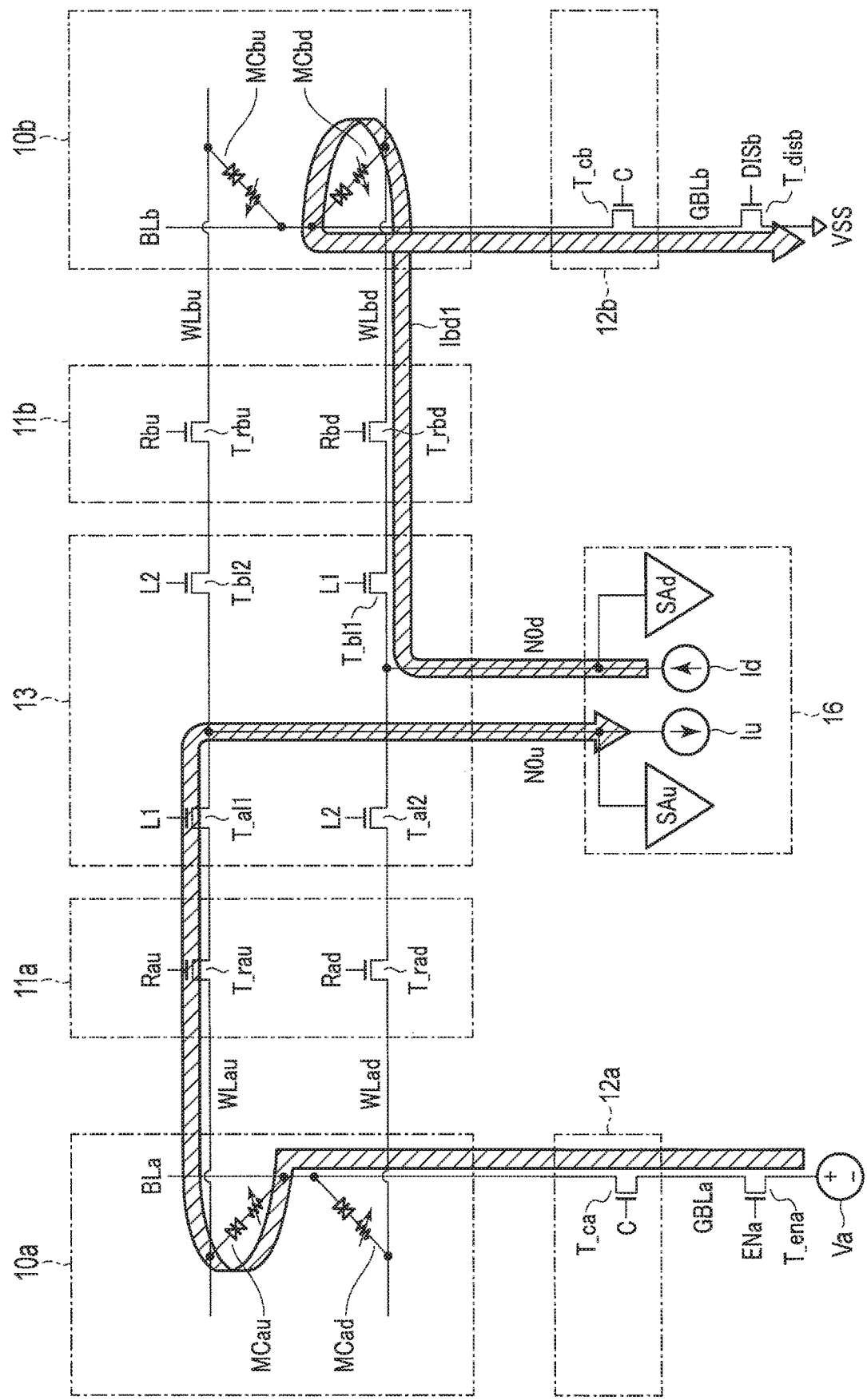
F I G. 12

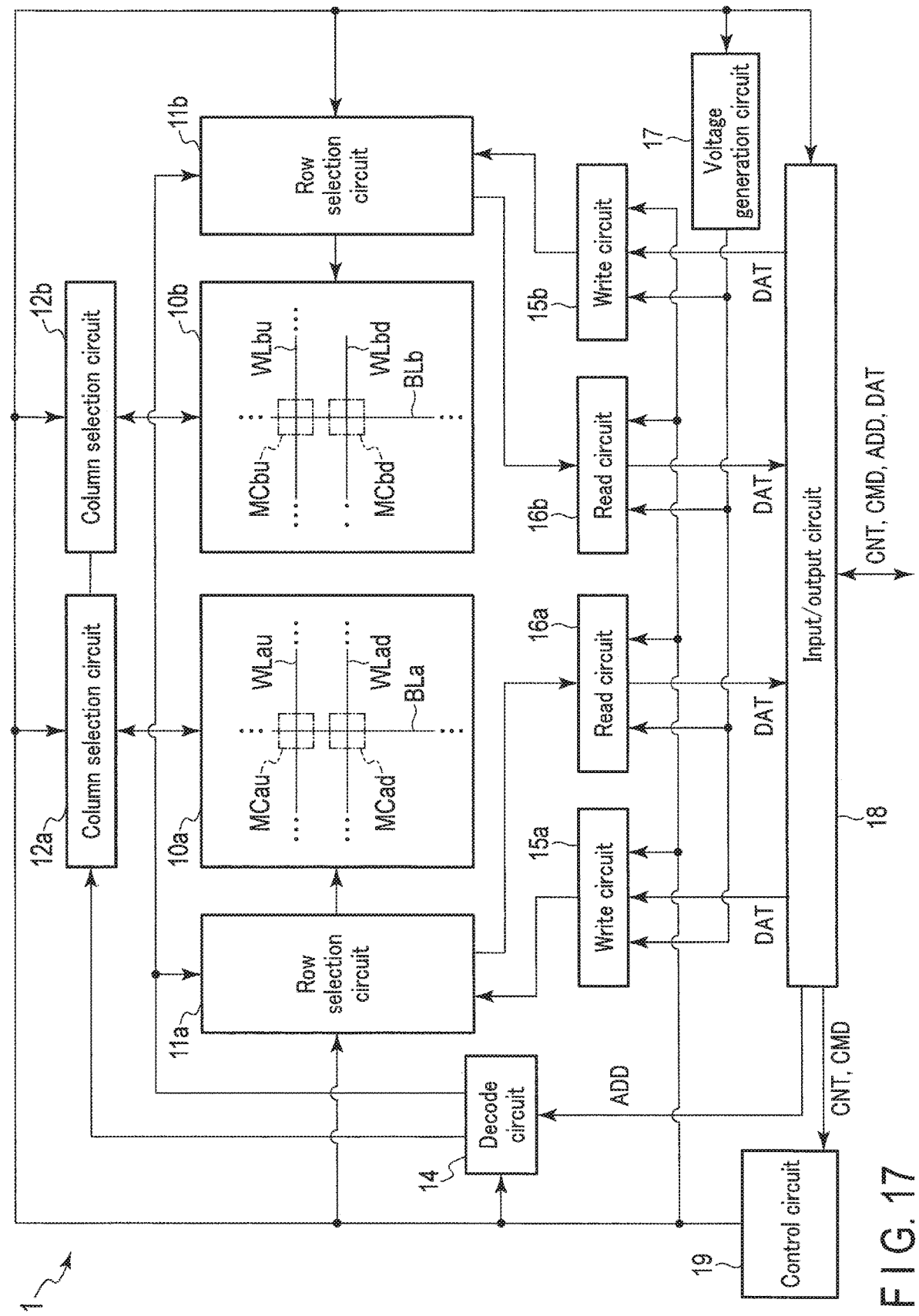
F I G. 17

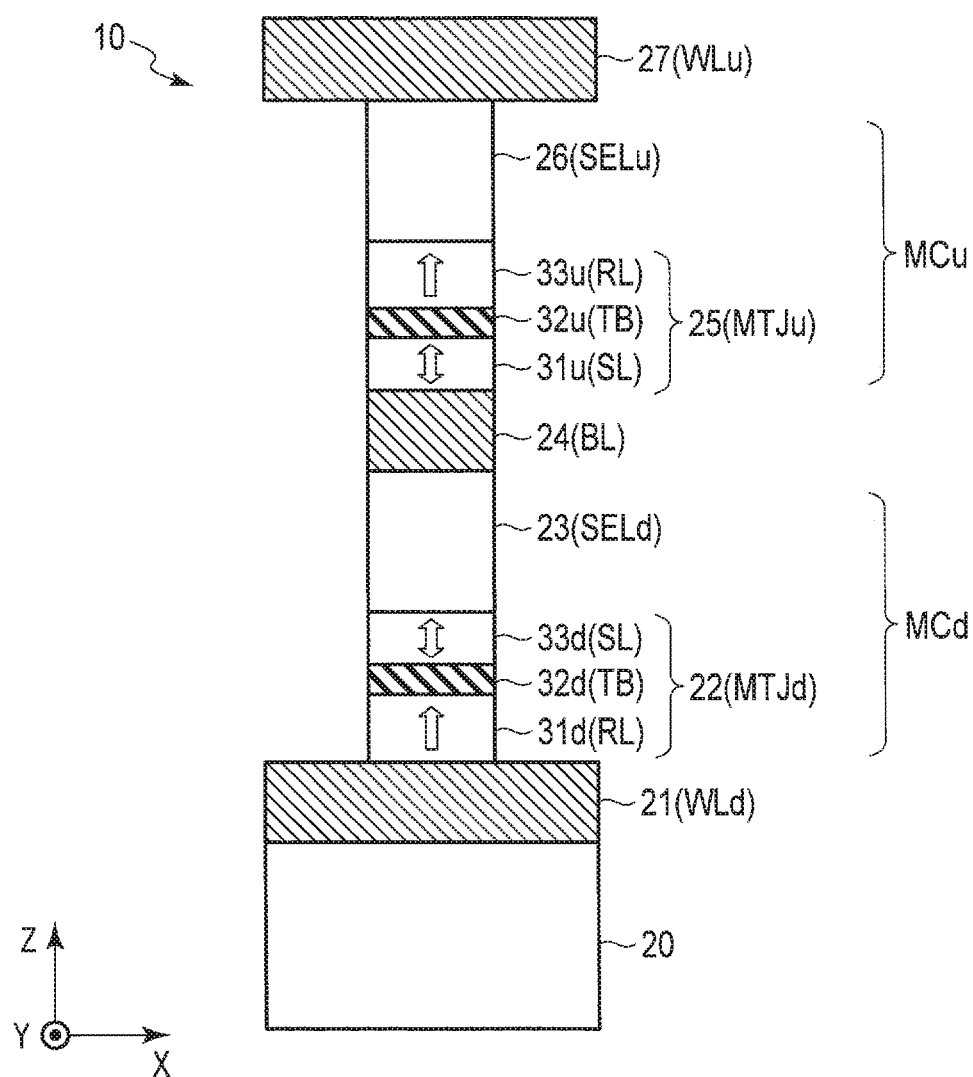
F I G. 21

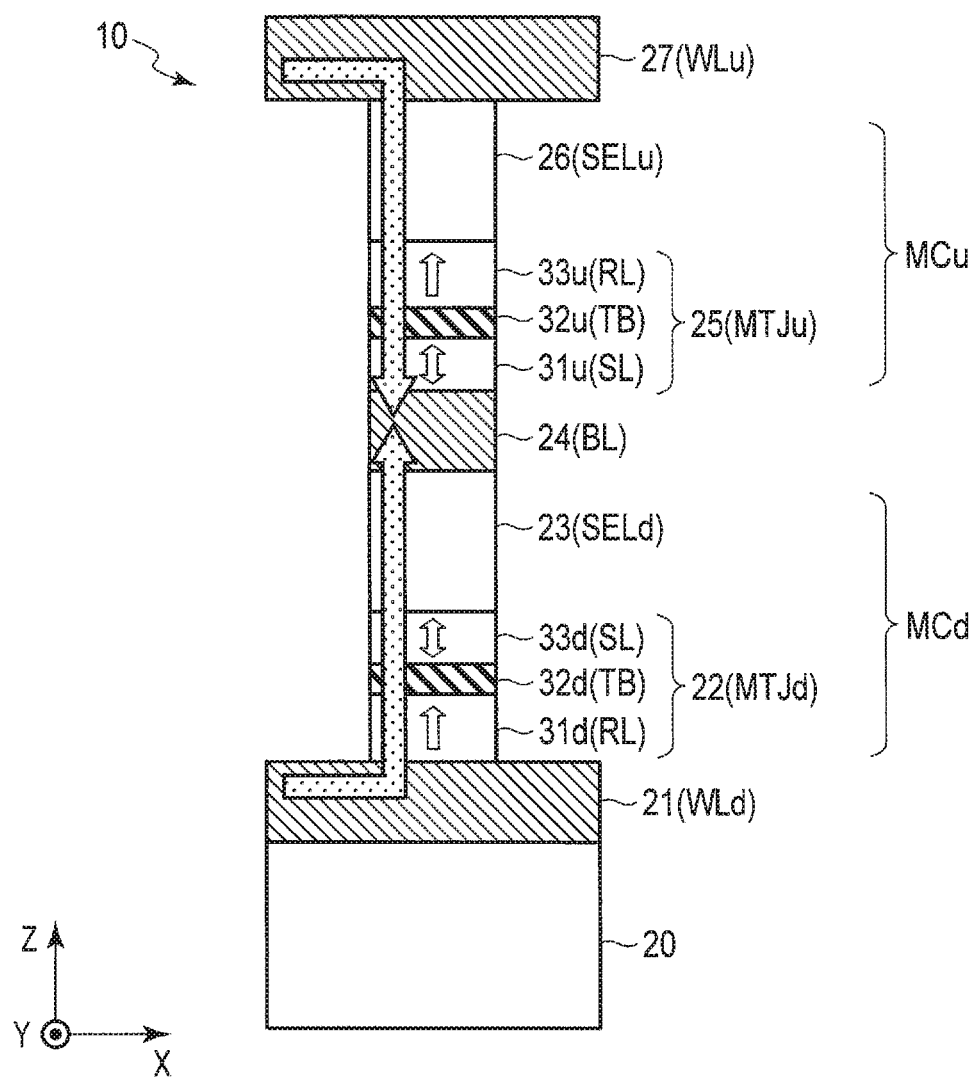
F I G. 22

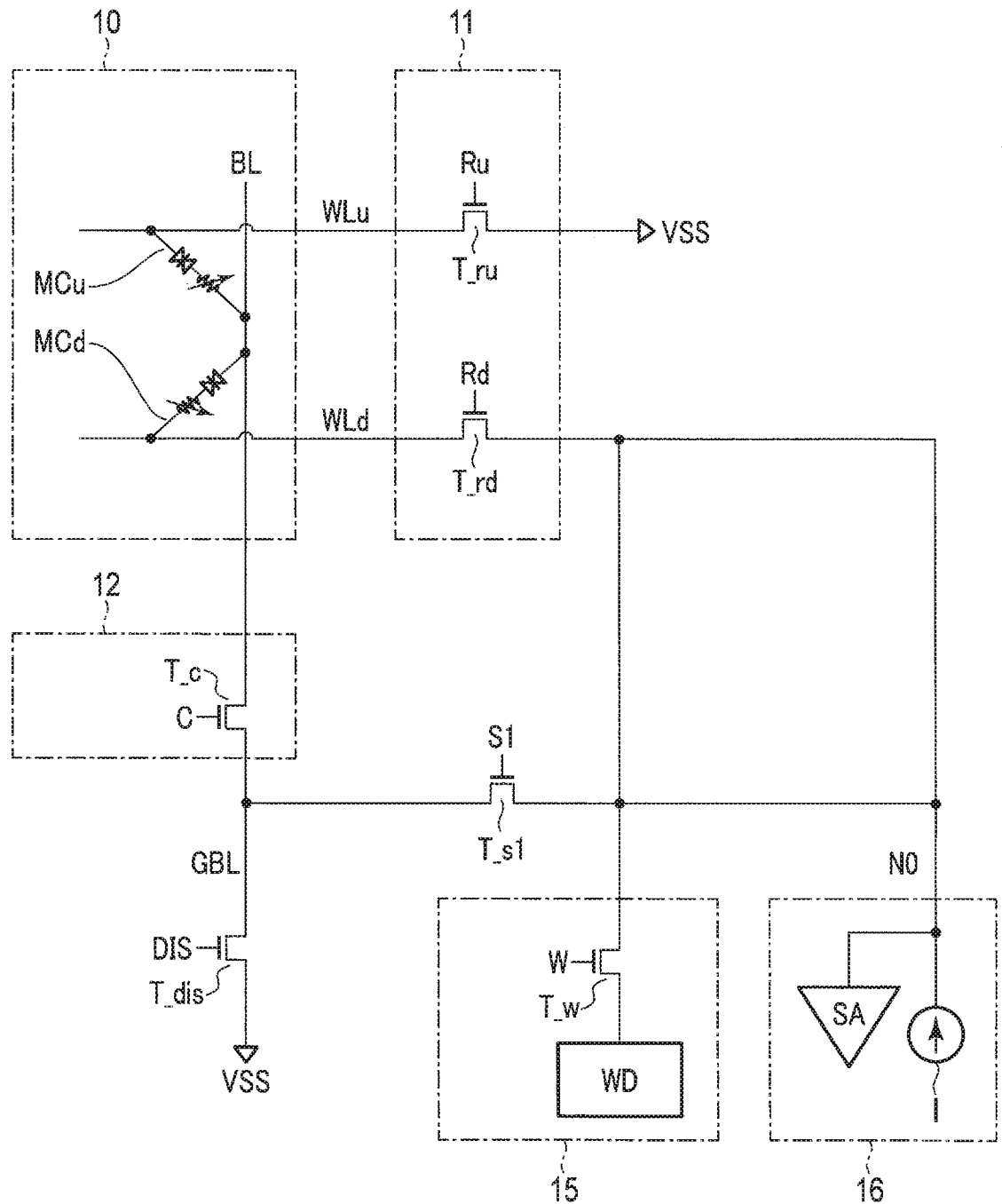
F I G. 23

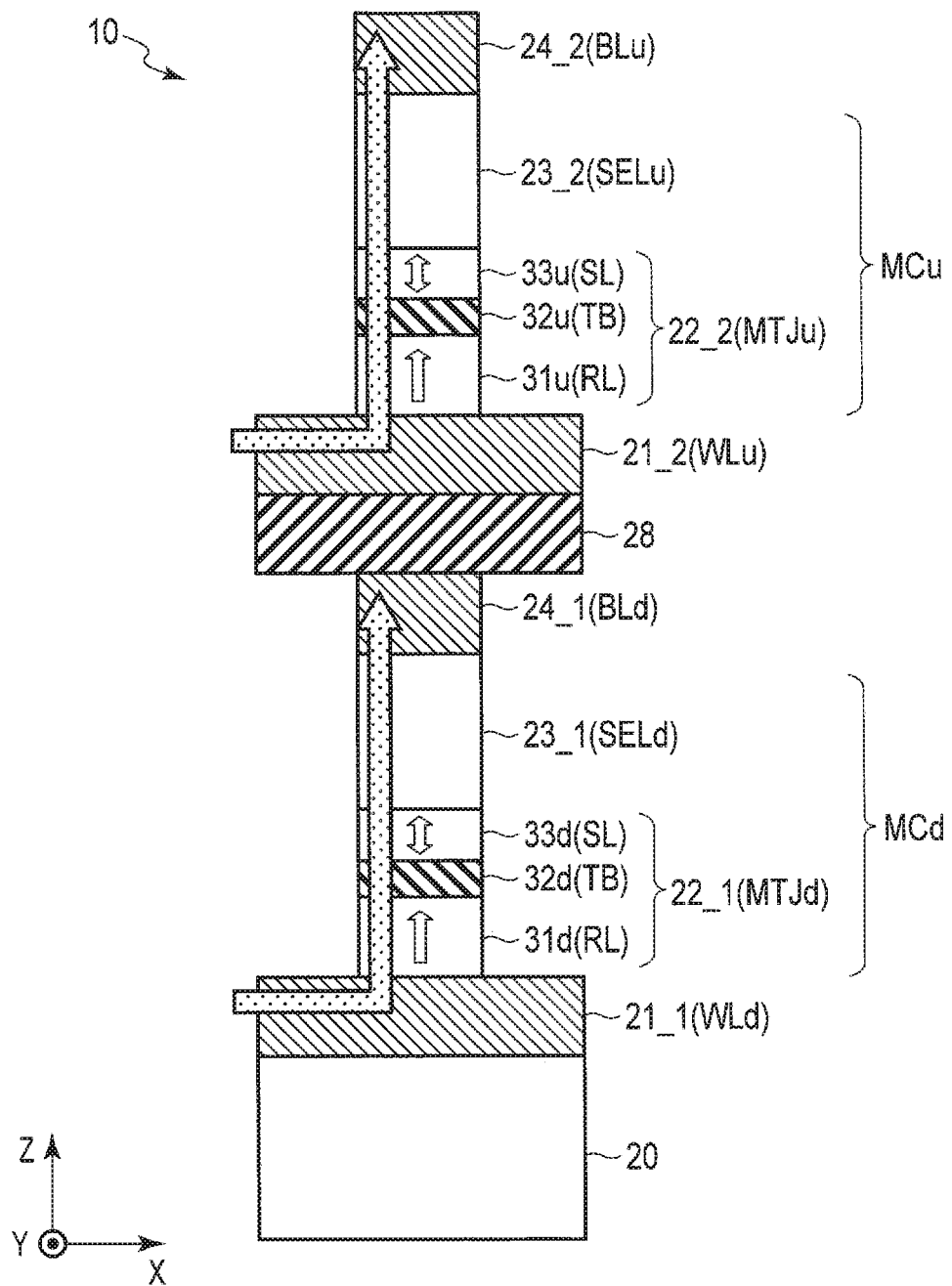
F I G. 31

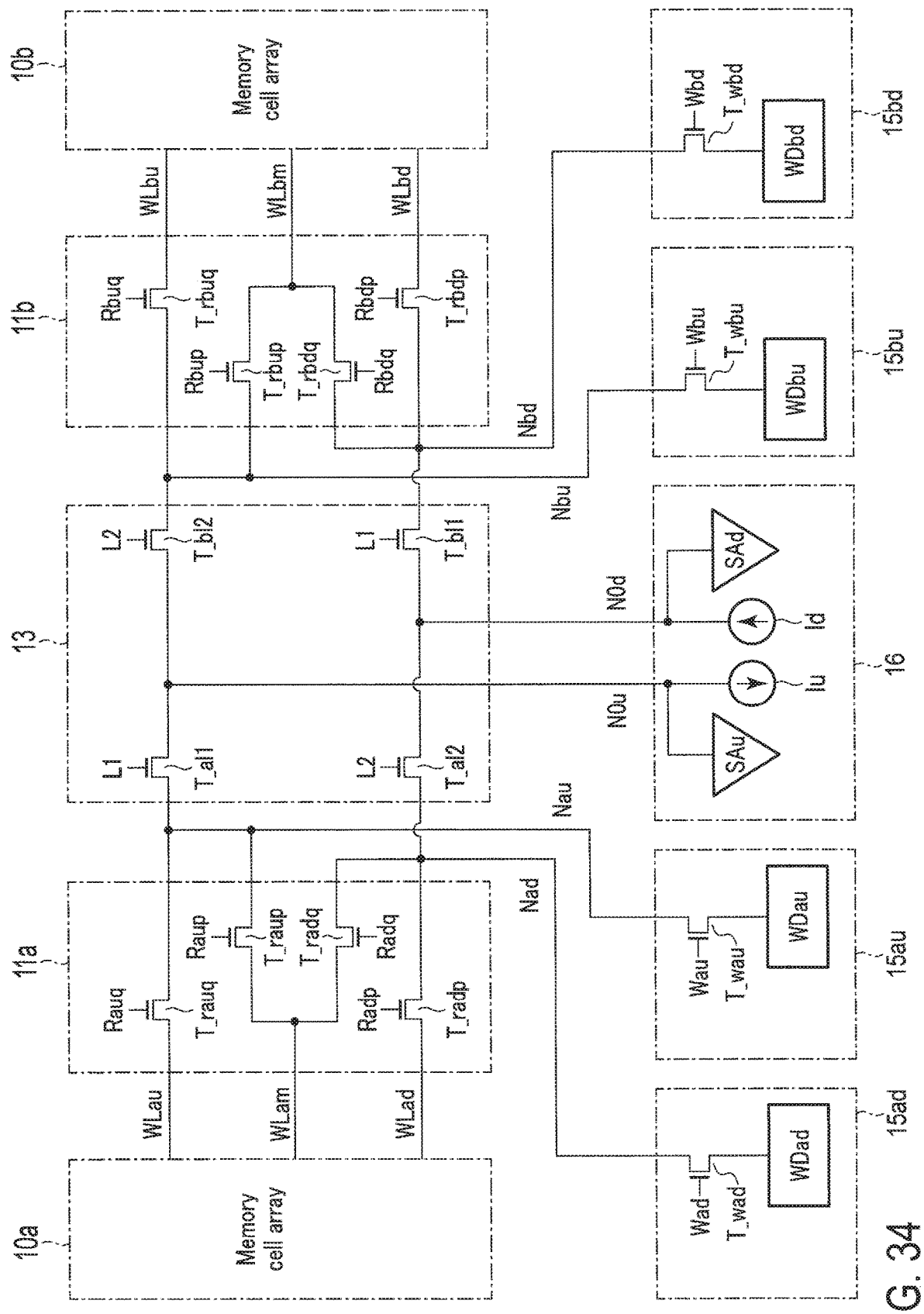
F I G. 34

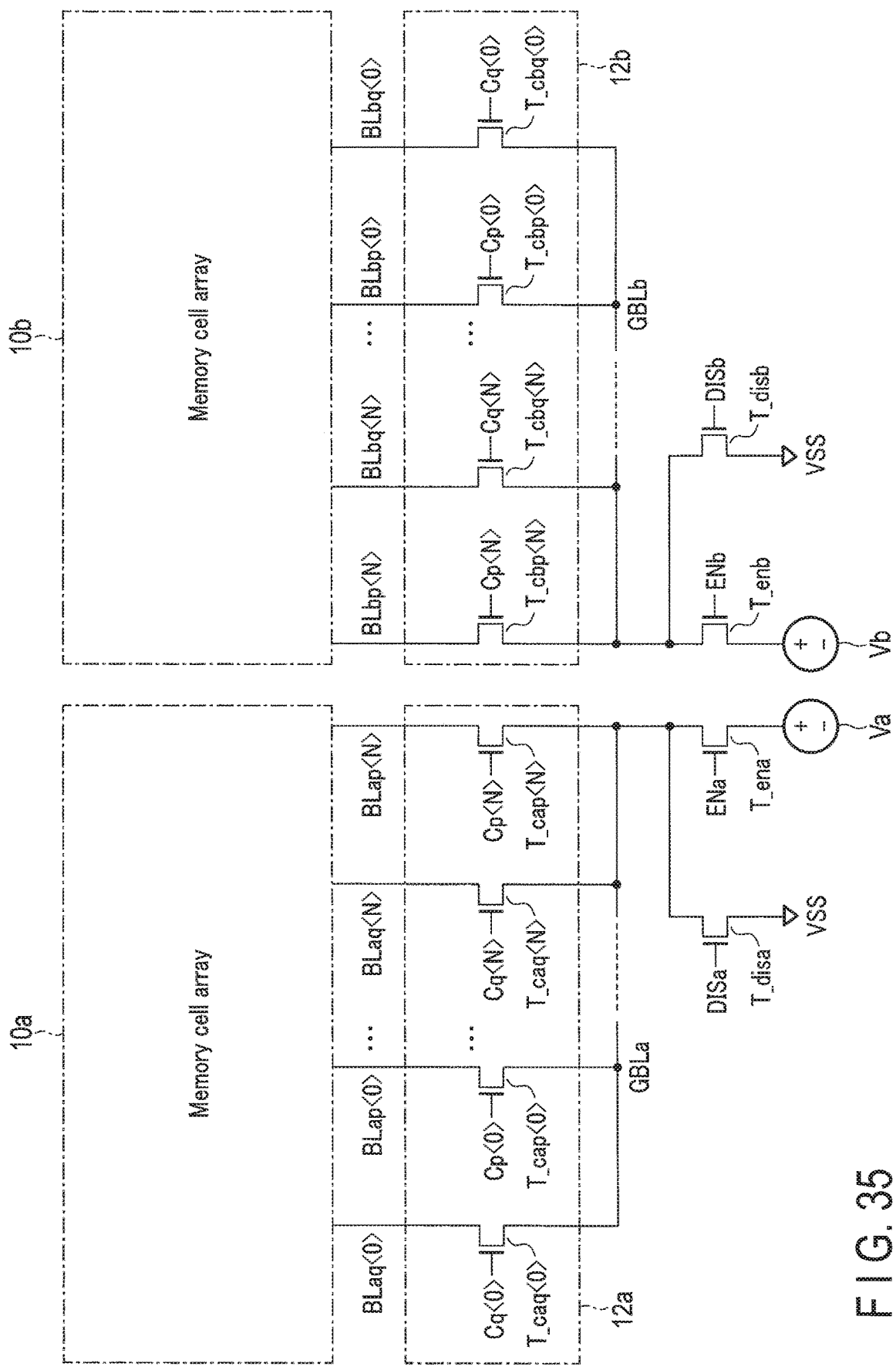
F I G. 35

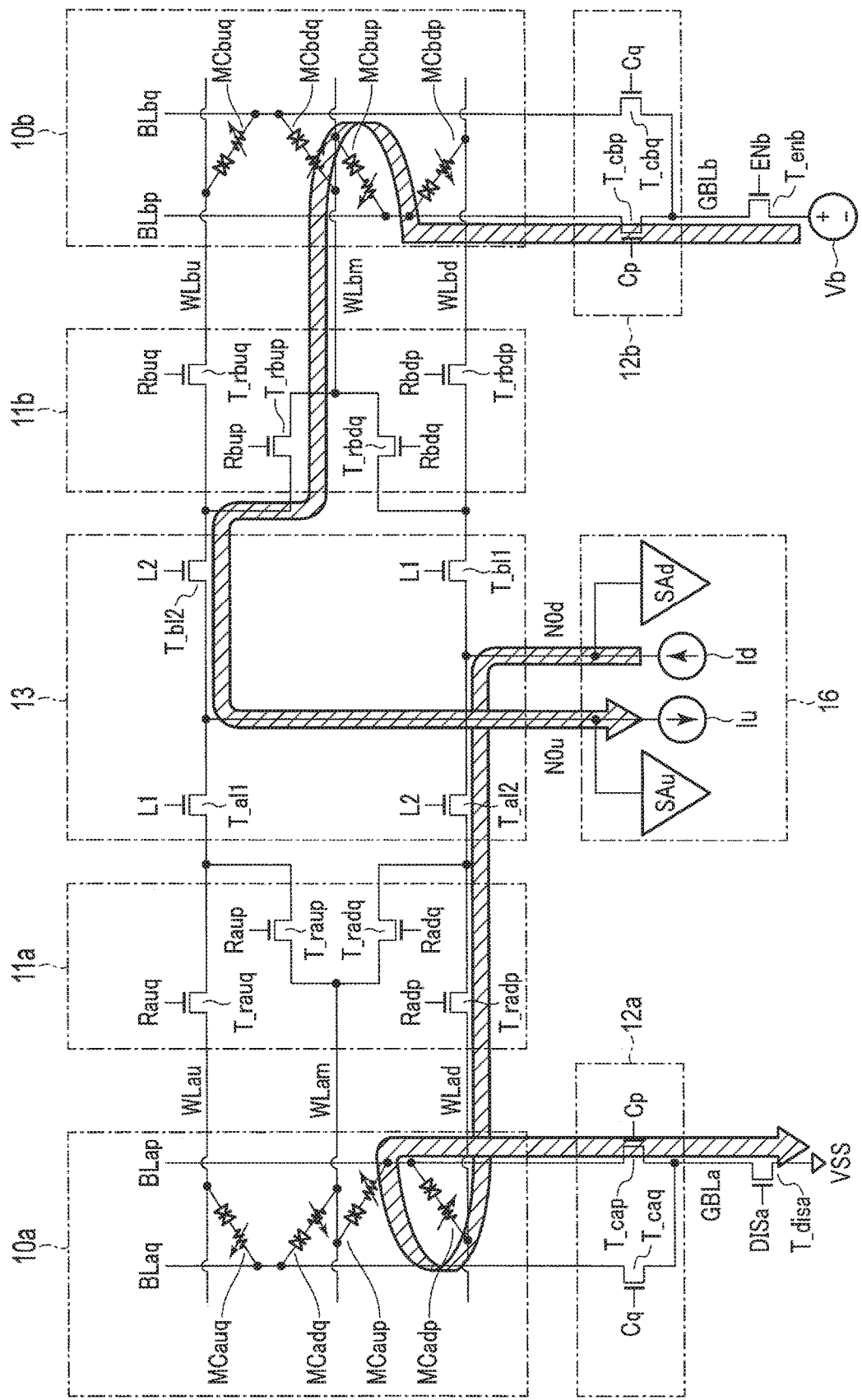
F I G. 36

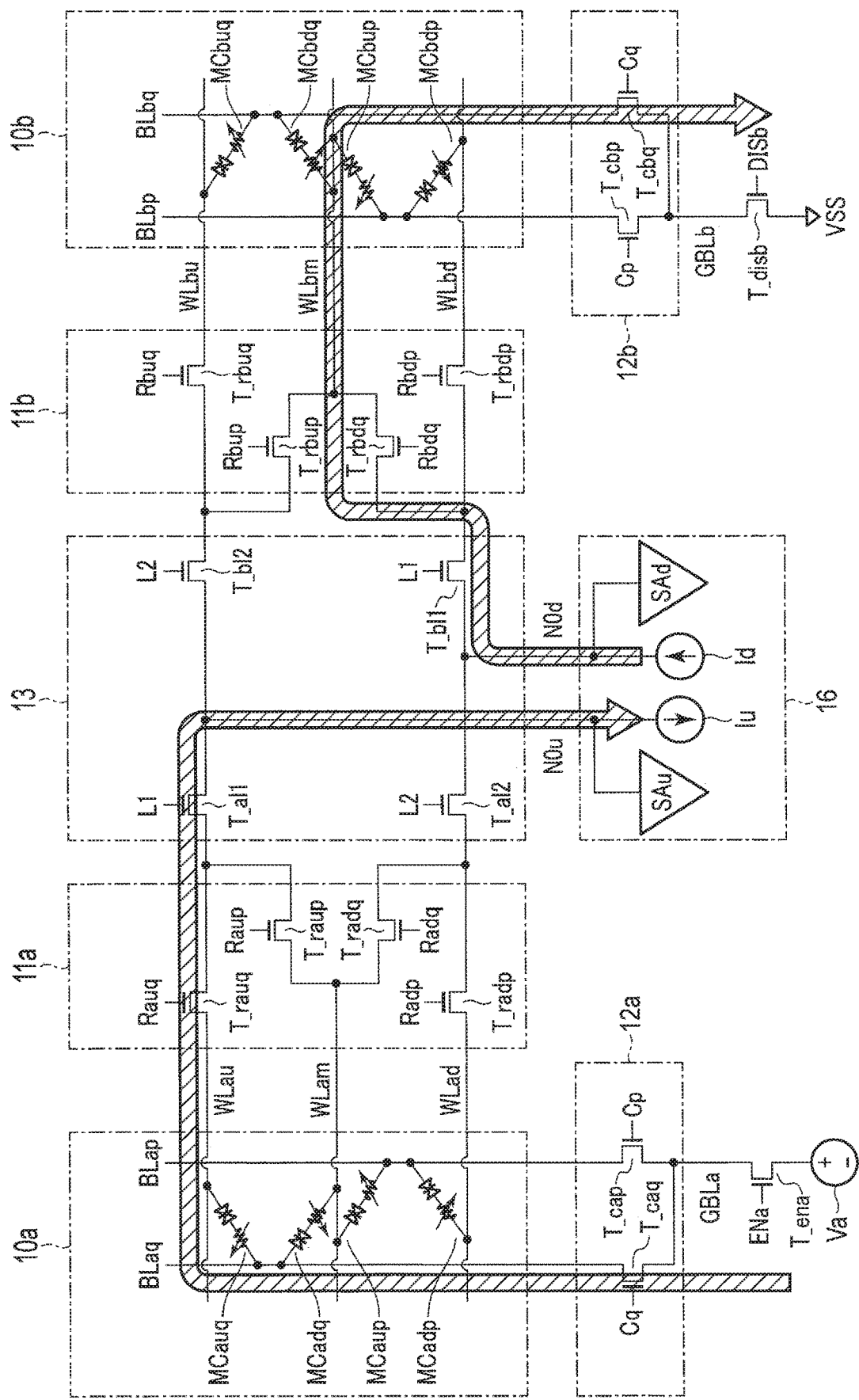
F I G. 39

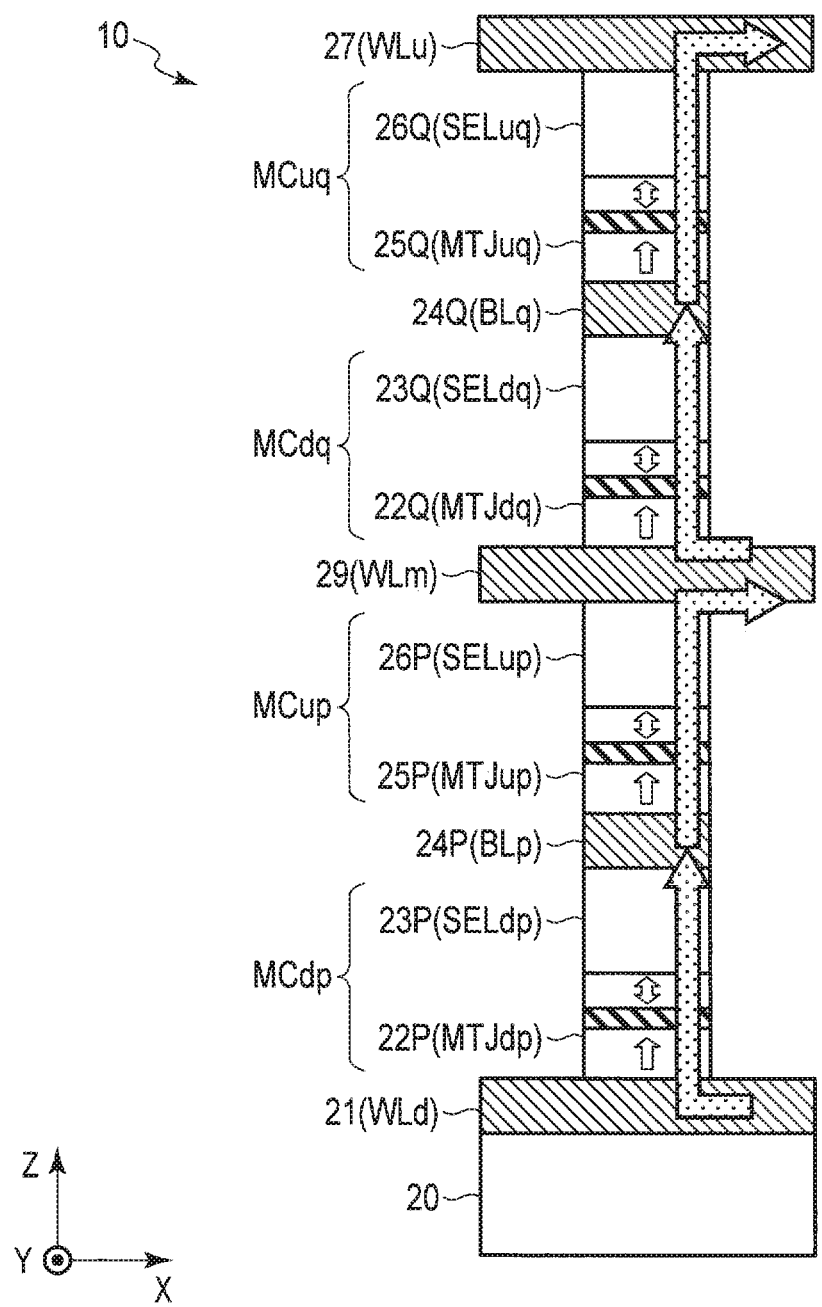
F I G. 40

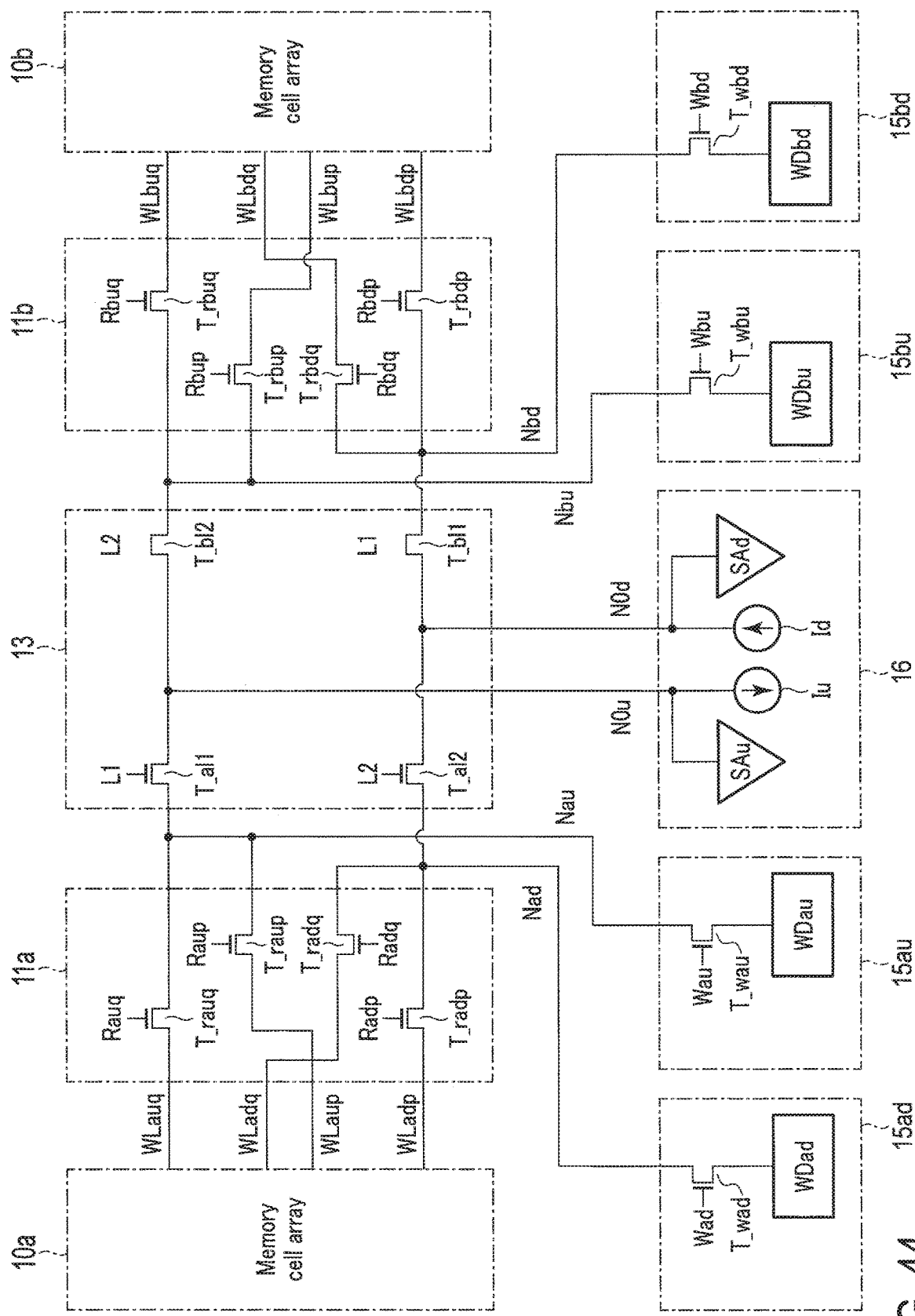
F I G. 44

SEMICONDUCTOR STORAGE DEVICE

CROSS-REFERENCE TO RELATED APPLICATION

This application is based upon and claims the benefit of priority from Japanese Patent Application No. 2018-045509, filed Mar. 13, 2018, the entire contents of which are incorporated herein by reference.

FIELD

Embodiments described herein relate generally to a semiconductor storage device.

BACKGROUND

There is known a semiconductor storage device using a resistive change element.

BRIEF DESCRIPTION OF THE DRAWING

FIG. 1 is a block diagram for explaining a configuration of a magnetic storage device according to a first embodiment;

FIG. 2 is a circuit diagram for explaining a configuration of a memory cell array in the magnetic storage device according to the first embodiment;

FIG. 3 is a cross-sectional view for explaining the memory cell array in the magnetic storage device according to the first embodiment;

FIG. 6 is a circuit diagram for explaining connection of the memory cell arrays in a row direction in the magnetic storage device according to the first embodiment;

FIG. 8 is a circuit diagram for explaining a configuration of a read circuit in the magnetic storage device according to the first embodiment;

FIG. 9 is a circuit diagram for explaining a configuration of a read circuit in the magnetic storage device according to the first embodiment;

FIG. 10 is a schematic view for explaining a select operation of the memory cell in the magnetic storage device according to the first embodiment;

FIG. 11 is a schematic view for explaining current paths at a read operation in the magnetic storage device according to the first embodiment;

FIG. 12 is a schematic view for explaining current paths at a read operation in the magnetic storage device according to the first embodiment;

FIG. 17 is a block diagram for explaining a configuration of a magnetic storage device according to a second embodiment;

FIG. 21 is a cross-sectional view for explaining memory cells in a magnetic storage device according to a third embodiment;

FIG. 22 is a schematic view for explaining current paths at a read operation in the magnetic storage device according to the third embodiment;

FIG. 23 is a circuit diagram for explaining connection of a memory cell array in row and column directions in a magnetic storage device according to a fourth embodiment;

FIG. 31 is a schematic view for explaining current paths at a read operation in the magnetic storage device according to the fifth embodiment;

FIG. 34 is a circuit diagram for explaining connection of the memory cell arrays in a row direction in the magnetic storage device according to the first modification;

FIG. 35 is a circuit diagram for explaining connection of the memory cell arrays in a column direction in the magnetic storage device according to the first modification;

FIG. 36 is a schematic view for explaining current paths at a read operation in the magnetic storage device according to the first modification;

FIG. 39 is a schematic view for explaining current paths at a read operation in the magnetic storage device according to the first modification;

FIG. 40 is a schematic view for explaining current paths at a read operation in the magnetic storage device according to the first modification;

FIG. 44 is a circuit diagram for explaining connection of the memory cell arrays in a row direction in the magnetic storage device according to the second modification.

DETAILED DESCRIPTION

Figure 4:
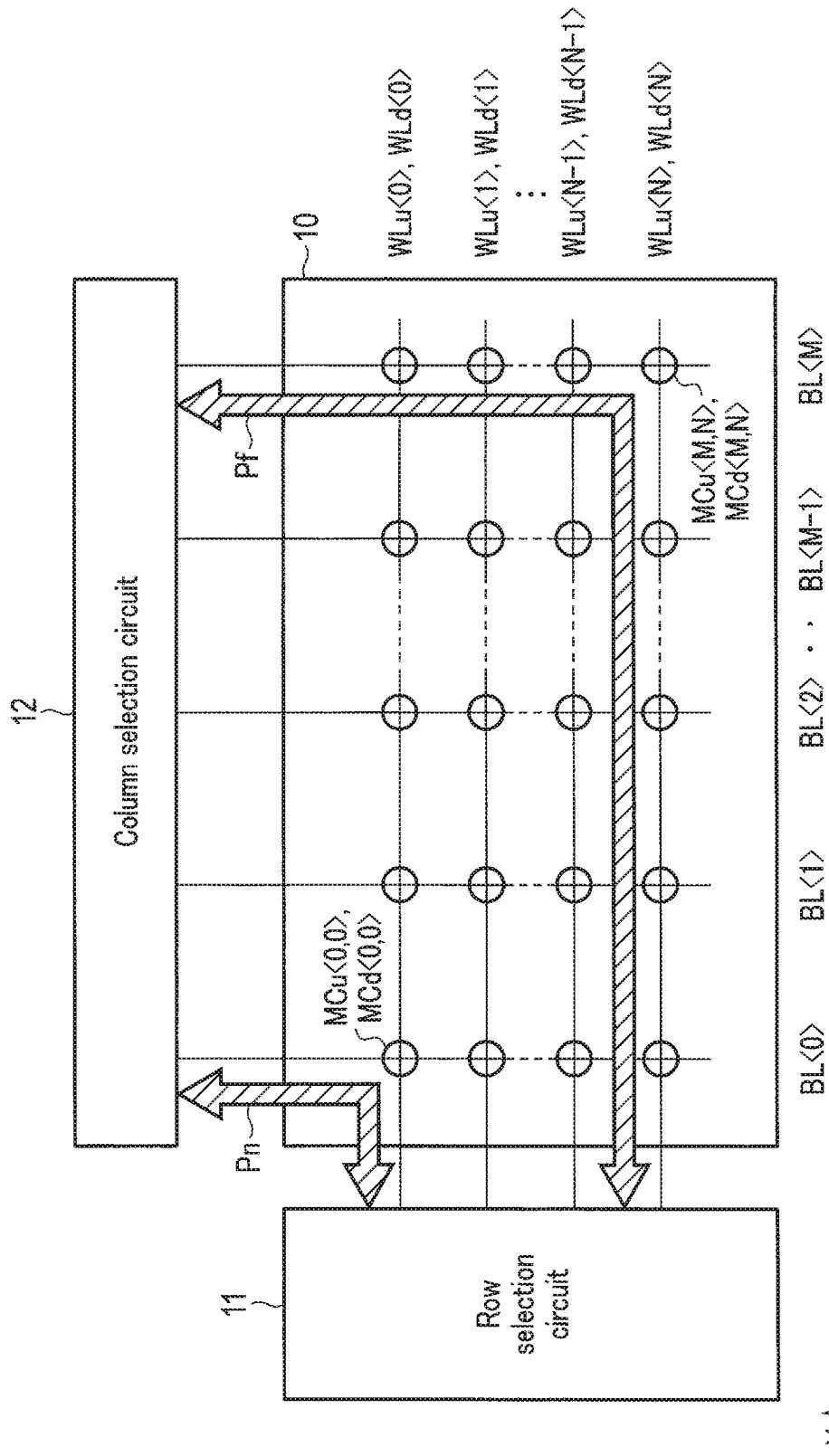
FIG. 4 is a planar view for explaining a layout of the memory cell array in the magnetic storage device according to the first embodiment.

In general, according to one embodiment, a semiconductor storage device includes: a first memory cell and a second memory cell each of which includes a resistive change element and a selector; a first conductor electrically coupled to a first end of the first memory cell; a second conductor which electrically couples between a second end of the first memory cell and a first end of the second memory cell; a third conductor electrically coupled to a second end of the second memory cell; a first constant current source which is capable of coupling electrically to the first memory cell via the first conductor; a second constant current source which is capable of coupling electrically to the second memory cell via the third conductor; a first sense amplifier configured to read data from the first memory cell based on a current flowing from the first constant current source to the first memory cell; and a second sense amplifier configured to read data from the second memory cell based on a current flowing from the second memory cell to the second constant current source.

Embodiments will be described below with reference to the accompanying drawings. Note that in the following description, common reference numerals denote components having the same functions and arrangements. To discriminate between a plurality of components having a common reference numeral, subscripts are added to the common reference numeral. Note that if it is not necessary to specifically discriminate between the plurality of components, the common reference numeral without any subscripts denotes the plurality of components.

As an example of a semiconductor storage device according to an embodiment, a magnetic storage device (magnetoresistive random access memory (MRAM)) using a magnetic tunnel junction (MTJ) element as a resistive change element will be described below.

1. First Embodiment

The magnetic storage device according to a first embodiment will be described.

1.1 Configuration

First, a configuration of the magnetic storage device according to the first embodiment will be described.

1.1.1 Configuration of Magnetic Storage Device

FIG. 1 is a block diagram showing a configuration of the magnetic storage device according to the first embodiment. As shown in FIG. 1, a magnetic storage device 1 includes memory cell arrays 10 (10a and 10b), row selection circuits 11 (11a and 11b), column selection circuits 12 (12a and 12b), a layer selection circuit 13, a decode circuit 14, write circuits 15 (15a and 15b), a read circuit 16, a voltage generation circuit 17, an input/output circuit 18, and a control circuit 19.

Each of the memory cell arrays 10a and 10b includes a plurality of memory cells MCa and MCb associated with a row and a column. Specifically, the memory cells MCa and MCb in the same row are respectively connected to the same word lines WLa and WLb, and the memory cells MCa and MCb in the same column are respectively connected to the same bit lines BLa and BLb.

In addition, the memory cells MCa and MCb are further associated with layers. That is, the memory cell MCa includes a memory cell MCau and a memory cell MCad, and the memory cell MCb includes a memory cell MCbu and a memory cell MCbd. More specifically, the memory cells MCau and MCad in the same row are respectively connected to the same word lines WLau and WLad, and the memory cells MCau and MCad in the same column are connected in common to the same bit line BLa. Similarly, the memory cells MCbu and MCbd in the same row are respectively connected to the same word lines WLbu and WLbd, and the memory cells MCbu and MCbd in the same column are connected in common to the same bit line BLb. The memory cell arrays 10a and 10b are respectively connected to the write circuits 15a and 15b via the row selection circuits 11a and 11b, and are connected in common to the one read circuit 16.

In the example of FIG. 1, the single memory cell arrays 10a and 10b are provided. Alternatively, a plurality of memory cell arrays 10a and 10b may be provided. In this case, a pair of one memory cell array 10a and one memory cell array 10b forms a connection relationship shown in FIG. 1.

The row selection circuits 11 are connected to the memory cell arrays 10 via word lines WL. Specifically, the row selection circuits 11a and 11b are respectively connected to the memory cell arrays 10a and 10b via the word lines WL. The row selection circuits 11 are supplied with a decode result of an address ADD (row address) from the decode circuit 14. The row selection circuits 11 set the word line WL corresponding to the row based on the decode result of the address ADD to the selected state. In the following description, the word line WL set to the selected state will be called selected word line WL. In addition, the word lines WL other that the selected word line WL will be called unselected word lines WL.

The column selection circuits 12 are connected to the memory cell arrays 10 via the bit lines BL. Specifically, the column selection circuits 12a and 12b are connected to the memory cell arrays 10a and 10b via the bit lines BL. The column selection circuits 12 are supplied with a decode result of the address ADD from the decode circuit 14 (column address). The column selection circuits 12 set the column based on the decode result of the address ADD to the selected state. In the following description, the bit line BL set to the selected state will be called selected bit line BL. In addition, the bit lines BL other than the selected bit line BL will be called unselected bit lines BL.

The layer selection circuit 13 is connected to the memory cell arrays 10 via the row selection circuits 11. Specifically, the layer selection circuit 13 is connected to the memory cell arrays 10a and 10b via the row selection circuits 11a and 11b. The layer selection circuit 13 is supplied with a decode result (layer address) of the address ADD from the decode circuit 14. The layer selection circuit 13 sets the memory cell arrays 10 to the selected state based on the decode result of the address ADD.

The decode circuit 14 decodes the address ADD from the input/output circuit 18. The decode circuit 14 supplies the decode result of the address ADD to the row selection circuits 11, the column selection circuits 12, and the layer selection circuit 13. The address ADD includes a column address, a row address, and a layer address which are selected.

The write circuits 15 write data into the memory cells MC. Specifically, the write circuits 15a and 15b write data DAT into the memory cells MC in the memory cell arrays 10a and 10b, respectively. The write circuits 15 include a write driver (not shown), for example.

The read circuit 16 reads data from the memory cells MC. Specifically, the read circuit 16 is capable of reading the data DAT from the memory cells MC in both the memory cell arrays 10a and 10b. The read circuit 16 includes circuits not shown such as a constant current source and a sense amplifier, for example. The read circuit 16 will be described later in detail.

The voltage generation circuit 17 uses a power-supply voltage provided from an outside of the magnetic storage device 1 (not shown) to generate voltages for various operations of the memory cell arrays 10. For example, the voltage generation circuit 17 generates various voltages necessary for a write operation and outputs the voltages to the write circuits 15. In addition, for example, the voltage generation circuit 17 generates various voltages necessary for a read operation and outputs the voltages to the read circuit 16.

The input/output circuit 18 transfers the address ADD from the outside of the magnetic storage device 1 to the decode circuit 14. The input/output circuit 18 transfers a command CMD from the outside of the magnetic storage device 1 to the control circuit 19. The input/output circuit 18 allows transmission and reception of various control signals CNT between the outside of the magnetic storage device 1 and the control circuit 19. The input/output circuit 18 transfers the data DAT from the outside of the magnetic storage device 1 to the write circuits 15, and outputs the data DAT transferred from the read circuit 16 to the outside of the magnetic storage device 1.

The control circuit 19 controls the operations of the row selection circuits 11, the column selection circuits 12, the layer selection circuit 13, the decode circuit 14, the write circuits 15, the read circuit 16, the voltage generation circuit 17, and the input/output circuit 18 in the magnetic storage device 1, based on the control signals CNT and the command CMD.

1.1.2 Configuration of Memory Cell Arrays

Next, a configuration of the memory cell arrays in the magnetic storage device according to the first embodiment will be described with reference to FIG. 2. FIG. 2 is a circuit diagram showing a configuration of the memory cell arrays in the magnetic storage device according to the first embodiment. Referring to FIG. 2, a common configuration of the memory cell arrays 10a and 10b will be described without the indexes "a" and "b" to the reference numerals.

As shown in FIG. 2, the memory cells MC are arranged in a matrix within the memory cell array 10. One each of a plurality of bit lines BL (BL<0>, BL<1>, ..., BL<N>)) and one each of a plurality of word lines WLu (WLu<0>, WLu<1>, ..., WLu<M>) and WLd (WLd<0>, WLd<1>, ..., WLd<M>) are associated with each other (M and N are arbitrary integers). That is, the memory cell MCu<i, j> ($0 \leq i \leq M$, $0 \leq j \leq N$) connects between the word line WLu<i> and the bit line BL<j>, and the memory cell MCd<i, j> connects between the word line WLd<i> and the bit line BL<j>.

The memory cell MCu<i, j> includes a selector SELu<i, j> and a magnetoresistive effect element MTJu<i, j> connected in series. The memory cell MCd<i, j> includes a selector SELd<i, j> and a magnetoresistive effect element MTJd<i, j> connected in series.

The selector SEL has a function as a switch for controlling current supply to the corresponding magnetoresistive effect element MTJ at the time of writing and reading data to and from the magnetoresistive effect element MTJ. More specifically, for example, the selector SEL in a certain memory cell MC cuts off current as an insulator with a large resistance value when the voltage applied to the memory cell MC falls below a threshold Vhold (turns to off state), and flows current as an conductor with a small resistance value when the voltage applied to the memory cell MC exceeds a threshold Vth (turns to on state). Specifically, the selector SEL has a function of switching between flowing current and cutting off current according to the magnitude of the voltage applied to the memory cell MC regardless of the flowing direction of the current.

The selector SEL may be a two-terminal (binary) switching element, for example. As an example, when a voltage that is applied between a pair of terminals is less than a threshold voltage, the switching element can remain in a "high resistive" state, e.g., an electrically non-conductive state. When the voltage applied between the two pair of terminals is equal to or greater than the threshold voltage, the switching element can turn into a "low resistive" state, e.g., an electrically conductive state. The switch element can be configured to perform this function regardless of a polarity of the voltage.

In this example, the switch element may include at least one chalcogen element selected from among a group configured with tellurium (Te), selenium (Se), and sulfur (S). Alternatively, the switch element may include chalcogenide that is a compound including the chalcogen element. In addition to this, the switch element may contain at least one element selected from among the group configured with boron (B), aluminum (Al), gallium (Ga), indium (In), carbon (C), silicon (Si), germanium (Ge), tin (Sn), arsenic (As), phosphorus (P), and Sb (antimony).

The magnetoresistive effect element MTJ can switch the resistance value between the low resistive state and the high resistive state by the current supplied under control of the selector SEL. The magnetoresistive effect element MTJ functions as a storage element in which data can be written depending on a change in the resistance state, the written data is retained in a nonvolatile manner, and from which the written data can be read out.

Next, a cross section structure of the memory cell array 10 will be described with reference to FIG. 3. FIG. 3 shows an example of a cross section structure of the memory cell array taken along the word line in the magnetic storage device according to the first embodiment.

As shown in FIG. 3, the magnetic storage device 1 is provided on a semiconductor substrate 20. In the following description, a plane parallel to the surface of the semiconductor substrate 20 will be designated as an XY plane, and a direction perpendicular to the XY plane will be designated as a Z direction. In addition, a direction along the word line WL will be designated as an X direction, and a direction along the bit line BL will be designated as a Y direction.

On the semiconductor substrate 20, conductors 21 functioning as word lines WLd are provided, for example. Each of the conductors 21 extends along the X direction, for example. A plurality of elements 22 functioning as magnetoresistive effect elements MTJd are provided on each of the conductors 21, and are arranged along the X direction, for example. On each of the elements 22, an element 23 functioning as a selector SELd is provided. On each of the plurality of elements 23 provided along X direction, a conductor 24 functioning as bit line BL is provided. Each of the plurality of conductors 24 provided along the X direction extends along the Y direction, for example.

On each of the conductors 24, elements 25, provided along Y direction, functioning as magnetoresistive effect elements MTJu are provided. On each of the plurality of elements 25, an element 26 functioning as a selector SELu is provided. On each of the plurality of elements 26 provided along X direction, one conductor 27 functioning as a word line WLu is provided in common. The conductor 27 extends along the X direction, for example.

According to the configuration as described above, the memory cell array 10 is structured such that a pair of two word lines WLd and WLu is associated with one bit line BL. In addition, the memory cell array 10 has a layered cross-point structure in which the memory cell MCd is provided between the word line WLd and the bit line BL and the memory cell MCu is provided between the bit line BL and the word line WLu. In the layered cross-point structure shown in FIG. 3, the memory cell MCd is associated with the lower layer, and the memory cell MCu is associated with the upper layer. Specifically, out of two memory cells MC connected in common to one bit line BL, the memory cell MC provided on the upper layer of the bit line BL corresponds to the memory cell MCu with the index "u", and the memory cell MC provided on the lower layer of the bit line BL corresponds to the memory cell MCd with the index "d".

Next, the layout of the memory cell array 10 will be described with reference to FIG. 4. FIG. 4 schematically shows the layout of the memory cell array and its peripheral circuits in the magnetic storage device according to the first embodiment. In the example of FIG. 4, the row selection circuit 11 and the column selection circuit 12 are respectively provided along the X direction and the Y direction with respect to the memory cell array 10.

As shown in FIG. 4, the memory cell array 10 has therein the memory cells MC arranged in regions where the word lines WL and the bit lines BL cross each other. Specifically, the memory cells MCu<0, 0> and MCd<0, 0> are arranged in the region where the word lines WLu<0> and WLd<0> and the bit line BL<0> cross each other, for example. In addition, the memory cells MCu<M, N> and MCd<M, N> are arranged in the region where the word lines WLu<M> and WLd<M> and the bit line BL<N> cross each other, for example.

In this case, a path Pn from the row selection circuit 11 through the memory cell MCu<0, 0> or MCd<0, 0> to the column selection circuit 12 is shorter in path length of word line WL and bit line BL than a path Pf from the row selection circuit 11 through the memory cell MCu<M, N> or MCd<M, N> to the column selection circuit 12. That is, the path length from the row selection circuit 11 through the memory cell array 10 to the column selection circuit 12 can vary depending on the arrangement position of the memory cell MC.

1.1.3 Configuration of Magnetoresistive Effect Element

Figure 5:
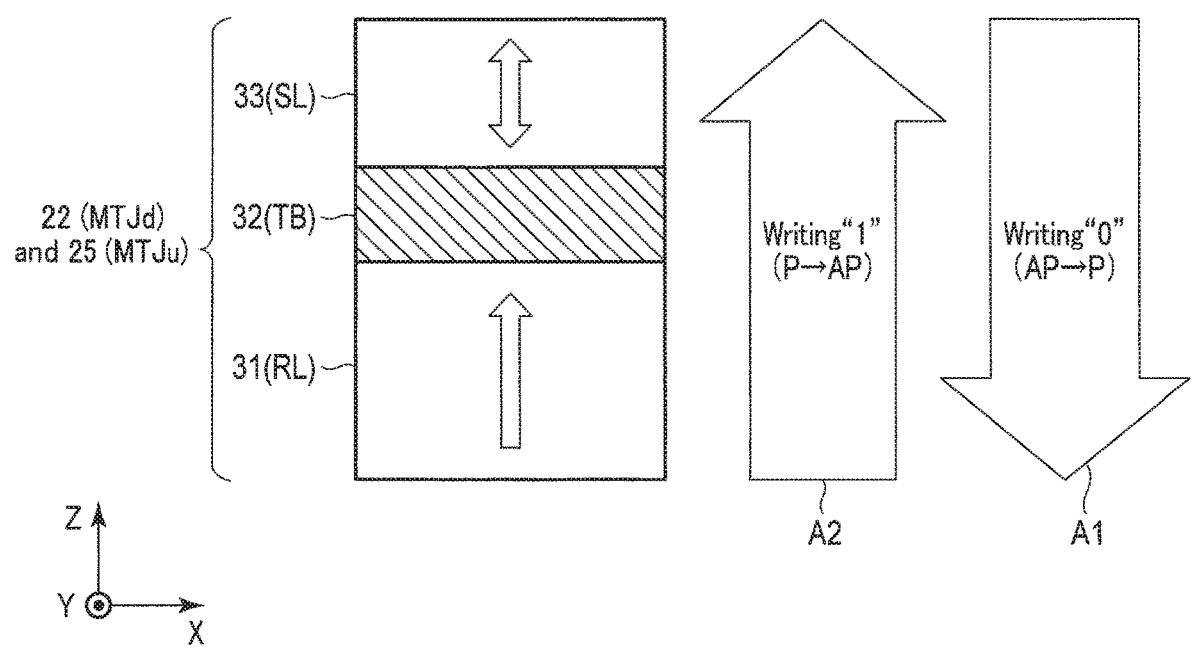
FIG. 5 is a cross-sectional view for explaining a configuration of a magnetoresistive effect element in the magnetic storage device according to the first embodiment.

Next, a configuration of the magnetoresistive effect element in the magnetic storage device according to the first embodiment will be described with reference to FIG. 5. FIG. 5 shows an example of a cross section of the magnetoresistive effect element in the magnetic storage device according to the first embodiment taken along the XZ plane.

As shown in FIG. 5, each of the elements 22 and 25 includes a ferromagnetic material 31 functioning as a reference layer (RL), a nonmagnetic material 32 functioning as a tunnel barrier (TB) layer, and a ferromagnetic material 33 functioning as a storage layer (SL). The ferromagnetic material 31, the nonmagnetic material 32, and the ferromagnetic material 33 constitute a magnetic tunnel junction.

The element 22 has a plurality of films layered in the order of the ferromagnetic material 31, the nonmagnetic material 32, and the ferromagnetic material 33 from the word line WLd side to the bit line BL side (in a Z axis direction), for example. The element 25 has a plurality of films layered in the order of the ferromagnetic material 31, the nonmagnetic material 32, and the ferromagnetic material 33 from the bit line BL side to the word line WLu side (in the Z axis direction), for example. The elements 22 and 25 function as perpendicular magnetization MTJ elements in which each of the ferromagnetic materials 31 and 33 has a magnetization direction perpendicular to the film plane.

The ferromagnetic material 31 exhibits ferromagnetism and has an easy axis of magnetization perpendicular to the film plane. The ferromagnetic material 31 has the magnetization direction toward the bit line BL side or the word line WL side. The ferromagnetic material 31 contains cobalt-iron-boron (CoFeB) or iron boride (FeB), for example. The magnetization direction of the ferromagnetic material 31 is fixed. In the example of FIG. 5, the magnetization direction of the ferromagnetic material 31 is oriented toward the ferromagnetic material 33. The "fixed magnetization direction" means that the magnetization direction is not changed even by current (spin torque) of a magnitude capable of reversing the magnetization direction of the ferromagnetic material 33.

The nonmagnetic material 32 is a nonmagnetic insulation film that contains magnesium oxide (MgO), for example.

The ferromagnetic material 33 exhibits ferromagnetism and has an easy axis of magnetization perpendicular to the film plane. The ferromagnetic material 33 has the magnetization direction toward the bit line BL side or the word line WL side. The ferromagnetic material 33 contains cobalt-iron-boron (CoFeB) or iron boride (FeB), for example.

In the first embodiment, a spin injection writing scheme is adopted under which a write current is directly flown into the magnetoresistive effect element MTJ, and spin torque is injected into the storage layer SL by the write current to control the magnetization direction of the storage layer SL. The magnetoresistive effect element MTJ can take either a low resistive state or a high resistive state depending on whether the relative relationship of the magnetization direction between the storage layer SL and the reference layer RL is parallel or anti-parallel.

When a write current of a certain magnitude is made to flow through the magnetoresistive effect element MTJ in a direction of an arrow A1 in FIG. 5, that is, in the direction facing from the storage layer SL to the reference layer RL, the relative relationship of the magnetization direction between the storage layer SL and the reference layer RL becomes parallel. In the parallel state, the resistance value of the magnetoresistive effect element MTJ decreases, and the magnetoresistive effect element MTJ is set to the low resistive state. The low resistive state is called "parallel (P) state" and is prescribed as data "0" state, for example.

When a write current larger than the write current for writing the data "0" is made to flow through the magnetoresistive effect element MTJ in a direction of an arrow A2 in FIG. 5, that is, in the direction facing from the reference layer RL to the storage layer SL, the relative relationship of the magnetization direction between the storage layer SL and the reference layer RL becomes anti-parallel. In the anti-parallel state, the resistance value of the magnetoresistive effect element MTJ increases, and the magnetoresistive effect element MTJ is set to the high resistive state. The high resistive state is called "anti-parallel (AP) state" and is prescribed as data "1" state, for example.

The following description is based on the foregoing method for prescribing the data but the methods for prescribing the data "1" and data "0" are not limited to the foregoing example. For example, the P state may be prescribed as data "1" and the AP state may be prescribed as data "0".

1.1.4 Configuration of Circuits Connected in Row Direction to Memory Cell Arrays Next, a configuration of circuits connected in the row direction to the memory cell arrays 10 configured as described above according to the first embodiment will be described with reference to FIG. 6. FIG. 6 shows an example of a configuration of circuits connected in the row direction in each of the memory cell arrays 10a and 10b. In FIG. 6, the index "a" is added to the components of the memory cell array 10a and the index "b" is added to the components of the memory cell array 10b for differentiation of them. In addition, in FIG. 6, the index "u" is added to the components corresponding to the word line WLu and the index "d" is added to the components corresponding to the word line WLd, for differentiation of them. The following description is based on the assumption that the word lines WLu and WLd shown in FIG. 6 correspond to the same bit line BL.

As shown in FIG. 6, the word lines WLau and WLad connect between the memory cell array 10a and the row selection circuit 11a. The row selection circuit 11a includes row selection transistors T_rau and T_rad. The row selection transistor T_rau includes a first end connected to the word line WLau, a second end connected to a node Na, and a gate to which a signal Rau is supplied. The row selection transistor T_rad includes a first end connected to the word line WLad, a second end connected to the node Na, and a gate to which a signal Rad is supplied.

Similarly, the word lines WLbu and WLbd connect between the memory cell array 10b and the row selection circuit 11b. The row selection circuit 11b includes row selection transistors T_rbu and T_rbd. The row selection transistor T_rbu includes a first end connected to the word line WLbu, a second end connected to a node Nb, and a gate to which a signal Rbu is supplied. The row selection transistor T_rbd includes a first end connected to the word line WLbd, a second end connected to the node Nb, and a gate to which a signal Rbd is supplied.

The layer selection circuit 13 includes layer selection transistors T_al1, T_al2, T_bl1, and T_bl2. The layer selection transistor T_al1 includes a first end connected to the node Na, a second end connected to a node N0u, and a gate to which a signal L1 is supplied. The layer selection transistor T_al2 includes a first end connected to the node Na, a second end connected to a node N0d, and a gate to which a signal L2 is supplied. The layer selection transistor T_bl1 includes a first end connected to the node Nb, a second end connected to the node N0d, and a gate to which the signal L1 is supplied. The layer selection transistor T_bl2 includes a first end connected to the node Nb, a second end connected to the node N0u, and a gate to which the signal L2 is supplied.

The write circuit 15a includes a transistor T_wa and a write driver WDa. The transistor T_wa includes a first end connected to the node Na, a second end connected to the write driver WDa, and a gate to which a signal Wa is supplied. The write driver WDa has a function of supplying a write current to the memory cells MCa in the memory cell array 10a.

Similarly, the write circuit 15b includes a transistor T_wb and a write driver WDb. The transistor T_wb includes a first end connected to the node Nb, a second end connected to the write driver WDb, and a gate to which a signal Wb is supplied. The write driver WDb has a function of supplying a write current to the memory cells MCb in the memory cell array 10b.

The read circuit 16 includes sense amplifiers SAu and SAd and constant current sources Iu and Id. The sense amplifier SAu and the constant current source Iu are connected to the node N0u. The sense amplifier SAd and the constant current source Id are connected to the node N0d. The sense amplifier SAu has a function of, out of the memory cells MCa and MCb in the memory cell arrays 10a and 10b, reading data from the memory cells MCu (MCau and MCbu) corresponding to the word line WLu. The sense amplifier SAd has a function of, out of the memory cells MCa and MCb in the memory cell arrays 10a and 10b, reading data from the memory cells MCd (MCad and MCbd) corresponding to the word line WLd. The constant current source Iu has a function of keeping the current flowing from the memory cell arrays 10a and 10b to the node N0u at a predetermined value. The constant current source Id has a function of keeping the current flowing from the node N0d to the memory cell arrays 10a and 10b at a predetermined value.

Even if the word lines WLau, WLad, WLbu, and WLbd are not connected to the nodes N0u and N0d (not selected) because the row selection transistors T_rau, T_rad, T_rbu, and T_rbd are not turned on, the word lines may be supplied with appropriate voltages via transistors not shown.

Figure 7:
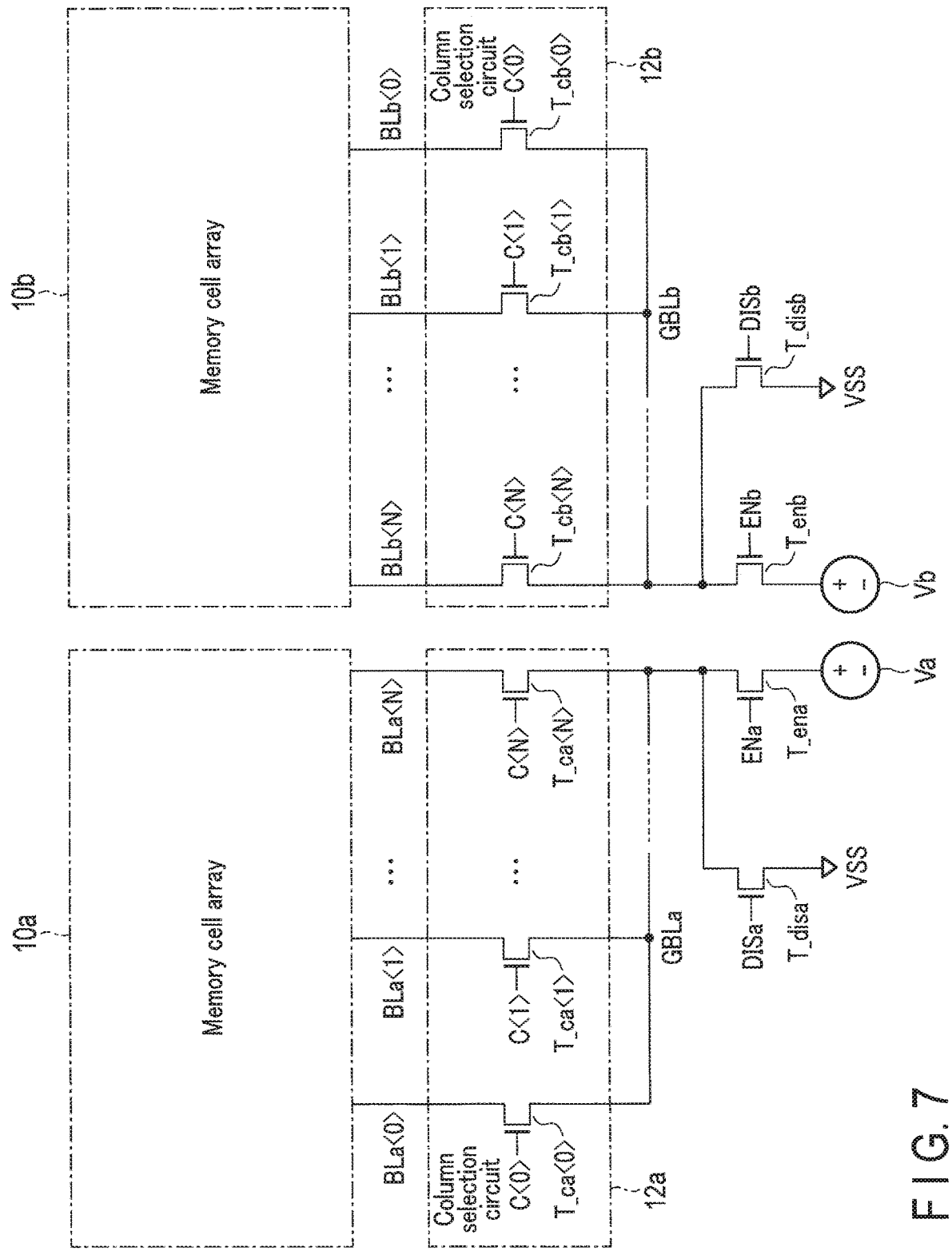
FIG. 7 is a circuit diagram for explaining connection of the memory cell arrays in a column direction in the magnetic storage device according to the first embodiment.

1.1.5 Configuration of Circuits Connected in Column Direction to Memory Cell Arrays Next, a configuration of circuits connected in the column direction to the memory cell arrays 10 configured as described above according to the first embodiment will be described with reference to FIG. 7. FIG. 7 shows an example of a configuration of circuits connected in the column direction in each of the memory cell arrays 10a and 10b. In FIG. 7, the index "a" is added to the components of the memory cell array 10a and the index "b" is added to the components of the memory cell array 10b for differentiation of them.

As shown in FIG. 7, a plurality of bit lines BLa (BLa<0>, BLa<1>, . . . , and BLa<N>) connects between the memory cell array 10a and the column selection circuit 12a. The column selection circuit 12a includes a plurality of column selection transistors T_ca (T_ca<0>, T_ca<1>, . . . , and T_ca<N>). Each of the column selection transistors T_ca<0>, T_ca<1>, . . . , and T_ca<N> includes a first end connected to the bit line BLa<0>, BLa<1>, . . . , and BLa<N>, respectively, a second end connected in common to a global bit line GBLa, and a gate to which a signal C (C<0>, C<1>, . . . , and C<N>, respectively) is supplied.

The global bit line GBLa is connected in common to a first end of a transistor T_disa and a first end of a transistor T_ena. The transistor T_disa includes a second end to which a voltage VSS is supplied and a gate to which a signal DISa is supplied. The voltage VSS is a ground voltage, for example, 0V. The transistor T_ena includes a second end connected to a constant voltage source Va and a gate to which a signal ENa is supplied. The global bit line GBLa can be charged to a voltage different from that of the global bit line GBLb and thus is not shared with the memory cell array 10b and other memory cell arrays 10b not shown. However, the global bit line GBLa may be shared with other memory cell arrays 10a not shown.

The constant voltage source Va has a function of keeping the voltage of the global bit line GBLa at a predetermined value. Specifically, the constant voltage source Va can supply a voltage larger than the voltage VSS. For example, the constant voltage source Va can supply a voltage larger than a threshold voltage Vth of the selector SEL to the memory cell MCa.

Similarly, a plurality of bit lines BLb (BLb<0>, BLb<1>, . . . , and BLb<N>) connects between the memory cell array 10b and the column selection circuit 12b. The column selection circuit 12b includes a plurality of column selection transistors T_cb (T_cb<0>, T_cb<1>, . . . , and T_cb<N>). Each of the column selection transistors T_cb<0>, T_cb<1>, . . . , and T_cb<N> includes a first end connected to the bit line BLb<0>, BLb<1>, . . . , and BLb<N>, respectively, a second end connected in common to the global bit line GBLb, and a gate to which the signal C (C<0>, C<1>, . . . , and C<N>, respectively) is supplied.

That is, the same signal C can be input into the column selection transistors T_ca and T_cb based on the same column address, and the column selection transistors T_ca and T_cb can be selected at the same time accordingly.

The global bit line GBLb is connected in common to a first end of the transistor T_disb and a first end of the transistor T_enb. The transistor T_disb includes a second end to which the voltage VSS is supplied and a gate to which a signal DISb is supplied. The transistor T_enb includes a second end connected to a constant voltage source Vb and a gate to which a signal ENb is supplied. The global bit line GBLb can be charged to a voltage different from that of the global bit line GBLa and thus is not shared with the memory cell array 10a and other memory cell arrays 10a not shown. However, the global bit line GBLb may be shared with other memory cell arrays 10b not shown.

The constant voltage source Vb has a function of keeping the voltage of the global bit line GBLb at a predetermined value. Specifically, the constant voltage source Vb can supply a voltage larger than the voltage VSS. For example, the constant voltage source Vb can supply a voltage larger than the threshold voltage Vth of the selector SEL to the memory cell MCb.

Even if the bit lines BLa and BLb are not connected to the global bit lines GBLa and GBLb (not selected) because the column selection transistors T_ca and T_cb are not turned on, the bit lines can be supplied with appropriate voltages via transistors not shown.

1.1.6 Configuration of Read Circuit

Next, a configuration of the read circuit in the magnetic storage device according to the first embodiment will be described with reference to FIGS. 8 and 9.

FIGS. 8 and 9 are circuit diagrams for explaining a configuration of the read circuit in the magnetic storage device according to the first embodiment. FIG. 8 shows a circuit configuration of the sense amplifier SAd and the constant current source Id, and FIG. 9 shows a circuit configuration of the sense amplifier SAu and the constant current source Iu.

First, the circuit configuration of the sense amplifier SAd and the constant current source Id will be described with reference to FIG. 8. As shown in FIG. 8, the constant current source Id includes transistors T1d and T2d. The sense amplifier SAd includes transistors T3d, T4d, T5d, T6d, T7d, T8d, T9d, T10d, T11d, T12d, and T13d. The transistors T1d to T7d and T9d have a P-type polarity and the transistors T8d and T10d to T13d have an n-type polarity, for example.

The transistor T1d includes a first end connected to the node N0d, a second end connected to a first end of the transistor T2d, and a gate to which a signal VLOADP is supplied. The transistor T2d includes a second end to which a voltage VDD is supplied and a gate to which a signal RENB as an inversion signal of a signal REN is supplied. The voltage VDD is a power-supply voltage larger than the voltage VSS, and has a magnitude by which a current of predetermined magnitude can be flown into the node N0d, for example.

The transistor T3d includes a first end connected to a first end of the transistor T4d, a second end connected to a first end of the transistor T7d, and a gate connected to the node N0d. The transistor T4d includes a second end to which the voltage VDD is supplied and a gate to which a signal LATE as an inversion signal of a signal LAT is supplied. The transistor T5d includes a first end connected to a first end of the transistor T6d, a second end connected to a first end of the transistor T9d, and a gate to which a signal VREFSAP is supplied. The signal VREFSAP is a reference signal for determining whether the data stored in the memory cell MC is "1" or "0", and a constant voltage Vrefp is supplied from a reference circuit not shown, for example. The signal VREFSAP may be generated by using a reference cell not shown or may be generated by using a memory cell MC to be read by a self-reference method, for example. The transistor T6d includes a second end to which the voltage VDD is supplied and a gate to which the signal LATE is supplied.

The transistor T7d includes a second end connected to a node SOB and a gate connected to a node SO. The transistor T8d includes a first end connected to the node SOB, a second end connected to a node N1d, and a gate connected to the node SO. The transistor T9d includes a second end connected to the node SO and a gate connected to the node SOB. The transistor T10d includes a first end connected to the node SO, a second end connected to the node N1d, and a gate connected to the node SOB.

The transistor T11*d* includes a first end connected to the node SOB, a second end to which the voltage VSS is supplied, and a gate to which a signal SENB as an inversion signal of a signal SEN is supplied. The transistor T12*d* includes a first end connected to the node SO, a second end to which the voltage VSS is supplied, and a gate to which the signal SENB is supplied. The transistor T13*d* includes a first end connected to the node. N1*d*, a second end to which the voltage VSS is supplied, and a gate to which the signal LAT is supplied.

By being configured as described above, the sense amplifier SAd can sense the voltage of the node N0*d* based on a constant current flowing from the constant current source Id to the memory cell MC via the node N0*d*.

Next, a circuit configuration of the sense amplifier SAu and the constant current source Iu will be described with reference to FIG. 9. As shown in FIG. 9, the constant current source Iu includes transistors T1*u* and T2*u*. The sense amplifier SAu includes transistors T3*u*, T4*u*, T5*u*, T6*u*, T7*u*, T8*u*, T9*u*, T10*u*, T11*u*, T12*u*, and T13*u*. The transistors T1*u* to T7*u* and T9*u* have an n-type polarity, and the transistors T8*u* and T10*u* to T13*u* have a p-type polarity, for example.

The transistor T1*u* includes a first end connected to the node N0*u*, a second end connected to a first end of a transistor T2*u*, and a gate to which a signal VLOADN is supplied. The transistor T2*u* includes a second end to which the voltage VSS is supplied and a gate to which the signal REN is supplied.

The transistor T3*u* includes a first end connected to a first end of the transistor T4*u*, a second end connected to a first end of the transistor T7*u*, and a gate connected to the node N0*u*. The transistor T4*u* includes a second end to which the voltage VSS is supplied and a gate to which the signal LAT is supplied. The transistor T5*u* includes a first end connected to a first end of the transistor T6*u*, a second end connected to a first end of the transistor T9*u*, and a gate to which a signal VREFSAN is supplied. Like the signal VREFSAP, the signal VREFSAN is a reference signal for determining whether the data stored in the memory cell MC is "1" or "0", and a constant voltage Vrefn is supplied from a reference circuit not shown, for example. The signal VREFSAN may be generated by using a reference cell not shown or may be generated by using a memory cell MC to be read by a self-reference method, for example. The transistor T6*u* includes a second end to which the voltage VSS is supplied and a gate to which the signal LAT is supplied.

The transistor T7*u* includes a second end connected to the node SO and a gate connected to the node SOB. The transistor T8*u* includes a first end connected to the node SO, a second end connected to a node N1*u*, and a gate connected to the node SOB. The transistor T9*u* includes a second end connected to the node SOB and a gate connected to the node SO. The transistor T10*u* includes a first end connected to the node SOB, a second end connected to the node N1*u*, and a gate connected to the node SO.

The transistor T11*u* includes a first end connected to the node SO, a second end to which the voltage VDD is supplied, and a gate to which the signal SEN is supplied. The transistor T12*u* includes a first end connected to the node SOB, a second end to which the voltage VDD is supplied, and a gate to which the signal SEN is supplied. The transistor T13*u* includes a first end connected to the node N1*u*, a second end to which the voltage VDD is supplied, and a gate to which the signal LATE is supplied.

By being configured as described above, the sense amplifier SAu can sense the voltage of the node N0*u* based on a constant current flowing from the memory cell MC to the constant current source Iu via the node N0*u*.

1.2 Operation

Next, operations of the magnetic storage device according to the first embodiment will be described. In the following description, the memory cell MC to be written or read, that is, the memory cell MC associated with a pair of the selected word line WL and the selected bit line BL will be called selected memory cell MC (or memory cell MC in the selected state).

1.2.1 Outline of Select Operation for Memory Cell

First, an outline of memory cell selection in the magnetic storage device according to the first embodiment will be described with reference to FIG. 10. FIG. 10 is a schematic view for explaining an outline of memory cell selection in the magnetic storage device according to the first embodiment. FIG. 10 shows eight memory cells MC connected between the bit lines BL<0> and BL<1> and the word lines WLu<0>, WLd<0>, WLu<1>, and WLd<1>.

As shown in FIG. 10, the row selection circuit 11 and the column selection circuit 12 control the application of a voltage Vsel between the selected word line WL and the selected bit line BL. The voltage Vsel is a voltage larger than the threshold Vth under which the selector SEL is turned on. In the example of FIG. 10, an example in which the voltage Vsel is supplied to the selected word line WLd<0>, and the voltage VSS is supplied to the selected bit line BL<1> is shown. In the selected state, for example, the selected memory cell MC is supplied with a voltage equal to or larger than the threshold Vth of the selector SEL. Accordingly, the selector SEL in the selected memory cell MC is turned on to flow a write current or a read current into the magnetoresistive effect element MTJ in the selected memory cell MC. It should be noted that the row selection circuit 11 and the column selection circuit 12 perform control to supply the voltage Vsel to the selected bit line BL and supply the voltage VSS to the selected word line WL in order to reverse the flowing direction of the current.

In addition, the row selection circuit 11 and the column selection circuit 12 perform control to supply a voltage Vsel/2 to the unselected word lines WL and the unselected bit lines BL. The voltage Vsel/2 is a voltage smaller than the threshold Vth under which the selector SEL is turned on. In the example of FIG. 10, an example in which the voltage Vsel/2 is supplied to the word lines WLu<0>, WLu<1>, and WLd<1>, and the bit line BL<0> is shown. The memory cells MC provided between the selected bit line BL and the unselected word lines WL and between the selected word line WL and the unselected bit lines BL are called semi-selected memory cells MC (or the memory cells MC in the semi-selected state). In the semi-selected state, the semi-selected memory cells MC are supplied with a voltage smaller than the threshold Vth of the selector SEL. Accordingly, the selectors SEL in the semi-selected memory cells MC are turned off, which makes it possible to suppress flowing of a write current or a read current into the magnetoresistive effect elements MTJ in the semi-selected memory cells MC.

In addition, the memory cells MC provided between the unselected bit lines BL and the unselected word lines WL are called unselected memory cells MC (or memory cells MC in the unselected state). In the unselected state, the unselected memory cells MC are supplied with a voltage smaller than the threshold Vth of the selector SEL, like the semi-selected memory cells MC. Accordingly, the selectors SEL in the unselected memory cells MC are turned off, which makes it possible to suppress flowing of a write current or a read current into the magnetoresistive effect elements MTJ in the unselected memory cells MC.

1.2.2 Current Paths at Read Operation

Next, current paths at the read operation in the magnetic storage device according to the first embodiment will be described with reference to FIGS. 11 to 13.

FIGS. 11 and 12 are schematic views showing an outline of current paths at the read operation in the magnetic storage device according to the first embodiment. FIG. 11 schematically shows current paths by arrows when the sense amplifier SAu is used to read data from the memory cell array 10b and the sense amplifier SAd is used to read data from the memory cell array 10a. FIG. 12 schematically shows current paths by arrows when the sense amplifier SAu is used to read data from the memory cell array 10a and the sense amplifier SAd is used to read data from the memory cell array 10b.

First, descriptions will be given as to the current paths when the sense amplifier SAu is used to read data from the memory cell array 10b and the sense amplifier SAd is used to read data from the memory cell array 10a with reference to FIG. 11.

As shown in FIG. 11, the layer selection circuit 13 inputs "L" level to the signal L1, for example, to turn off the layer selection transistors T_al1 and T_bl1. The layer selection circuit 13 also inputs "H" level into the signal L2, for example, to turn on the layer selection transistors T_al2 and T_bl2.

The row selection circuits 11a and 11b select respectively the word lines WLad and WLbu. Specifically, the row selection circuit 11a inputs respectively "L" level and "H" level to the signals Rau and Rad to turn off the row selection transistor T_rau and turn on the row selection transistor T_rad. The row selection circuit 11b inputs respectively "H" level and "L" level to the signals Rbu and Rbd to turn on the row selection transistor T_rbu and turn off the row selection transistor T_rbd.

Accordingly, the word line WLad is charged with current of a constant magnitude flowing from the constant current source Id, and the word line WLbu is charged with current of a constant magnitude flowing into the constant current source Iu.

In addition, the column selection circuits 12a and 12b select the bit lines BLa and BLb at the same time. Specifically, the column selection circuits 12a and 12b turn on the column selection transistors T_ca and T_cb by the signal C at "H" level based on the same column address and connect respectively the bit lines BLa and BLb to the global bit lines GBLa and GBLb. The global bit line GBLa is connected to the voltage VSS via the transistor T_disa, and the global bit line GBLb is connected to the constant voltage source Vb via the transistor T_enb.

Thus, the global bit line GBLa and the bit line BLa are charged with the voltage VSS, and the global bit line GBLb and the bit line BLb are charged with the constant voltage source Vb.

Accordingly, a read current flows into the memory cell MCad from the word line WLad to the global bit line GBLa. The sense amplifier SAd can read data from the selected memory cell MCad based on the current of constant magnitude flowing from the constant current source Id.

Similarly, a read current flows in the memory cell MCbu from the global bit line GBLb to the word line WLbu. The sense amplifier SAu can read data from the selected memory cell MCbu based on the current of constant magnitude flowing into the constant current source Iu.

Accordingly, the operation of reading data from the memory cell array 10b using the sense amplifier SAu and reading data from the memory cell array 10a using the sense amplifier SAd is finished.

Next, descriptions will be given as to the current paths when the sense amplifier SAu is used to read data from the memory cell array 10a and the sense amplifier SAd is used to read data from the memory cell array 10b with reference to FIG. 12.

As shown in FIG. 12, the layer selection circuit 13 inputs "H" level to the signal L1, for example, to turn on the layer selection transistors T_al1 and T_bl1. The layer selection circuit 13 also inputs "L" level to the signal L2, for example, to turn off the layer selection transistors T_al2 and T_bl2.

The row selection circuits 11a and 11b select respectively the word lines WLau and WLbd. Specifically, the row selection circuit 11a inputs respectively "H" level and "L" level to the signals Rau and Rad to turn on the row selection transistor T_rau and turn off the row selection transistor T_rad. The row selection circuit 11b inputs respectively "L" level and "H" level to signals Rbu and Rbd to turn off the row selection transistor T_rbu and turn on the row selection transistor T_rbd.

Accordingly, the word line WLbd is charged with a current of constant magnitude flowing from the constant current source Id, and the word line WLau is charged with a current of constant magnitude flowing into the constant current source Iu.

In addition, the column selection circuits 12a and 12b select the bit lines BLa and BLb at the same time. Specifically, the column selection circuits 12a and 12b turn on the column selection transistors T_ca and T_cb by the signal C at "H" level based on the same column address and connect respectively the bit lines BLa and BLb to the global bit lines GBLa and GBLb. The global bit line GBLa is connected to the constant voltage source Va via the transistor T_ena, and the global bit line GBLb is connected to the voltage VSS via the transistor T_disb.

Thus, the global bit line GBLa and the bit line BLa are charged with the constant voltage source Va, and the global bit line GBLb and the bit line BLb are charged with the voltage VSS.

Accordingly, a read current flows into the memory cell MCbd from the word line WLbd to the global bit line GBLb. The sense amplifier SAd can read data from the selected memory cell MCbd based on the current of constant magnitude flowing from the constant current source Id.

Similarly, a read current flows in the memory cell MCau from the global bit line GBLa to the word line WLau. The sense amplifier SAu can read data from the selected memory cell MCau based on the current of constant magnitude flowing into the constant current source Iu.

Accordingly, the operation of reading data from the memory cell array 10a using the sense amplifier SAu and reading data from the memory cell array 10b using the sense amplifier SAd is finished.

Next, current paths in the memory cells MC will be described with reference to FIG. 13.

Figure 13:
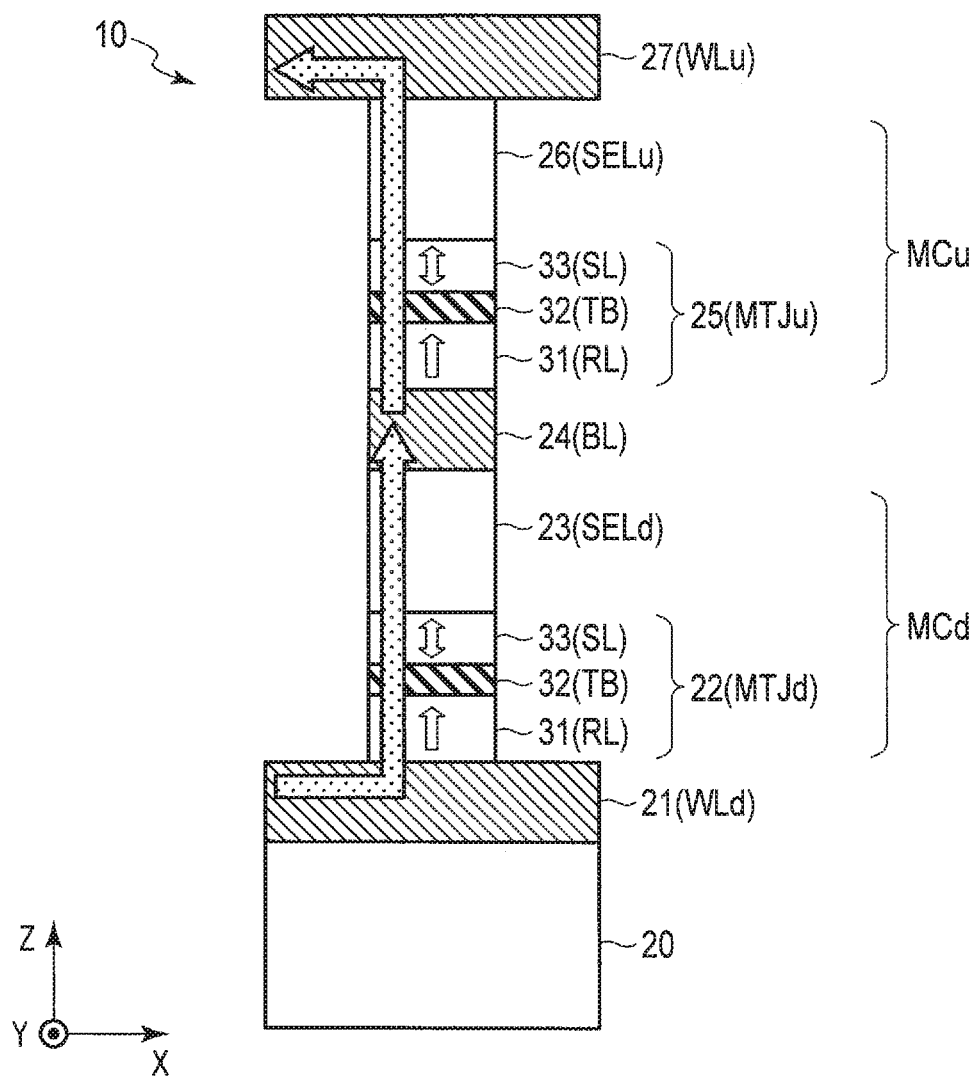
FIG. 13 is a schematic view for explaining current paths at a read operation in the magnetic storage device according to the first embodiment.

FIG. 13 is a schematic view showing an outline of current paths in memory cells at the read operation in the magnetic storage device according to the first embodiment. FIG. 13 schematically shows current paths at the time of reading data from the memory cells MCu and MCd by arrows in the cross-section view taken along the XZ plane including the memory cells MCu and MCd. FIG. 13 can be applied in common to the memory cell arrays 10a and 10b, and thus does not show the indexes "a" and "b" to the reference numerals.

As shown in FIG. 13, when data is read from the memory cell MCu, a read current flows from the bit line BL to the word line WLu, that is, from the reference layer RL to the storage layer SL in the magnetoresistive effect element MTJu. Therefore, the flowing direction of the read current into the memory cell MCu constitutes the writing direction of the data "1" at the write operation.

Similarly, when data is read from the memory cell MCd, a read current flows from the word line WLd to the bit line BL, that is, from the reference layer RL to the storage layer SL in the magnetoresistive effect element MTJd. Therefore, the flowing direction of the read current into the memory cell MCd constitutes the writing direction of the data "1" at the write operation.

1.2.3 Read Operation of the Sense Amplifier

Next, the read operations of the sense amplifiers in the magnetic storage device according to the first embodiment will be described with reference to FIGS. 14 and 15.

Figure 14:
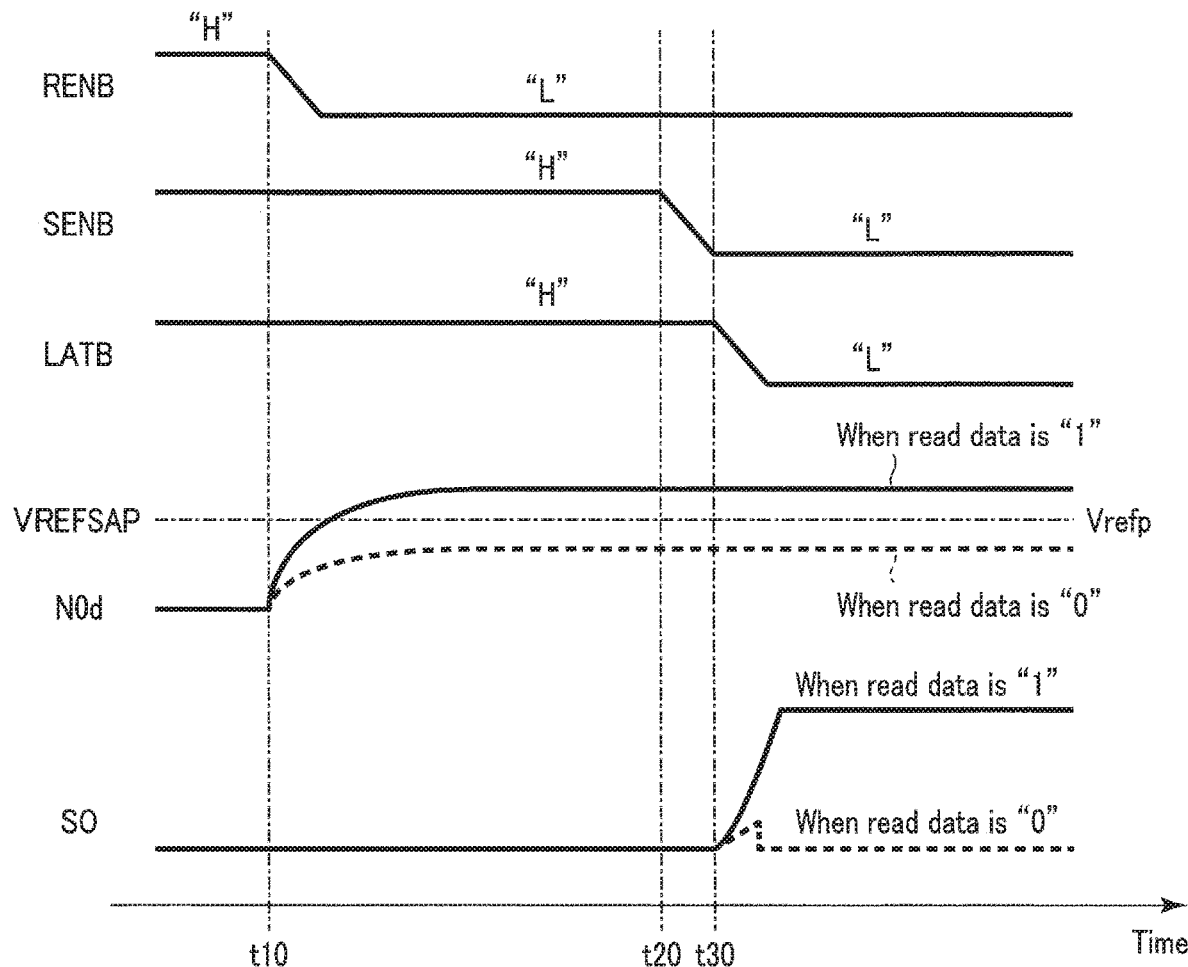
FIG. 14 is a timing chart for explaining a read operation in the magnetic storage device according to the first embodiment.
Figure 15:
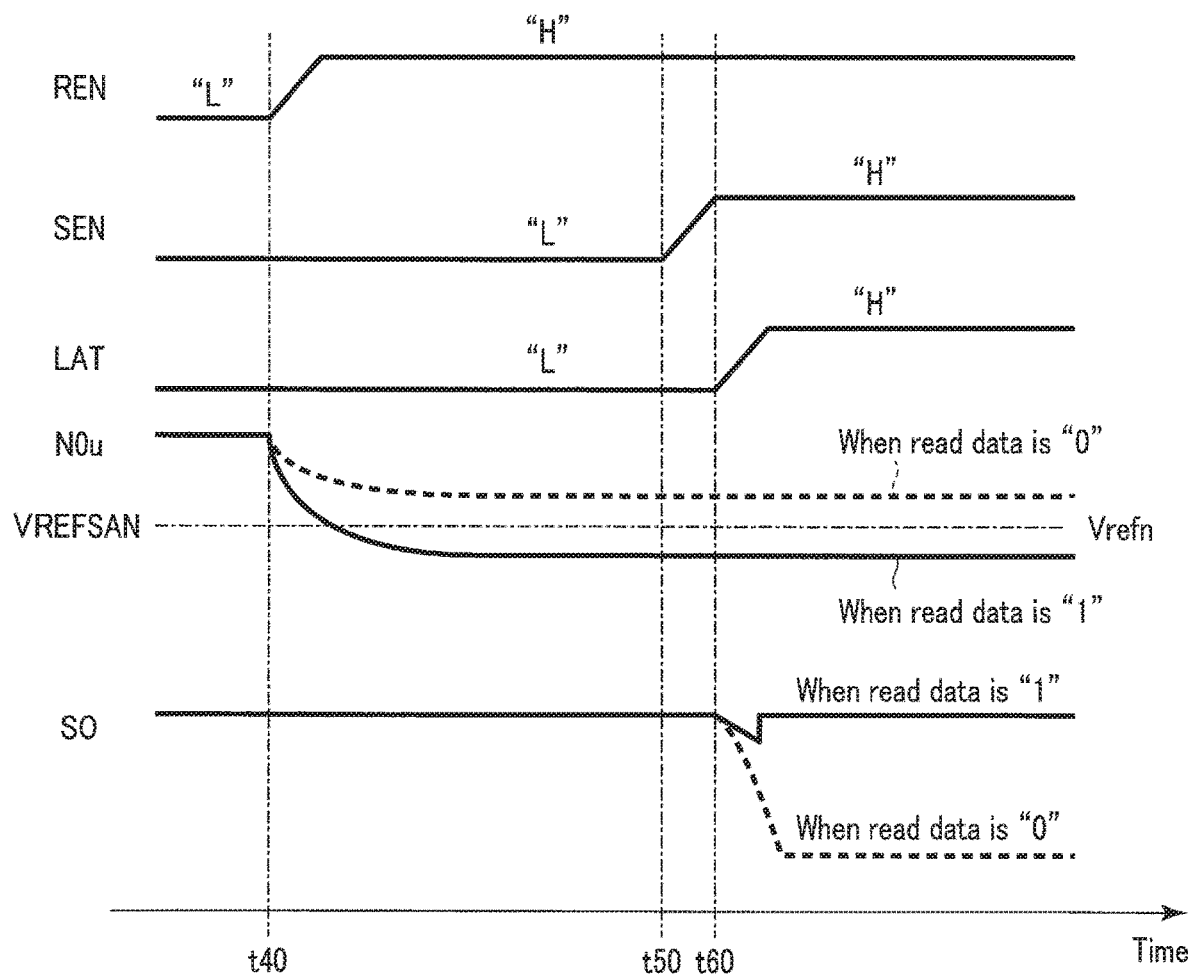
FIG. 15 is a timing chart for explaining a read operation in the magnetic storage device according to the first embodiment.

FIGS. 14 and 15 are timing charts for explaining the read operations of the sense amplifiers in the magnetic storage device according to the first embodiment. FIG. 14 shows the read operation of the sense amplifier SAd described above with reference to FIG. 8. FIG. 15 shows the read operation of the sense amplifier SAu described above with reference to FIG. 9.

First, the read operation of the sense amplifier SAd will be described with reference to FIG. 14.

As shown in FIG. 14, at time t10, the sense amplifier SAd turns the signal RENB from "H" level into "L" level. Accordingly, the transistor T2d is turned on to flow a current of predetermined magnitude from the constant current source Id into the selected memory cell MC via the node N0d. In step with this, the voltage of the node N0d rises from the voltage VSS according to the data stored in the selected memory cell MC. More specifically, when the data stored in the selected memory cell MC is "1", the voltage of the node N0d becomes larger than the voltage Vrefp of the signal VREFSAP. On the other hand, when the data stored in the selected memory cell MC is "0", the voltage of the node N0d becomes smaller than the voltage Vrefp of the signal VREFSAP.

After a lapse of the time during which it is assumed that the difference between the voltage of the node N0d and the voltage Vrefp has increased to the degree that can be detected by the sense amplifier SAd, the sense amplifier SAd turns the signal SENB from "H" level into "L" level at time t20. Accordingly, the transistors T11d and T12d are turned off to cut electrically the nodes SO and SOB from the voltage VSS.

At time t30, the sense amplifier SAd turns the node LATB from "H" level to "L" level (turns the node LAT from "L" level to "H" level). Accordingly, the transistors T4d, T6d, and T13d are turned on. This forms a current path to the node N1d via the transistors T4d, T3d, T7d, and T8d and a current path to the node N1d via the transistors T6d, T5d, T9d, and T10d.

When the voltage of the node N0d is larger than the voltage Vrefp, a larger amount of current flows in the current path via the transistor T5d than the current path via the transistor T3d. Accordingly, the voltage of the node SO becomes larger than the voltage of the node SOB. Finally, the node SO is latched at the "H" level, and the node SOB is latched at "L" level.

On the other hand, when the voltage of the node N0d is smaller than the voltage Vrefp, a larger amount of current flows in the current path via the transistor T3d than the current path via the transistor T5d. Accordingly, the voltage of the node SOB becomes larger than the voltage of the node SO. Finally, the node SO is latched at the "L" level, and the node SOB is latched at "H" level.

The sense amplifier SAd determines the data in the selected memory cell MC based on the output level from the node SO. Specifically, when the node SO is in "H" level, the sense amplifier SAd determines that the data read from the memory cell MC is "1", and when the node SO is "L" level, the sense amplifier SAd determines that the data read from the memory cell MC is "0".

Accordingly, the read operation of the sense amplifier SAd is finished.

Next, the read operation of the sense amplifier SAu will be described with reference to FIG. 15.

As shown in FIG. 15, at time t40, the sense amplifier SAu turns the signal REN from "L" level into "H" level. Accordingly, the transistor T2u is turned on to flow a current of predetermined magnitude flows from the selected memory cell MC to the constant current source Iu via the node N0u. In step with this, the voltage of the node N0u drops from the voltage VDD according to the data stored in the selected memory cell MC. More specifically, when the data stored in the selected memory cell MC is "1", the voltage of the node N0u becomes smaller than the voltage Vrefn of the signal VREFSAN. On the other hand, when the data stored in the selected memory cell MC is "0", the voltage of the node N0u becomes larger than the voltage Vrefn of the signal VREFSAN.

After a lapse of the time during which it is assumed that the difference between the voltage of the node N0u and the voltage Vrefn has increased to the degree that can be detected by the sense amplifier SAu, the sense amplifier SAu turns the signal SEN from "L" level to "H" level at time t50. Accordingly, the transistors T11u and T12u are turned off to cut electrically the nodes SO and SOB from the voltage VDD.

At time t60, the sense amplifier SAu turns the node LAT from "L" level to "H" level (turns the node LATB from "H" level to "L" level). Accordingly, the transistors T4u, T6u, and T13u are turned on. This forms a current path from the node N1u to the transistors T8u, T7u, T3u, and T4u and a current path from the node N1u to the transistors T10u, T9u, T5u, and T6u.

When the voltage of the node N0u is larger than the voltage Vrefn, a larger amount of current flows in the current path via the transistor T3u than the current path via the transistor T5u. Accordingly, the voltage of the node SOB becomes larger than the voltage of the node SO. Finally, the node SO is latched at the "L" level, and the node SOB is latched at "H" level.

On the other hand, when the voltage of the node N0u is smaller than the voltage Vrefn, a larger amount of current flows in the current path via the transistor T5u than the current path via the transistor T3u. Accordingly, the voltage of the node SO becomes larger than the voltage of the node SOB. Finally, the node SO is latched at the "H" level, and the node SOB is latched at "L" level.

The sense amplifier SAu determines the data in the selected memory cell MC based on the output level from the node SO. Specifically, when the node SO is in "H" level, the sense amplifier SAu determines that the data read from the memory cell MC is "1", and when the node SO is "L" level, the sense amplifier SAu determines that the data read from the memory cell MC is "0".

Accordingly, the read operation of the sense amplifier SAu is finished.

1.3 Advantageous Effects of Present Embodiment

According to the first embodiment, it is possible to ensure stable reading while suppressing increase in the circuit area. This advantageous effect will be described below.

The memory cell MC controls the current to the magnetoresistive effect element MTJ by the selector SEL including no selected gate. This makes it possible to eliminate a conductor for supplying a voltage to a selected gate and select a memory cell MC by two conductors, the bit line BL and the word line WL. Accordingly, it is possible to form and integrate a cross-point structure MRAM at an integration density of 4F2.

In addition, in the memory cell array 10, the two memory cells MCu and MCd share one bit line BL. Accordingly, it is possible to integrate the cross-point structure efficiently in the layering direction.

The read circuit 16 includes the sense amplifiers SAu and SAd and the constant current sources Iu and Id. The constant current sources Iu and Id can be electrically connected to the memory cells MCu and MCd via the word lines WLu and WLd, respectively. The sense amplifier SAu reads data from the memory cell MCu based on the current flowing from the memory cell MCu to the constant current source Iu via the word line WLu. The sense amplifier SAd reads data from the memory cell MCd based on the current flowing from the constant current source Id to the memory cell MCd via the word line WLd. This allows the sense amplifiers SAu and SAd to read data based on the constant value of current. Accordingly, it is possible to suppress the occurrence of read disturbance and read error at the time of reading.

Figure 16:
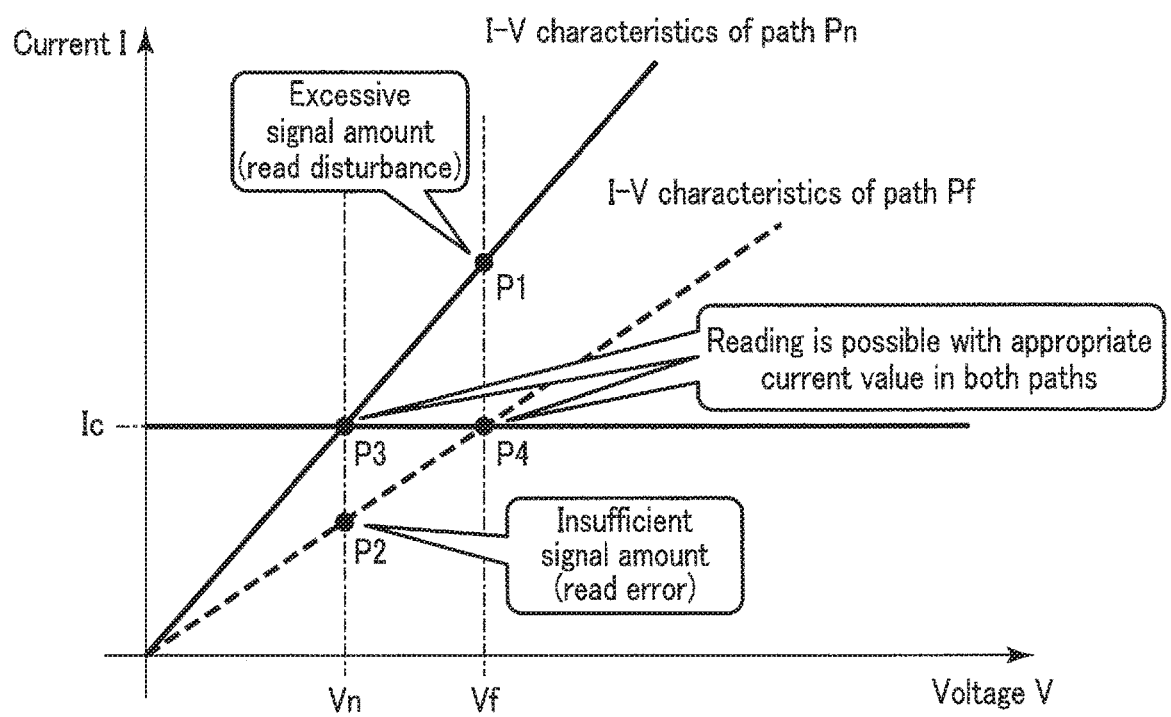
FIG. 16 is a diagram for explaining a read method in the magnetic storage device according to the first embodiment.

FIG. 16 is a diagram for explaining a read method in the magnetic storage device according to the first embodiment. FIG. 16 shows current-voltage characteristics (I-V characteristics) of memory cells MC arranged in the paths Pn and Pf different in length shown in FIG. 4.

As shown in FIG. 16, the path Pf is longer than the path Pn and has a larger parasitic resistance resulting from the path length of the word lines WL and the bit lines BL. Accordingly, even if the I-V characteristics are equal between the memory cells MC, when the identical voltage V is applied, the currents flowing to the memory cells MC vary in magnitude depending on the difference in the parasitic resistance. In addition, in the magnetoresistive effect element MTJ, the resistance value and the resistance change ratio are small, and thus the parasitic resistance exerts a significantly large influence on change in the amount of current in the memory cell MC.

Accordingly, at the read operation, for example, when the voltage Vn is applied to all the memory cells MC, the appropriate current Ic can flow into the memory cells MC in the path Pn (equivalent to point P3 in FIG. 16), whereas a significantly smaller current than the current Ic flows into the memory cells MC in the path Pf (equivalent to point P2 in FIG. 16). Therefore, the quantity of signals necessary for reading data from the memory cells MC in the path Pf may become insufficient to cause read error. In addition, when the voltage Vf is applied to all the memory cells MC at the read operation, for example, the appropriate current Ic can flow into the memory cells MC in the path Pf (equivalent to point 4 in FIG. 16), whereas a significantly larger current than the current Ic flows into the memory cells MC in the path Pn (equivalent to point P1 in FIG. 16). Therefore, at the time of reading data from the memory cells MC in the path Pn, a current of magnitude equivalent to a write current may flow to cause read disturbance.

According to the first embodiment, as described above, the sense amplifiers SAu and SAd read data based on the constant current Ic regardless of the path length (in both the cases of the point P3 and the point P4 in FIG. 16). Accordingly, it is possible to suppress the occurrence of read disturbance and read error at the time of reading.

In addition, at the time of data reading, a read current flows into both the memory cells MCu and MCd in the writing direction of the data "1". This makes it possible to suppress the occurrence of read disturbance at the time of reading.

As a supplementary remark, the magnetoresistive effect element MTJ varies in characteristics depending on the flowing direction of the current. Specifically, writing the data "1" into the magnetoresistive effect element MTJ requires a larger current than that for writing the data "0". In other words, data is less likely to be written into the magnetoresistive effect element MTJ in the writing direction of the data "1" than in the writing direction of the data "0". That is, in the case of flowing a read current into the magnetoresistive effect element MTJ, read disturbance is less likely to occur even when a larger read current is flown in the writing direction of the data "1" than in the writing direction of the data "0". According to the first embodiment, as described above, the flowing direction of a read current constitutes the writing direction of the data "1" regardless of whether in the memory cell MCu or the memory cell MCd. Therefore, it is possible to flow a larger current at the time of reading, thereby shortening the time for reading.

In addition, the constant current source Iu is connected to the memory cells MCau and MCbu respectively via the word lines WLau and WLbu, and the constant current source Id is connected to the memory cells MCad and MCbd respectively via the word lines WLad and WLbd. The global bit line GBLa is fed with a constant voltage by the constant voltage source Va, and the global bit line GBLb is fed with a constant voltage by the constant voltage source Vb. Accordingly, at the read operation, the constant current sources Iu and Id only need to charge the word lines WL with a constant current. This shortens the time for charging as compared to the case of charging the global bit line GBL having a larger parasitic capacity with a constant current, for example. Accordingly, it is possible to shorten the time for the sense amplifier SA to read data.

The sense amplifier SAu is electrically connectable to the memory cell MCau in the memory cell array 10a via the transistor T_al1, and is also electrically connectable to the memory cell MCbu in the memory cell array 10b via the transistor T_bl2. The sense amplifier SAd is electrically connectable to the memory cell MCad in the memory cell array 10a via the transistor T_al2, and is also electrically connectable to the memory cell MCbd in the memory cell array 10b via the transistor T_bl1. This makes it possible to read data from the memory cells MCau and MCbd at the same time. Similarly, it is possible to read data from the memory cells MCbu and MCad at the same time.

Specifically, to read data from the memory cells MCau and MCbd, for example, the transistors T_al1 and T_bl1 are turned on at the same time, and the transistors T_al2 and T_bl2 are turned off at the same time. Accordingly, the sense amplifier SAu can read data from the memory cell MCau, and the sense amplifier SAd can read data from the memory cell MCbd. For example, to read data from the memory cells MCad and MCbu, the transistors T_al1 and T_bl1 are turned off at the same time, and the transistors T_al2 and T_bl2 are turned on at the same time. Accordingly, the sense amplifier SAu can read data from the memory cell MCbu, and the sense amplifier SAd can read data from the memory cell MCad.

This makes it possible to share the sense amplifiers SAu and SAd between the memory cell arrays 10a and 10b. Therefore, it is possible to suppress increase in the circuit area.

2. Second Embodiment

Next, a magnetic storage device according to a second embodiment will be described. In the first embodiment described above, the sense amplifier SAu is shared between the word line WLau of the memory cell array 10a and the word line WLbu of the memory cell array 10b, and the sense amplifier SAd is shared between the word line WLad of the memory cell array 10a and the word line WLbd of the memory cell array 10b. The second embodiment is different from the first embodiment in that no sense amplifier is shared between memory cell arrays 10a and 10b but a sense amplifier is shared between a word line WLau and a word line WLad in the one memory cell array 10a. Hereinafter, the differences from the first embodiment will be mainly described.

2.1 Configuration of Magnetic Storage Device

FIG. 17 is a block diagram for explaining a configuration of the magnetic storage device according to the second embodiment. FIG. 17 corresponds to FIG. 1 described above in relation to the first embodiment.

As shown in FIG. 17, a magnetic storage device 1 according to the second embodiment is different from the magnetic storage device 1 according to the first embodiment in not including the layer selection circuit 13 but including read circuits 16a and 16b respectively corresponding to the memory cell array 10a and 10b. The read circuit 16a reads data from memory cells MCau and MCad, and the read circuit 16b reads data from memory cells MCbu and MCbd.

Specifically, one each row selection circuit 11, column selection circuit 12, write circuit 15, and read circuit 16 are provided for one memory cell array 10. A set of the memory cell array 10a, a row selection circuit 11a, a column selection circuit 12a, a write circuit 15a, and the read circuit 16a and a set of the memory cell array 10b, a row selection circuit lib, a column selection circuit 12b, a write circuit 15b, and the read circuit 16b are identical in configuration. Accordingly, these configurations will be described without adding the indexes "a" and "b" to the reference numerals for differentiation.

Figure 18:
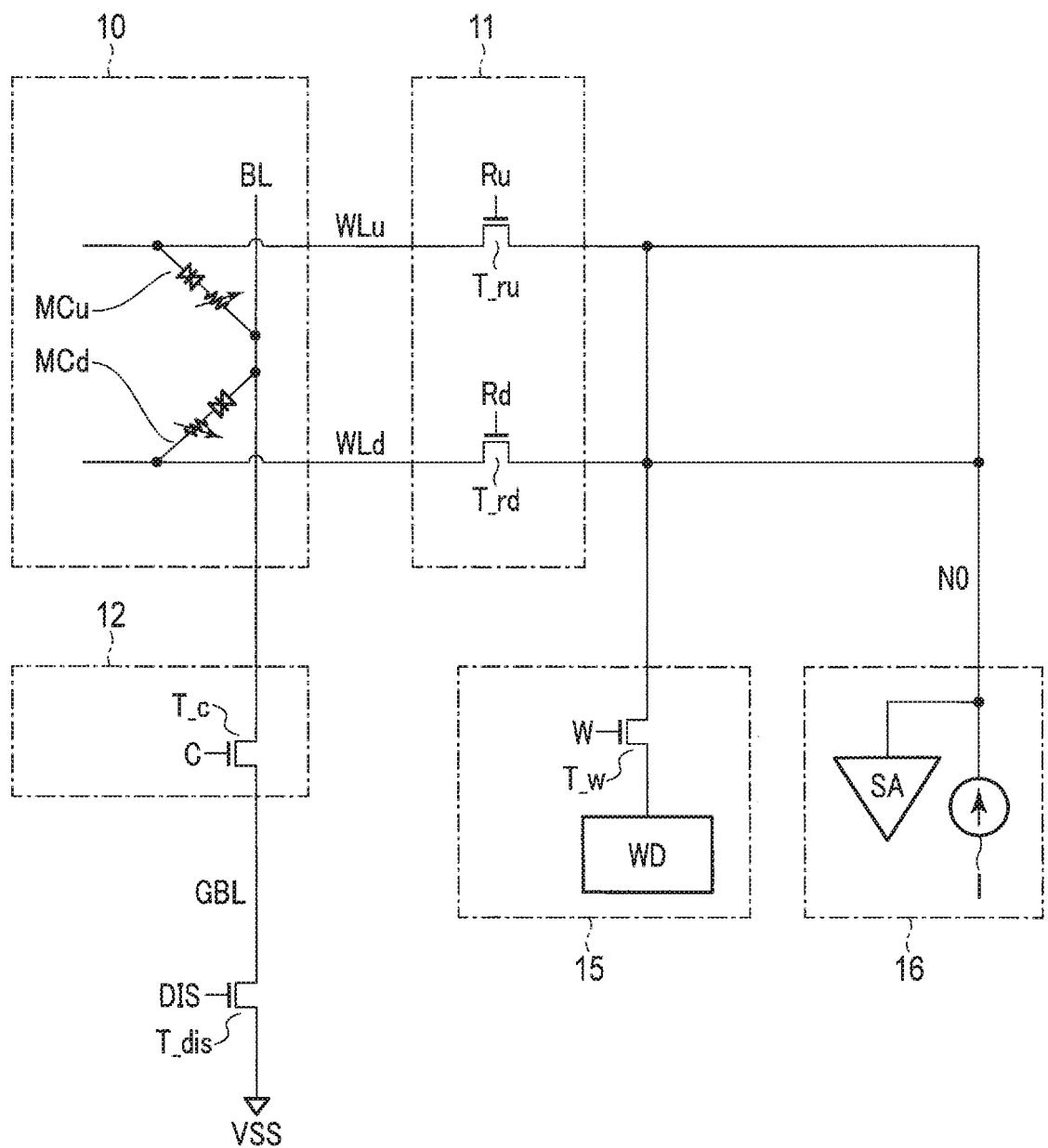
FIG. 18 is a circuit diagram for explaining connection of a memory cell array in row and column directions in the magnetic storage device according to the second embodiment.

2.2 Configuration of Circuits Connected in Row Direction and Column Direction to Memory Cell Array Next, a configuration of circuits connected in the row direction and the column direction to the thus configured memory cell array 10 according to the second embodiment will be described with reference to FIG. 18. FIG. 18 corresponds to FIGS. 6 and 7 described above in relation to the first embodiment, and shows an example of configuration of circuits in the row direction and the column direction in the memory cell array 10. In FIG. 18, the index "u" is added to the components corresponding to a word line WLu, and the index "d" is added to the components corresponding to a word line WLd for differentiation between them. The following descriptions are based on the assumption that the word lines WLu and WLd shown in FIG. 18 correspond to the same bit line BL.

As shown in FIG. 18, the word lines WLu and WLd respectively connect between a first end of the memory cell MCu and a first end of the memory cell MCd, and the row selection circuit 11. The row selection circuit 11 includes row selection transistors T_ru and T_rd. The row selection transistor T_ru includes a first end connected to the word line WLu, a second end connected to a node NO, and a gate to which a signal Ru is supplied. The row selection transistor T_rd includes a first end connected to the word line WLd, a second end connected to the node NO, and a gate to which a signal Rd is supplied.

The write circuit 15 includes a transistor T_w and a write driver WD. The transistor T_w includes a first end connected to the node NO, a second end connected to the write driver WD, and a gate to which a signal W is supplied. The write driver WD has a function of supplying a write current to the memory cell MC in the memory cell array 10.

The read circuit 16 includes a sense amplifier SA and a constant current source I. The sense amplifier SA and the constant current source I are respectively equivalent in configuration to the sense amplifier SAd and the constant current source Id described above with reference to FIG. 8, for example. The sense amplifier SA and the constant current source I are connected to the node NO. The sense amplifier SA has a function of reading data from both the memory cells MCu and MCd in the memory cell array 10. The constant current source I has a function of keeping the current flowing from the node NO to the memory cell array 10 at a constant value.

The bit line BL connects between a second end of the memory cell MCu and a second end of the memory cell MCd, and the column selection circuit 12. The column selection circuit 12 includes a column selection transistor T_c. The column selection transistor T_c includes a first end connected to the bit line BL, a second end connected to a global bit line GBL, and a gate to which a signal C is supplied.

The global bit line GBL is further connected to a first end of a transistor T_dis. The transistor T_dis includes a second end to which a voltage VSS is supplied and a gate to which a signal DIS is supplied. The global bit line GBL may be shared with other memory cell arrays 10 not shown.

2.3 Current Paths at Read Operation

Next, current paths at the read operation in the magnetic storage device according to the second embodiment will be described with reference to FIGS. 19 and 20.

Figure 19:
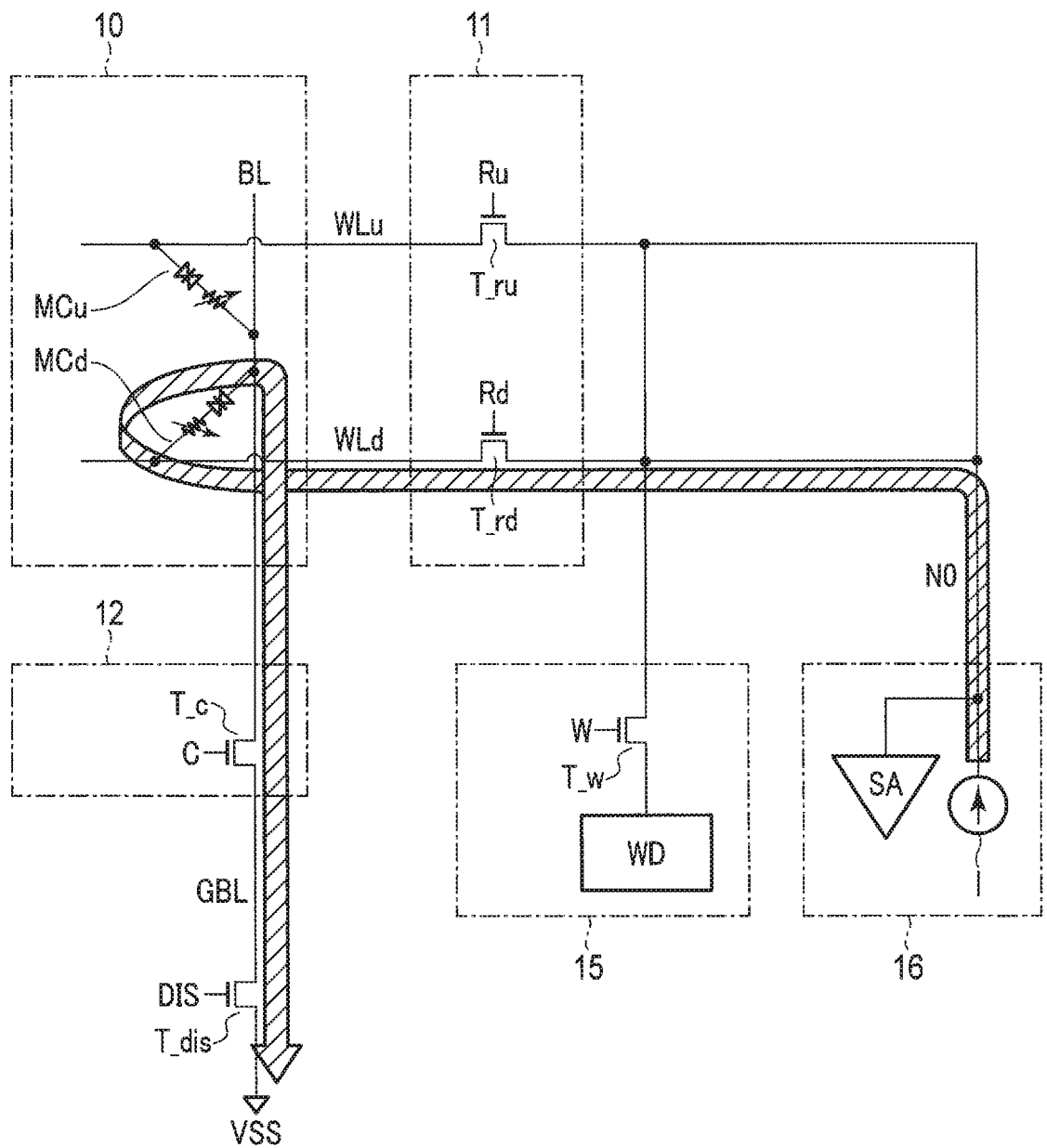
FIG. 19 is a schematic view for explaining a current path at a read operation in the magnetic storage device according to the second embodiment.
Figure 20:
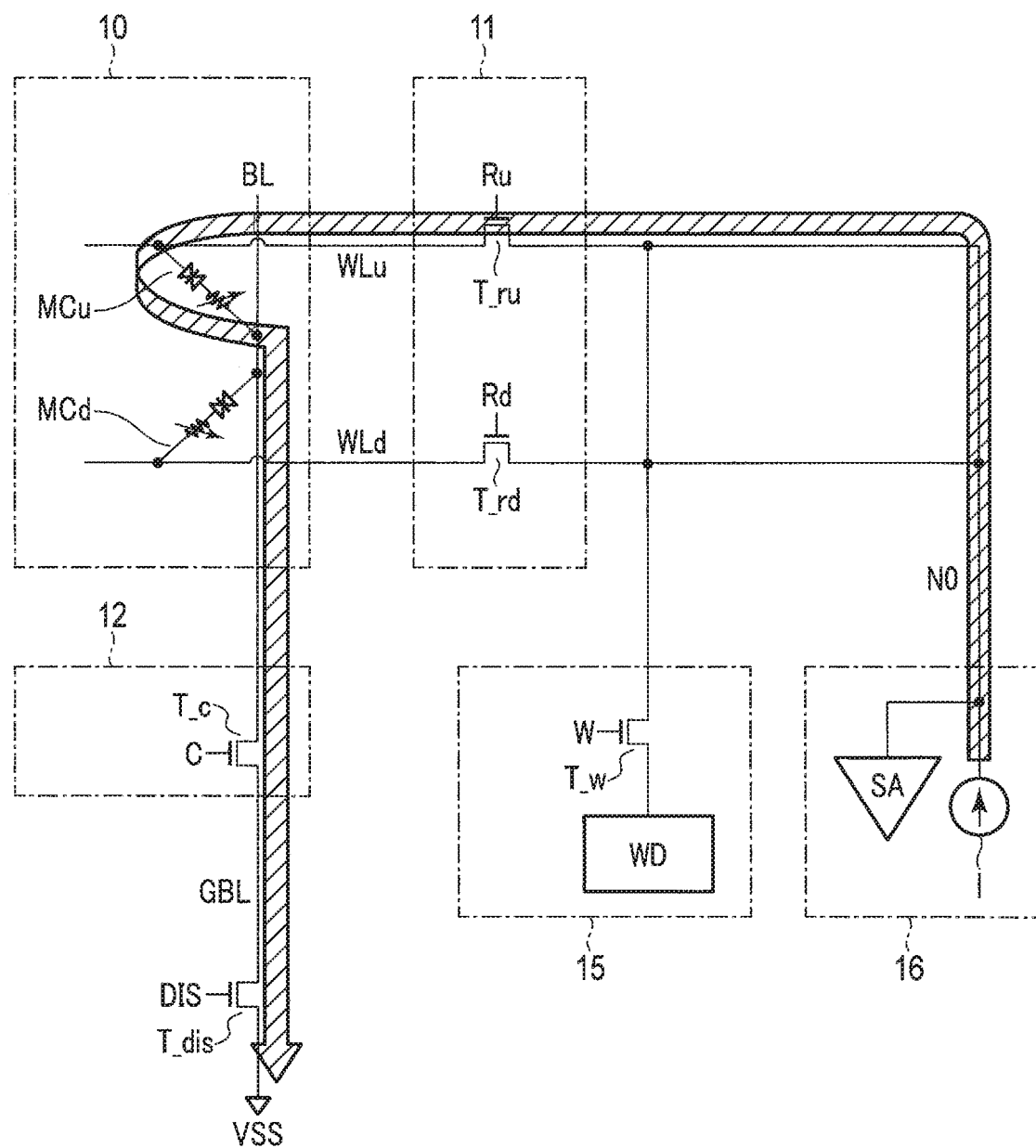
FIG. 20 is a schematic view for explaining a current path at a read operation in the magnetic storage device according to the second embodiment.

FIGS. 19 and 20 are schematic views showing current paths at the read operation in the magnetic storage device according to the second embodiment. FIG. 19 schematically shows a current path by an arrow at the time of reading data from the memory cell MCd using the sense amplifier SA. FIG. 20 schematically shows a current path by an arrow at the time of reading data from the memory cell MCu using the sense amplifier SA.

First, the current path at the time of reading data from the memory cell MCd will be described with reference to FIG. 19.

As shown in FIG. 19, the row selection circuit 11 selects the word line WLd. Specifically, the row selection circuit 11 inputs respectively "L" level and "H" level to the signals Ru and Rd to turn off the row selection transistor T_ru and turn on the row selection transistor T_rd.

Accordingly, the word line WLd is charged with a current of a constant magnitude flowing from the constant current source I.

The column selection circuit 12 selects the bit line BL. Specifically, the column selection circuit 12 inputs "H" level to the signal C to turn on the column selection transistor T_c. The column selection circuit 12 also supplies "H" level to the signal DIS to turn on the transistor T_dis.

Thus, the global bit line GBL and the bit line BL are charged with the voltage VSS.

Accordingly, a read current flows into the memory cell MCd from the word line WLd to the global bit line GBL. The sense amplifier SA can read data from the selected memory cell MCd based on the current of a constant magnitude flowing from the constant current source I.

Next, the current path at the time of reading data from the memory cell MCu using the sense amplifier SA will be described with reference to FIG. 20.

As shown in FIG. 20, the row selection circuit 11 selects the word line WLu. Specifically, the row selection circuit 11 inputs "H" level and "L" level to the signals Ru and Rd to turn on the row selection transistor T_ru and turn off the row selection transistor T_rd.

Accordingly, the word line WLu is charged with a current of a constant magnitude flowing from the constant current source I.

The column selection circuit 12 selects the bit line BL. Specifically, the column selection circuit 12 inputs "H" level to the signal C to turn on the column selection transistor T_c and connect the bit line BL to the global bit line GBL. The voltage VSS is applied to global bit line GBL via the transistor T_dis.

Thus, the global bit line GBL and the bit line BL are charged with the voltage VSS.

Accordingly, the read current flows into the memory cell MCu from the word line WLu to the global bit line GBL. The sense amplifier SA can read data from the selected memory cell MCu based on the current of a constant magnitude flowing from the constant current source I.

2.4 Advantageous Effects of Present Embodiment

According to the second embodiment, the sense amplifier SA and the constant current source I are connected to both the word lines WLu and WLd via the node NO. The global bit line GBL is fed with a constant voltage by the voltage VSS. Accordingly, the sense amplifier SA can sense the current flowing from the constant current source I to the word line WLu or WLd. Therefore, the sense amplifier SA can read data from both the memory cells MCu and MCd based on the current of a constant value. This makes it possible to suppress the occurrence of read disturbance and read error at the time of reading as in the first embodiment.

As described above, the sense amplifier SA is shared between the memory cells MCu and MCd in the same memory cell array 10. Accordingly, it is possible to suppress increase in the circuit area to the same degree as that in the first embodiment without sharing the sense amplifier SA between the different memory cell arrays 10a and 10b unlike the first embodiment.

In addition, it is not necessary to charge the global bit line GBL with a constant current, which makes it possible to shorten the time for reading data as in the first embodiment.

3. Third Embodiment

Next, a magnetic storage device according to a third embodiment will be described. In the third embodiment, the layering direction of the magnetoresistive effect element MTJ according to the second embodiment is changed. Hereinafter, the differences from the second embodiment will be mainly described.

3.1 Configuration of Magnetoresistive Effect Element

A configuration of the magnetoresistive effect element according to the third embodiment will be described with reference to FIG. 21.

FIG. 21 is a cross-sectional view of memory cells in the magnetic storage device according to the third embodiment. FIG. 21 corresponds to FIGS. 3 and 5, which is a cross-sectional view of memory cells in the magnetic storage device according to the third embodiment taken along an XZ plane. FIG. 21 shows cross sections of two memory cells MCu and MCd sharing a bit line BL.

As shown in FIG. 21, an element 22 functioning as a magnetoresistive effect element MTJd includes a ferromagnetic material 31d functioning as a reference layer RL, a nonmagnetic material 32d functioning as a tunnel barrier layer, and a ferromagnetic material 33d functioning as a storage layer SL. The element 22 has a plurality of films layered in the order of the ferromagnetic material 31d, the nonmagnetic material 32d, and the ferromagnetic material 33d from a word line WLd side to a bit line BL side (in an Z axis direction), for example. That is, the element 22 is a top-free magnetoresistive effect element MTJ in which the reference layer RL is closer to a semiconductor substrate 20 side than the storage layer SL, for example.

On the other hand, an element 25 functioning as a magnetoresistive effect element MTJu includes a ferromagnetic material 31u functioning as a storage layer SL, a nonmagnetic material 32u functioning as a tunnel barrier layer, and a ferromagnetic material 33u functioning as a reference layer RL. The element 25 has a plurality of films layered in the order of the ferromagnetic material 31u, the nonmagnetic material 32u, and the ferromagnetic material 33u from the bit line BL to the word line WLu side (in the Z axis direction), for example. That is, the element 25 is a bottom-free magnetoresistive effect element MTJ in which the storage layer SL is closer to the semiconductor substrate 20 side than the reference layer RL, for example.

3.2 Current Paths in Memory Cells at Read Operation

Next, current paths in memory cells at the read operation in the magnetic storage device according to the third embodiment will be described with reference to FIG. 22.

FIG. 22 is a schematic view showing an outline of current paths in memory cells at the read operation in the magnetic storage device according to the third embodiment. FIG. 22 schematically shows current paths at the time of reading data from the memory cells MCu and MCd by arrows in the cross-section view taken along the XZ plane including the memory cells MCu and MCd.

As shown in FIG. 22, when data is read from the memory cell MCu, a read current flows from the word line WLu to the bit line BL, that is, from the reference layer RL to the storage layer SL in the magnetoresistive effect element MTJu. Therefore, the flowing direction of the read current into the memory cell MCu constitutes the writing direction of the data "1" at the write operation.

Similarly, when data is read from the memory cell MCd, a read current flows from the word line WLd to the bit line BL, that is, from the reference layer RL to the storage layer SL in the magnetoresistive effect element MTJd. Therefore, the flowing direction of the read current into the memory cell MCd constitutes the writing direction of the data "1" at the write operation.

3.2 Advantageous Effects of Present Embodiment

According to the third embodiment, the magnetoresistive effect elements MTJu and MTJd are opposite in the layering order of the storage layer SL and the reference layer RL. Accordingly, in both the memory cells MCu and MCd, the flowing direction of the current for writing the data "1" constitutes the direction from the word line WL side to the bit line BL side. On the other hand, the flowing directions of the read current in the third embodiment are the same as the flowing directions of the read current described above in relation to the second embodiment with reference to FIGS. 19 and 20. Accordingly, in the case of reading data from either of the memory cells MCu and MCd, the flowing direction of the read current constitutes the direction from the word line WL (WLu and WLd) to the bit line BL, that is, the flowing direction of the current for writing the data "1". Therefore, as in the first embodiment, it is possible to flow a larger read current than that in the case where the flowing direction of the read current constitutes the flowing direction of the current for writing the data "0", thereby shortening the reading time.

The sense amplifier SA and the constant current source I are connected to both the word lines WLu and WLd via the node NO. The global bit line GBL is fed with a constant voltage by the voltage VSS. Accordingly, the sense amplifier SA can sense the current flowing from the constant current source I to the word line WLu or WLd. Therefore, the sense amplifier SA can read data from both the memory cells MCu and MCd based on the current of a constant value. This makes it possible to suppress the occurrence of read disturbance and read error at the time of reading.

As described above, the sense amplifier SA is shared between the memory cells MCu and MCd in the same memory cell array 10. Accordingly, it is possible to suppress increase in the circuit area to the same degree as that in the first embodiment without sharing the sense amplifier SA between the different memory cell arrays 10a and 10b unlike the first embodiment.

In addition, it is not necessary to charge the global bit line GBL with a constant current, which makes it possible to shorten the time for reading data as in the first embodiment.

4. Fourth Embodiment

Next, a magnetic storage device according to a fourth embodiment will be described. In the first to third embodiment described above, data is read based on the current flowing into the word line WL charged with a current of a constant magnitude regardless of whether the data reading destination is the memory cell MCu or the memory cell MCd. The fourth embodiment is different from the first to third embodiments in that data is read based on the current flowing into a word line WL side or the current flowing into a global bit line GBL side depending on whether the data reading destination is a memory cell MCu or a memory cell MCd. Hereinafter, the differences from the second embodiment will be mainly described.

4.1 Configuration of Circuits Connected in Row Direction and Column Direction to Memory Cell Array A configuration of circuits connected in the row direction and the column direction to a memory cell array 10 according to the fourth embodiment will be described with reference to FIG. 23. FIG. 23 corresponds to FIG. 18 described above in relation to the second embodiment, which shows an example of configuration of circuits in the row direction and the column direction in the memory cell array 10.

As shown in FIG. 23, the word lines WLu and WLd respectively connect between a first end of the memory cell MCu and a first end of the memory cell MCd, and a row selection circuit 11. The row selection circuit 11 includes row selection transistors T_ru and T_rd. The row selection transistor T_ru includes a first end connected to the word line WLu, a second end to which a voltage VSS is supplied, and a gate to which a signal Ru is supplied. The row selection transistor T_rd includes a first end connected to the word line WLd, a second end connected to a node NO, and a gate to which a signal Rd is supplied.

The write circuit 15 includes a transistor T_w and a write driver WD. The transistor T_w includes a first end connected to the node NO, a second end connected to the write driver WD, and a gate to which a signal W is supplied. The write driver WD has a function of supplying a write current to the memory cell MC in the memory cell array 10.

The read circuit 16 includes a sense amplifier SA and a constant current source I. The sense amplifier SA and the constant current source I are respectively equivalent in configuration to the sense amplifier SAd and the constant current source Id described above with reference to FIG. 8, for example. The sense amplifier SA and the constant current source I are connected to the node NO. The sense amplifier SA has a function of reading data from both the memory cells MCu and MCd in the memory cell array 10. The constant current source I has a function of keeping the current flowing from the node NO to the memory cell array 10 at a constant value.

The bit line BL connects between a second end of the memory cell MCu and a second end of the memory cell MCd, and the column selection circuit 12. The column selection circuit 12 includes a column selection transistor T_c. The column selection transistor T_c includes a first end connected to the bit line BL, a second end connected to a global bit line GBL, and a gate to which a signal C is supplied.

The global bit line GBL is further connected to a first end of the transistor T_dis and a first end of and the transistor T_s1. The transistor T_dis includes a second end to which a voltage VSS is supplied and a gate to which a signal DIS is supplied. The transistor T_s1 includes a second end connected to the node NO and a gate to which a signal S1 is supplied. The global bit line GBL may be shared with other memory cell arrays 10 not shown.

4.2 Current Paths at Read Operation

Next, current paths at the read operation in the magnetic storage device according to the fourth embodiment will be described with reference to FIGS. 24 and 25.

Figure 24:
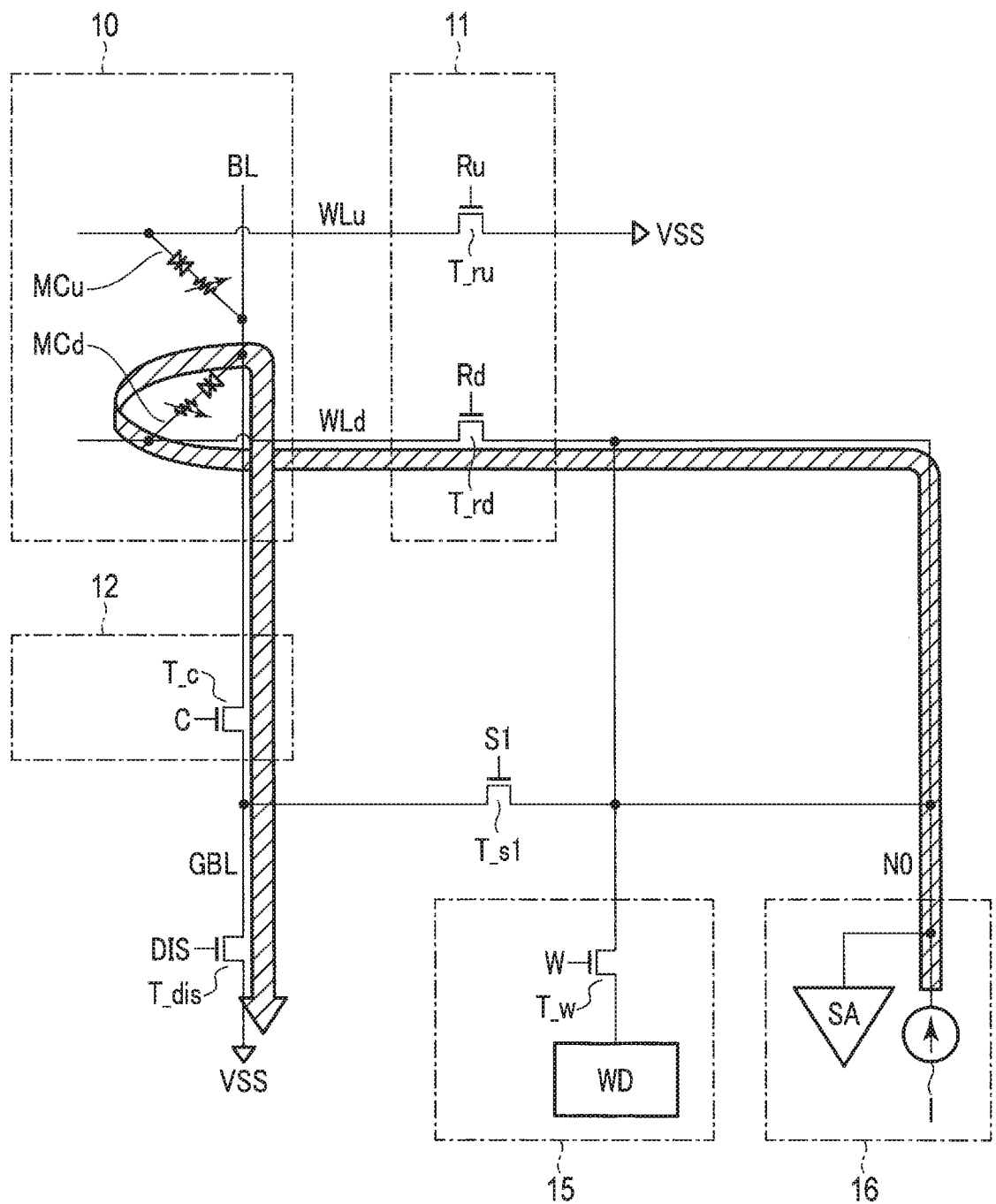
FIG. 24 is a schematic view for explaining a current path at a read operation in the magnetic storage device according to the fourth embodiment.
Figure 25:
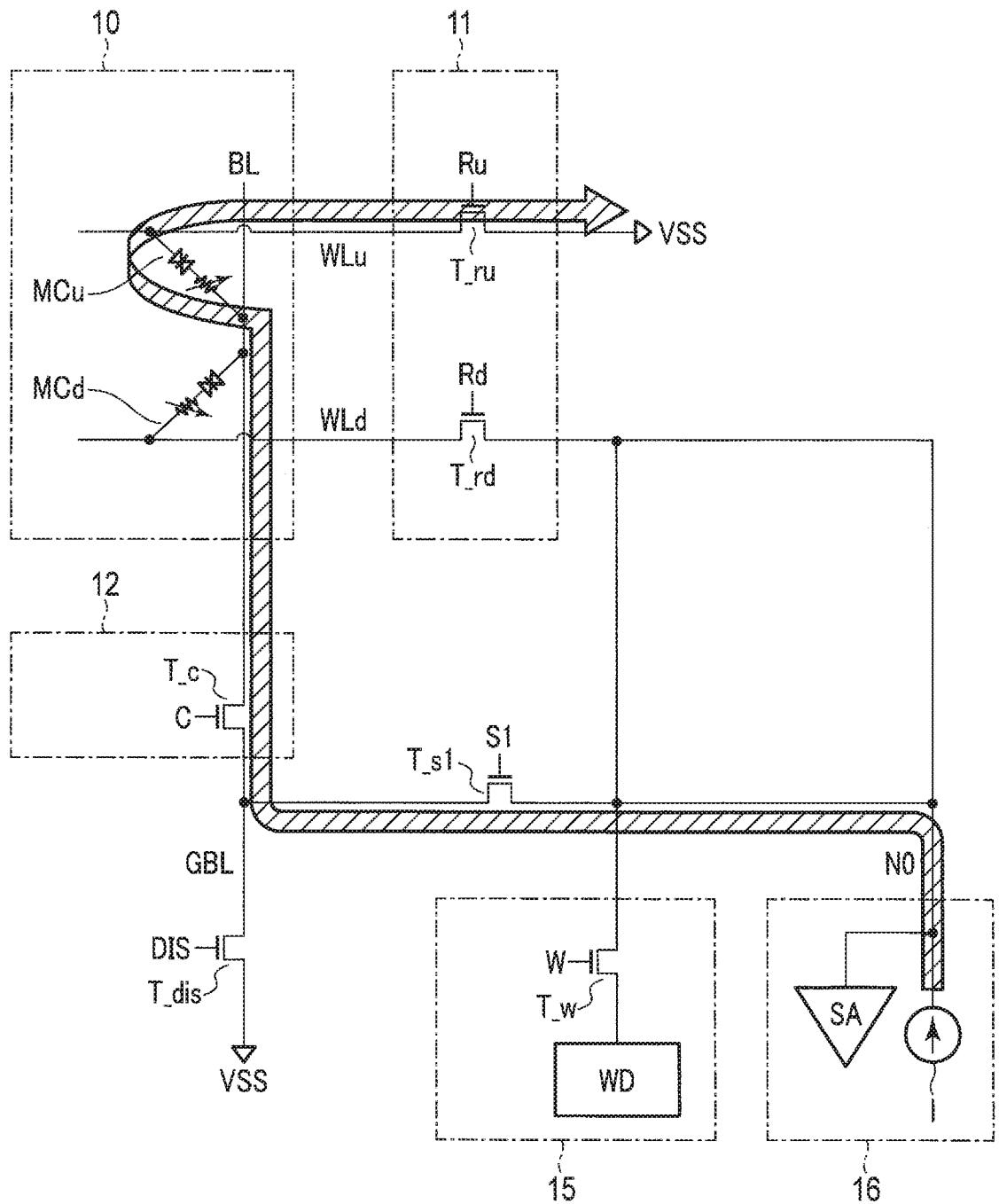
FIG. 25 is a schematic view for explaining a current path at a read operation in the magnetic storage device according to the fourth embodiment.

FIGS. 24 and 25 are schematic views showing current paths at the read operation in the magnetic storage device according to the fourth embodiment. FIG. 24 schematically shows a current path by an arrow at the time of reading data from the memory cell MCd using the sense amplifier SA. FIG. 25 schematically shows a current path by an arrow at the time of reading data from the memory cell MCu using the sense amplifier SA.

First, the current path at the time of reading data from the memory cell MCd will be described with reference to FIG. 24.

As shown in FIG. 24, the row selection circuit 11 selects the word line WLd. Specifically, the row selection circuit 11 inputs respectively "L" level and "H" level to the signals Ru and Rd to turn off the row selection transistor T_ru and turns on the row selection transistor T_rd.

Accordingly, the word line WLd is charged with a current of a constant magnitude flowing from the constant current source I.

The column selection circuit 12 selects the bit line BL. Specifically, the column selection circuit 12 inputs "H" level to the signal C to turn on the column selection transistor T_c. The signals DIS and S1 are respectively supplied with "H" level and "L" level to turn on the transistor T_dis and turn off the transistor T_s1.

Thus, the global bit line GBL and the bit line BL are charged with the voltage VSS.

Accordingly, a read current flows into the memory cell MCd from the word line WLd to the global bit line GBL. The sense amplifier SA can read data from the selected memory cell MCd based on the current of a constant magnitude flowing from the constant current source I.

Next, the current path at the time of reading data from the memory cell MCu using the sense amplifier SA will be described with reference to FIG. 25.

As shown in FIG. 25, the row selection circuit 11 selects the word line WLu. Specifically, the row selection circuit 11 inputs "H" level and "L" level to the signals Ru and Rd to turn on the row selection transistor T_ru and turn off the row selection transistor T_rd.

Accordingly, the word line WLu is charged with the voltage VSS.

The column selection circuit 12 selects the bit line BL. Specifically, the column selection circuit 12 inputs "H" level to the signal C to turn on the column selection transistor T_c. The signals DIS and S1 are respectively supplied with "L" level and "H" level to turn off the transistor T_dis and turn on the transistor T_s1.

Thus, the global bit line GBL and the bit line BL are charged with a current of a constant magnitude flowing from the constant current source I.

Accordingly, the read current flows into the memory cell MCu from the global bit line GBL to the word line WLu. The sense amplifier SA can read data from the selected memory cell MCu based on the current of a constant magnitude flowing from the constant current source I.

Next, current paths in memory cells at the read operation in the magnetic storage device according to the fourth embodiment will be described with reference to FIG. 26.

Figure 26:
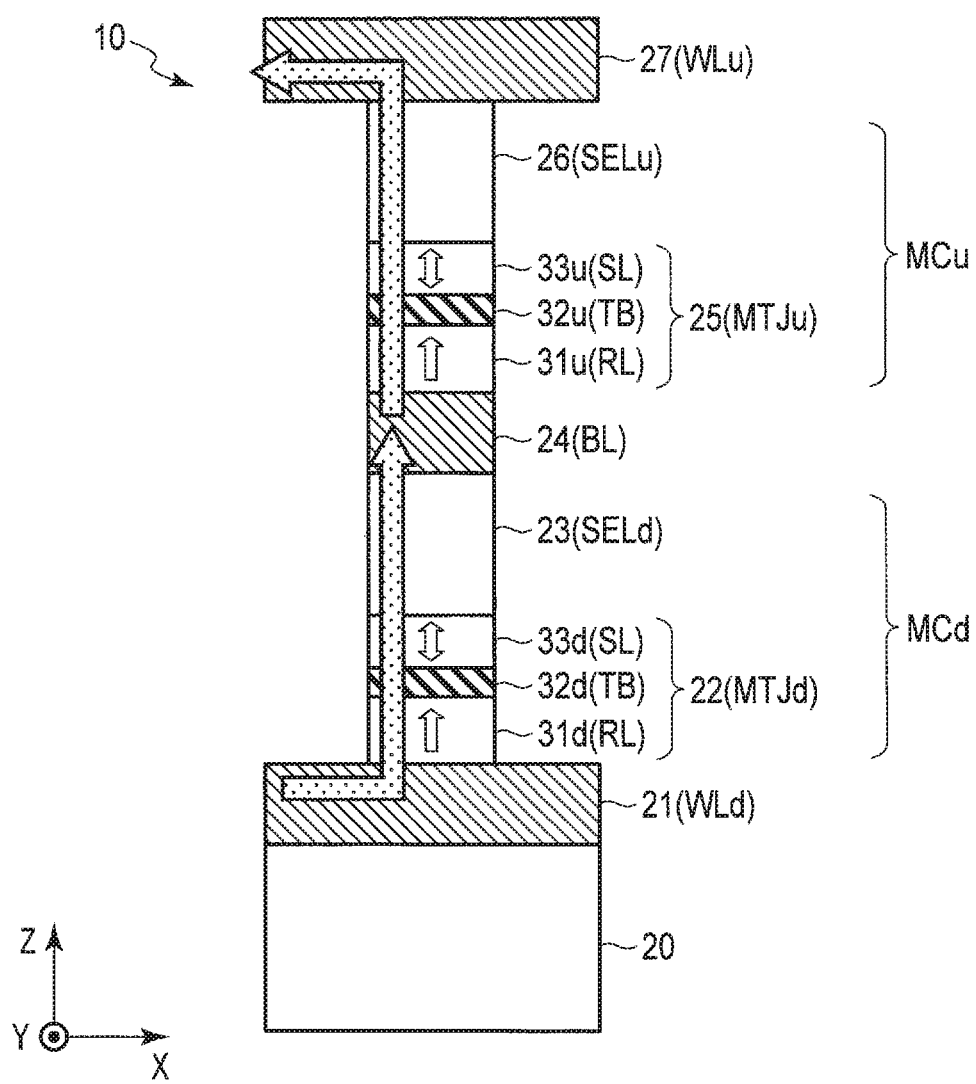
FIG. 26 is a schematic view for explaining current paths at a read operation in the magnetic storage device according to the fourth embodiment.

FIG. 26 is a schematic view showing an outline of current paths in memory cells at the read operation in the magnetic storage device according to the fourth embodiment. FIG. 26 schematically shows current paths at the time of reading data from the memory cells MCu and MCd by arrows in the cross-section view taken along the XZ plane including the memory cells MCu and MCd.

As shown in FIG. 26, when data is read from the memory cell MCu, a read current flows from the bit line BL to the word line WLu, that is, from the reference layer RL to the storage layer SL in the magnetoresistive effect element MTJu. Therefore, the flowing direction of the read current into the memory cell MCu constitutes the writing direction of the data "1" at the write operation.

Similarly, when data is read from the memory cell MCd, a read current flows from the word line WLd to the bit line BL, that is, from the reference layer RL to the storage layer SL in the magnetoresistive effect element MTJd. Therefore, the flowing direction of the read current into the memory cell MCd constitutes the writing direction of the data "1" at the write operation.

4.3 Advantageous Effects of Present Embodiment

According to the fourth embodiment, as in the second embodiment, the magnetoresistive effect elements MTJu and MTJd are the same in the layering order of the storage layer SL and the reference layer RL. Accordingly, the flowing direction of the current for writing the data "1" into the memory cell MCd constitutes the flowing direction from the word line WLd to the bit line BL, whereas the flowing direction of the current for writing the data "1" into the memory cell MCu constitutes the flowing direction from the bit line BL side to the word line WLu. In the case of reading data from the memory cell MCd, the sense amplifier SA reads data based on the current flowing from the word line WL to the global bit line GBL via the memory cell MCd. In the case of reading data from the memory cell MCu, the sense amplifier SA reads data based on the current flowing from the global bit line GBL to the word line WLu via the memory cell MCu. Accordingly, in the case of reading data from either of the memory cells MCu and MCd, the flowing direction of the read current constitutes the flowing direction of the current for writing the data "1". Therefore, as in the first embodiment, it is possible to flow a larger read current than that in the case where the flowing direction of the read current constitutes the flowing direction of the current for writing the data "0", thereby shortening the reading time.

The sense amplifier SA and the constant current source I are connected to both the word line WLd and the global bit line GBL via the node NO. The word line Wu is fed with a constant voltage by the voltage VSS. Accordingly, the sense amplifier SA can sense the current flowing from the constant current source I to the word line WLu or WLd. Therefore, the sense amplifier SA can read data from both the memory cells MCu and MCd based on the current of a constant value. This makes it possible to suppress the occurrence of read disturbance and read error at the time of reading.

As described above, the sense amplifier SA is shared between the memory cells MCu and MCd in the same memory cell array 10. Accordingly, it is possible to suppress increase in the circuit area to the same degree as that in the first embodiment without sharing the sense amplifier SA between the different memory cell arrays 10a and 10b unlike the first embodiment.

5. Fifth Embodiment

Next, a magnetic storage device according to a fifth embodiment will be described. In the first to fourth embodiments, one bit line BL is shared between the memory cells MCu and MCd. The fifth embodiment is different from the first to fourth embodiments in that bit lines BLu and BLd are respectively assigned to memory cells MCu and MCd.

Hereinafter, the differences from the second embodiment will be mainly described.

5.1 Configuration of Memory Cell

Figure 27:
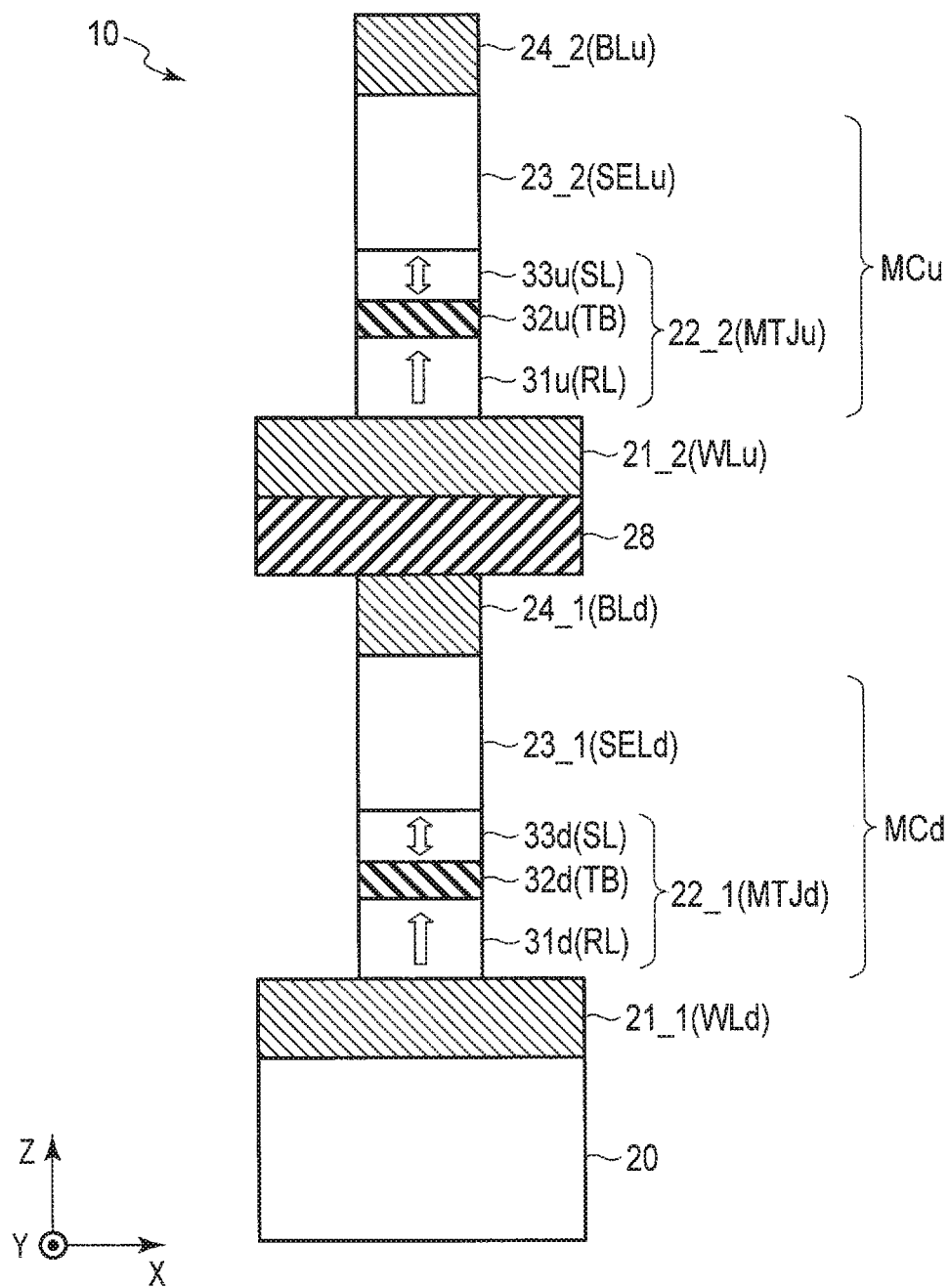
FIG. 27 is a cross-sectional view for explaining a memory cell in a magnetic storage device according to a fifth embodiment.

A configuration of the memory cells in the magnetic storage device according to the fifth embodiment will be described with reference to FIG. 27. FIG. 27 shows an example of a cross section structure of part of a memory cell array in the magnetic storage device according to the fifth embodiment. FIG. 27 shows a portion corresponding to one pair of the memory cells MCu and MCd.

As shown in FIG. 27, on a semiconductor substrate 20, a conductor 21_1 functioning as word line WLd is provided, for example. The conductor 21_1 extends along the X direction, for example. On the conductor 21_1, an element 22_1 functioning as a magnetoresistive effect element MTJd is provided. On the element 22_1, an element 23_1 functioning as a selector SELd is provided. On the element 231, a conductor 24_1 functioning as a bit line BLd is provided. The conductor 24_1 extends along the Y direction, for example. On the conductor 24_1, an insulator 28 is provided. The insulator 28 electrically disconnects between the memory cells MCu and MCd.

On the insulator 28, a conductor 212 functioning as the word line WLu is provided. The conductor 21_2 extends along the X direction, for example. On the conductor 21_2, an element 22_2 functioning as a magnetoresistive effect element MTJu is provided. On the element 22_2, an element 23_2 functioning as a selector SELu is provided. On the element 232, a conductor 24_2 functioning as a bit line BLu is provided. The conductor 24_2 extends along the Y direction, for example.

In the thus configured memory cell array 10, the one memory cell MCd is provided between the one bit line BLd and the one word line WLd, and the one memory cell MCu is provided between the one bit line BLu and the one word line WLu. These memory cells MCd and MCu are layered in the Z direction to form a layered cross-point structure.

Figure 28:
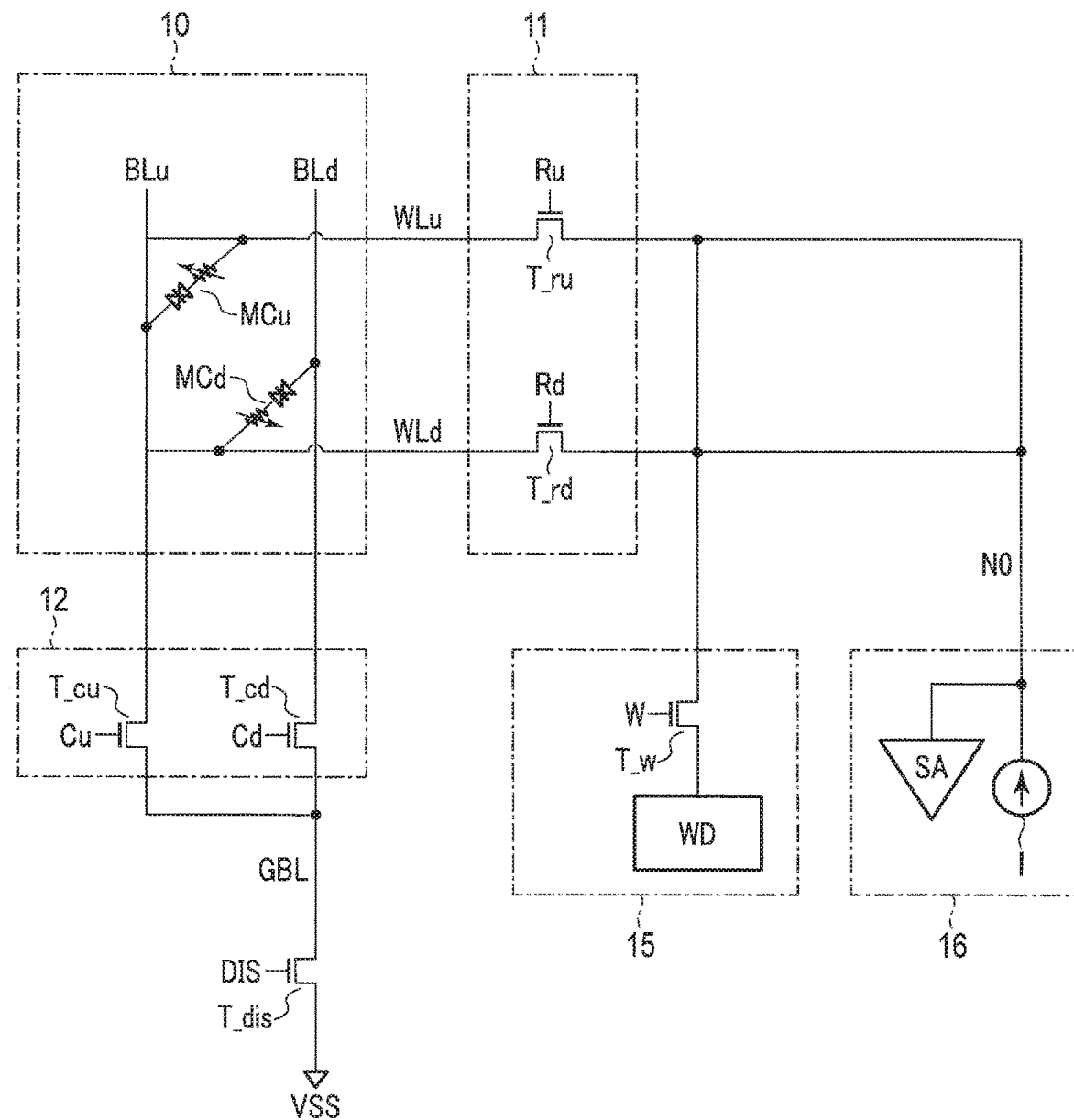
FIG. 28 is a circuit diagram for explaining connection of a memory cell array in row and column directions in the magnetic storage device according to the fifth embodiment.

5.2 Configuration of Circuits Connected in Row Direction and Column Direction to Memory Cell Array A configuration of circuits connected in the row direction and the column direction to a memory cell array 10 according to the fifth embodiment will be described with reference to FIG. 28. FIG. 28 corresponds to FIG. 18 described above in relation to the second embodiment, which shows an example of configuration of circuits in the row direction and the column direction in the memory cell array 10.

As shown in FIG. 28, the word lines WLu and WLd respectively connect between a first end of the memory cell MCu and a first end of the memory cell MCd, and a row selection circuit 11. The row selection circuit 11 includes row selection transistors T_ru and T_rd. The row selection transistor T_ru includes a first end connected to the word line WLu, a second end connected to a node NO, and a gate to which a signal Ru is supplied. The row selection transistor T_rd includes a first end connected to the word line WLd, a second end connected to the node NO, and a gate to which a signal Rd is supplied.

The write circuit 15 includes a transistor T_w and a write driver WD. The transistor T_w includes a first end connected to the node NO, a second end connected to the write driver WD, and a gate to which a signal W is supplied. The write driver WD has a function of supplying a write current to the memory cell MC in the memory cell array 10.

The read circuit 16 includes a sense amplifier SA and a constant current source I. The sense amplifier SA and the constant current source I are respectively equivalent in configuration to the sense amplifier SAd and the constant current source Id described above with reference to FIG. 8, for example. The sense amplifier SA and the constant current source I are connected to the node NO. The sense amplifier SA has a function of reading data from both the memory cells MCu and MCd in the memory cell array 10. The constant current source I has a function of keeping the current flowing from the node NO to the memory cell array 10 at a constant value.

The bit lines BLu and BLd respectively connect between a second end of the memory cell MCu and a second end of the memory cell MCd, and the column selection circuit 12. The column selection circuit 12 includes column selection transistors T_cu and T_cd. The column selection transistor T_cu includes a first end connected to the bit line BLu, a second end connected to a global bit line GBL, and a gate to which a signal Cu is supplied. The column selection transistor T_cd includes a first end connected to the bit line BLd, a second end connected to the global bit line GBL, and a gate to which a signal Cd is supplied.

The global bit line GBL is further connected to a first end of a transistor T_dis. The transistor T_dis includes a second end to which a voltage VSS is supplied and a gate to which a signal DIS is supplied. The global bit line GBL may be shared with other memory cell arrays 10 not shown.

5.3 Current Paths at Read Operation

Next, current paths at the read operation in the magnetic storage device according to the fifth embodiment will be described with reference to FIGS. 29 and 30.

Figure 29:
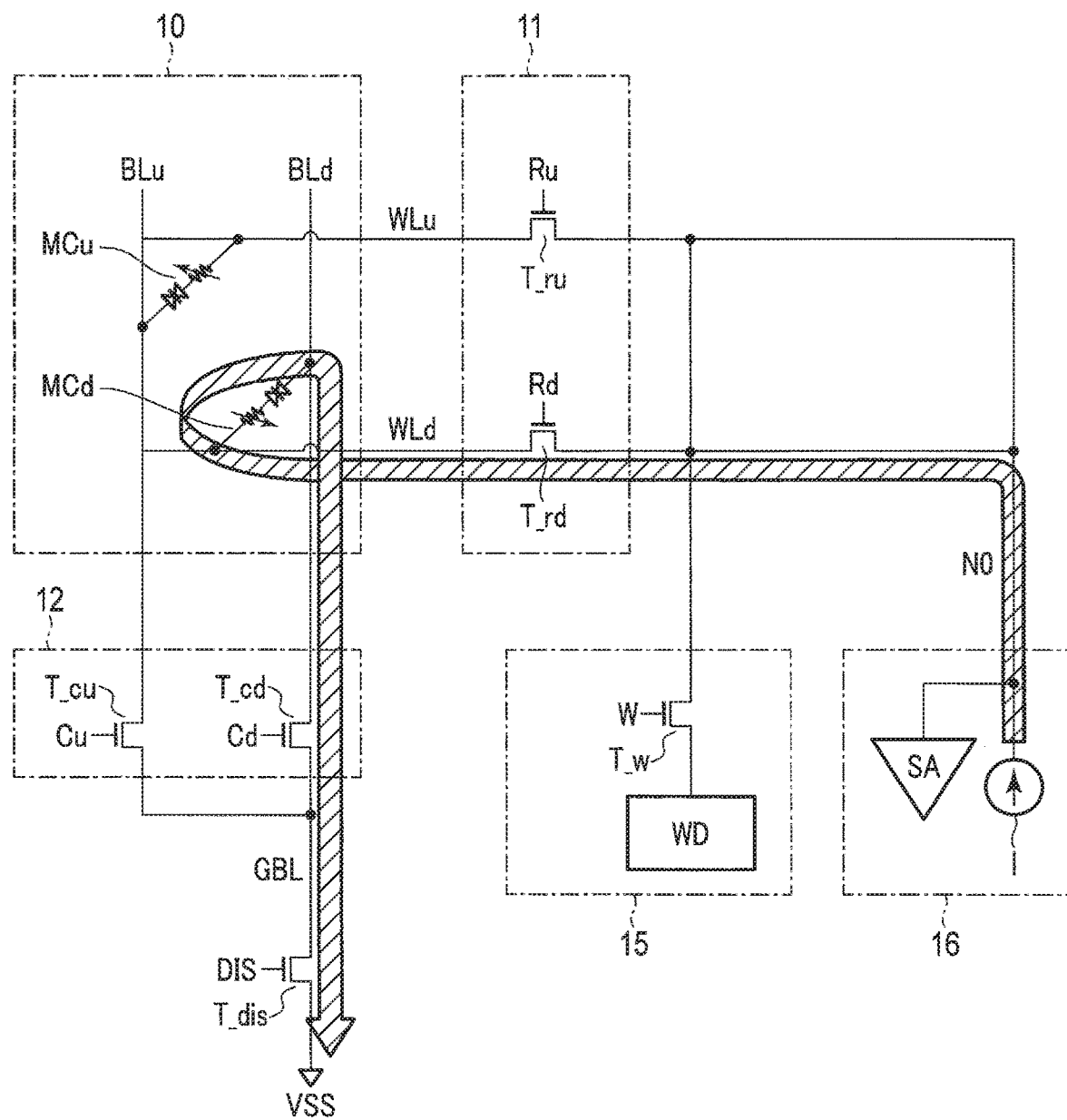
FIG. 29 is a schematic view for explaining a current path at a read operation in the magnetic storage device according to the fifth embodiment.
Figure 30:
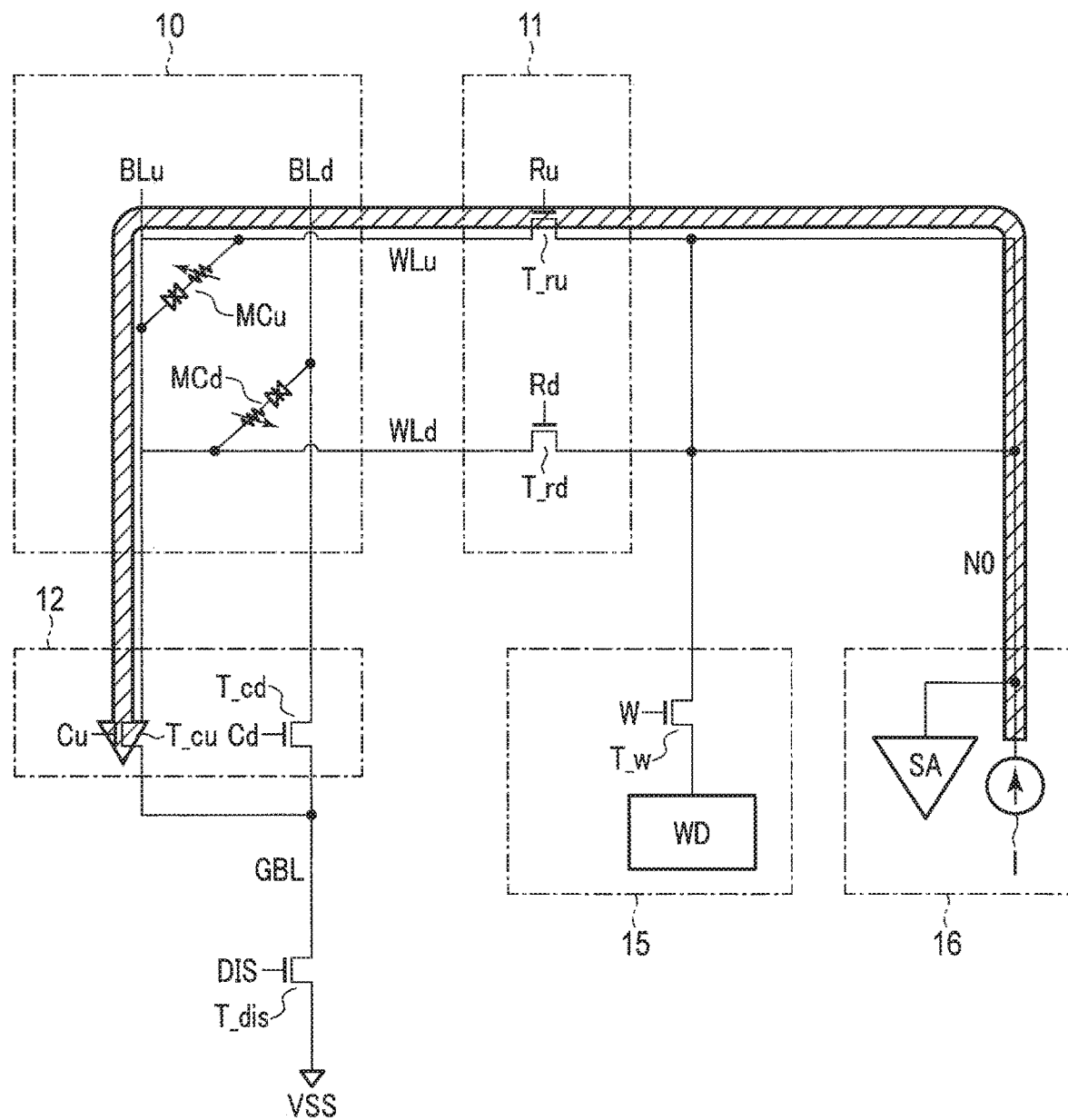
FIG. 30 is a schematic view for explaining a current path at a read operation in the magnetic storage device according to the fifth embodiment.

FIGS. 29 and 30 are schematic views showing current paths at the read operation in the magnetic storage device according to the fifth embodiment. FIG. 29 schematically shows a current path by an arrow at the time of reading data from the memory cell MCd using the sense amplifier SA. FIG. 30 schematically shows a current path by an arrow at the time of reading data from the memory cell MCu using the sense amplifier SA.

First, the current path at the time of reading data from the memory cell MCd will be described with reference to FIG. 29.

As shown in FIG. 29, the row selection circuit 11 selects the word line WLd. Specifically, the row selection circuit 11 inputs respectively "L" level and "H" level to the signals Ru and Rd to turn off the row selection transistor T_ru and turn on the row selection transistor T_rd.

Accordingly, the word line WLd is charged with a current of a constant magnitude flowing from the constant current source I.

The column selection circuit 12 selects the bit line BLd. Specifically, the column selection circuit 12 inputs "L" level and "H" level to the signals Cu and Cd to turn off the column selection transistor T_cu and turn on the column selection transistor T_cd. The column selection circuit 12 supplies "H" level to the signal DIS to turn on the transistor T_dis.

Thus, the global bit line GBL and the bit line BLd are charged with the voltage VSS.

Accordingly, a read current flows into the memory cell MCd from the word line WLd to the global bit line GBL via the bit line BLd. The sense amplifier SA can read data from the selected memory cell MCd based on the current of a constant magnitude flowing from the constant current source I.

Next, the current path at the time of reading data from the memory cell MCu using the sense amplifier SA will be described with reference to FIG. 30.

As shown in FIG. 30, the row selection circuit 11 selects the word line WLu. Specifically, the row selection circuit 11 inputs "H" level and "L" level to the signals Ru and Rd to turn on the row selection transistor T_ru and turn off the row selection transistor T_rd.

Accordingly, the word line WLu is charged with a current of a constant magnitude flowing from the constant current source I.

The column selection circuit 12 selects the bit line BLu. Specifically, the column selection circuit 12 inputs "H" level and "L" level to the signals Cu and Cd to turn on the column selection transistor T_cu and turn off the column selection transistor T_cd. The column selection circuit 12 supplies "H" level to the signal DIS to turn on the transistor T_dis.

Thus, the global bit line GBL and the bit line BLu are charged with the voltage VSS.

Accordingly, a read current flows into the memory cell MCu from the word line WLu to the global bit line GBL via the bit line BLu. The sense amplifier SA can read data from the selected memory cell MCu based on the current of a constant magnitude flowing from the constant current source I.

Next, current paths in memory cells at the read operation in the magnetic storage device according to the fifth embodiment will be described with reference to FIG. 31.

FIG. 31 is a schematic view showing an outline of current paths in memory cells at the read operation in the magnetic storage device according to the fifth embodiment. FIG. 31 schematically shows current paths at the time of reading data from the memory cells MCu and MCd by arrows in the cross-section view taken along the XZ plane including the memory cells MCu and MCd.

As shown in FIG. 31, when data is read from the memory cell MCu, a read current flows from the word line WLu to the bit line BLu, that is, from the reference layer RL to the storage layer SL in the magnetoresistive effect element MTJu. Therefore, the flowing direction of the read current into the memory cell MCu constitutes the writing direction of the data "1" at the write operation.

Similarly, when data is read from the memory cell MCd, a read current flows from the word line WLd to the bit line BLd, that is, from the reference layer RL to the storage layer SL in the magnetoresistive effect element MTJd. Therefore, the flowing direction of the read current into the memory cell MCd constitutes the writing direction of the data "1" at the write operation.

5.4 Advantageous Effects of Present Embodiment

According to the fifth embodiment, as in the second embodiment, the magnetoresistive effect elements MTJu and MTJd are the same in the layering order of the storage layer SL and the reference layer RL. In addition, a pair of the word line WLu and the bit line BLu corresponding to the memory cell MCu is provided and a pair of the word line WLd and the bit line BLd corresponding to the memory cell MCd is provided. Accordingly, the flowing direction of the current for writing the data "1" constitutes the direction from the word line WL to the bit line BL in both the memory cells MCu and MCd. In either case of reading data from the memory cell MCu or MCd, the sense amplifier SA reads data based on the current flowing from the word line WL to the global bit line GBL via the memory cell MC. Accordingly, in the case of reading data from either of the memory cells MCu and MCd, the flowing direction of the read current constitutes the flowing direction of the current for writing the data "1". Therefore, as in the first embodiment, it is possible to flow a larger read current than that in the case where the flowing direction of the read current constitutes the flowing direction of the current for writing the data "0", thereby shortening the reading time.

The sense amplifier SA and the constant current source I are connected to both the word lines WLu and WLd via the node NO. The global bit line GBL is fed with a constant voltage by the voltage VSS. Accordingly, the sense amplifier SA can sense the current flowing from the constant current source I to the word line WLu or WLd. Therefore, the sense amplifier SA can read data from both the memory cells MCu and MCd based on the current of a constant value. This makes it possible to suppress the occurrence of read disturbance and read error at the time of reading as in the second embodiment.

As described above, the sense amplifier SA is shared between the memory cells MCu and MCd in the same memory cell array 10. Accordingly, it is possible to suppress increase in the circuit area to the same degree as that in the first embodiment without sharing the sense amplifier SA between the different memory cell arrays 10a and 10b unlike the first embodiment.

In addition, it is not necessary to charge the global bit line GBL with a constant current, which makes it possible to shorten the time for reading data as in the first embodiment.

6. Modifications

The present invention is not limited to the first to fifth embodiments described above but can be modified in various manners. In the foregoing first to fifth embodiments, the two memory cells MCd and MCu are layered in the Z direction, but the present invention is not limited to this. For example, four, eight, sixteen, etc., memory cells MC can be further layered in the Z direction.

6.1 First Modification

In a first modification, in the memory cell array described above in relation to the first embodiment, a pair of memory cells MCd and MCu is further layered in the Z direction to form the total four layered memory cells MC. Out of the four memory cells MC, two lower memory cells MCp (MCdp and MCup) share a word line WL, and two upper memory cells MCq (MCdq and MCuq) share another word line WL. In the following description, out of the four memory cells MC, the index "p" is added to the reference numerals of the two lower memory cells MC and the index "q" is added to the reference numerals of the two upper memory cells MC for differentiation of them. Hereinafter, the differences from the first embodiment will be mainly described.

6.1.1 Configuration of Memory Cell Array

First, a configuration of the memory cell array in a magnetic storage device according to the first modification will be described.

Figure 32:
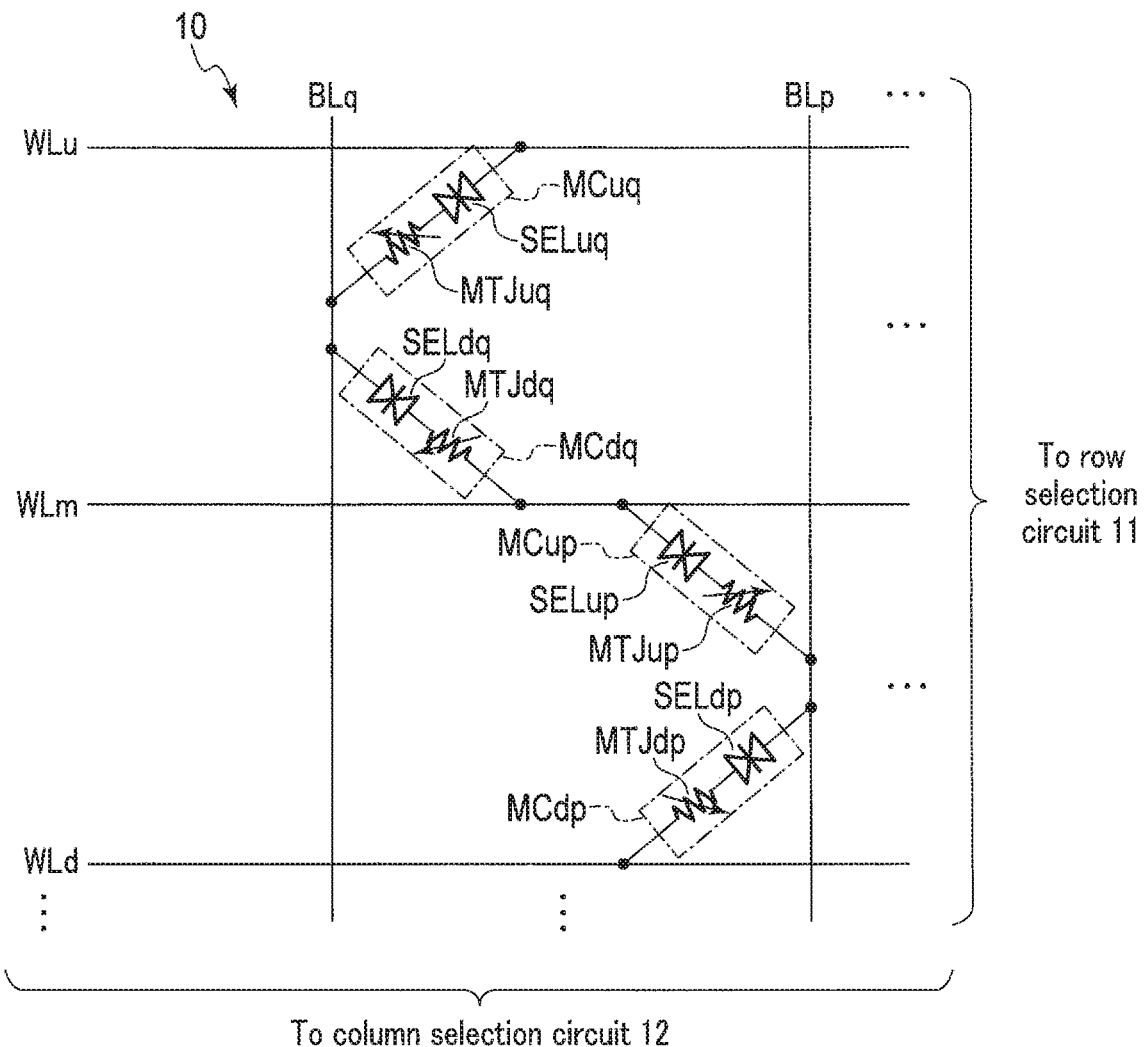
FIG. 32 is a circuit diagram for explaining a configuration of a memory cell array in a magnetic storage device according to a first modification.

FIG. 32 is a circuit diagram showing a configuration of the memory cell array in the magnetic storage device according to the first modification.

As shown in FIG. 32, each of the memory cells MC is associated with a pair of one of the bit lines BLp and BLq and one of the word lines WLu, WLm, and WLd. That is, the memory cell MCdp connects between the word line WLd and the bit line BLp, and the memory cell MCup connects between the word line WLm and the bit line BLp. The memory cell MCdq connects between the word line WLm and the bit line BLq, and the memory cell MCuq connects between the word line WLu and the bit line BLq.

The memory cell MCdp includes a selector SELdp and a magnetoresistive effect element MTJdp connected in series, and the memory cell MCup includes a selector SELup and a magnetoresistive effect element MTJup connected in series. The memory cell MCdq includes a selector SELdq and a magnetoresistive effect element MTJdq connected in series, and the memory cell MCuq includes a selector SELuq and a magnetoresistive effect element MTJuq connected in series.

Figure 33:
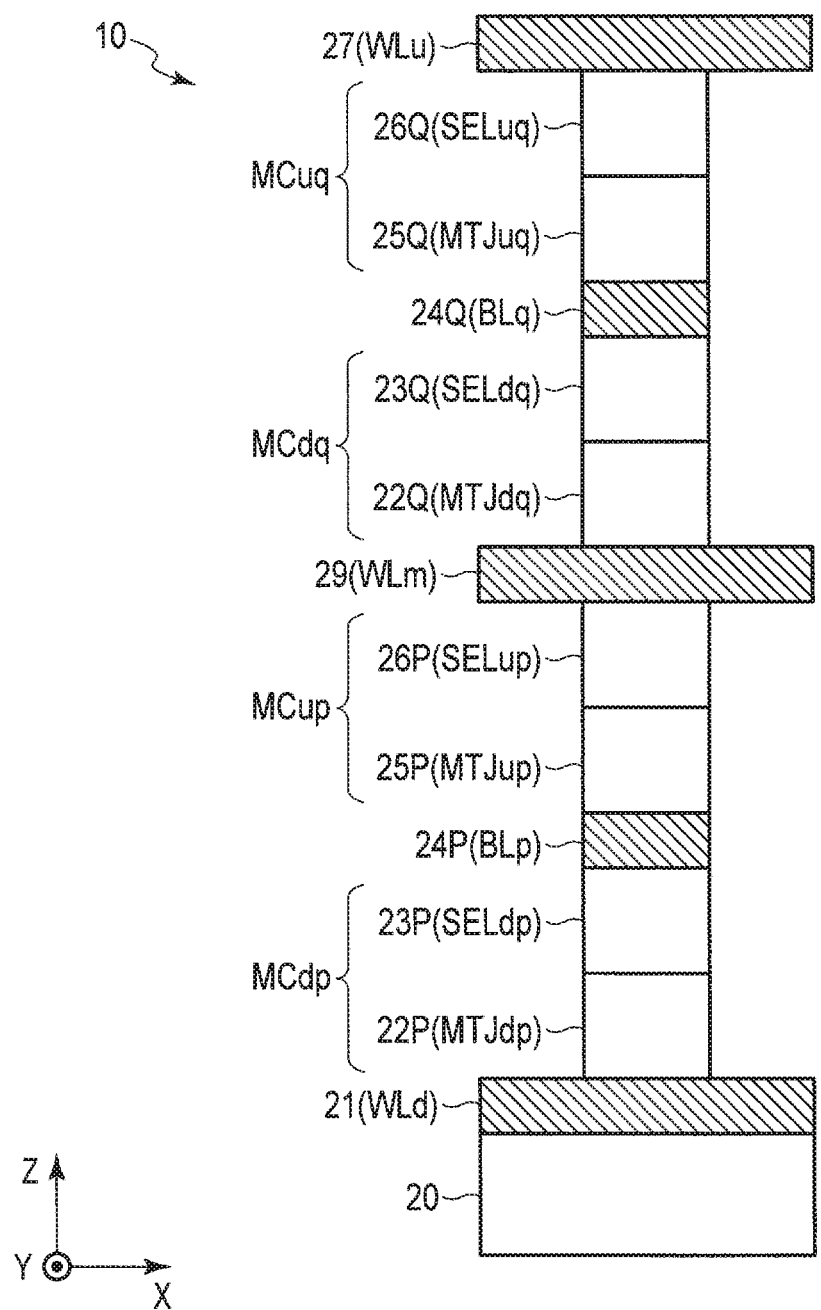
FIG. 33 is a cross-sectional view for explaining a memory cell in the magnetic storage device according to the first modification.

Next, a cross section structure of the memory cell array 10 will be described with reference to FIG. 33. FIG. 33 shows an example of a cross-section structure of part of a memory cell array in the magnetic storage device according to the first modification.

As shown in FIG. 33, on a semiconductor substrate 20, a conductor 21 functioning as a word line WLd is provided, for example. The conductor 21 extends along the X direction, for example. On the conductor 21, an element 22P functioning as a magnetoresistive effect element MTJdp is provided. On the element 22P, an element 23P functioning as a selector SELdp is provided. On the element 23P, a conductor 24P functioning as a bit line BLp is provided. The conductor 24P extends along the Y direction, for example.

On the conductor 24P, an element 25P functioning as a magnetoresistive effect element MTJup is provided. On the element 25P, an element 26P functioning as a selector SELup is provided. On the insulator 26P, a conductor 29 functioning as the word line WLm is provided. The conductor 29 extends along the X direction, for example.

On the conductor 29, an element 22Q functioning as a magnetoresistive effect element MTJdq is provided. On the element 22Q, an element 23Q functioning as a selector SELdq is provided. On the element 23Q, a conductor 24Q functioning as a bit line BLq is provided. The conductor 24Q extends along the Y direction, for example.

On the conductor 24Q, an element 25Q functioning as a magnetoresistive effect element MTJuq is provided. On the element 25Q, an element 26Q functioning as a selector SELuq is provided. On the insulator 26Q, a conductor 27 functioning as the word line WLu is provided. The conductor 27 extends along the X direction, for example.

By being configured as described above, the memory cell array 10 has a cross-point structure in which the four memory cells MCdp, MCup, MCdq, and MCuq are layered in the Z direction corresponding to the three word lines WLd, WLm, and WLu and the two bit lines BLp and BLq.

6.1.2 Configuration of Circuits Connected in Row Direction to Memory Cell Arrays Next, a configuration of circuits connected in the row direction to the memory cell arrays 10 configured as described above according to the first modification will be described with reference to FIG. 34.

As shown in FIG. 34, word lines WLad, WLam, and WLau connect between a memory cell array 10a and a row selection circuit 11a. The row selection circuit 11a includes row selection transistors T_radp, T_radq, T_raup, and T_rauq. The row selection transistor T_radp includes a first end connected to the word line WLad, a second end connected to a node Nad, and a gate to which a signal Radp is supplied. The row selection transistor T_radq includes a first end connected to the word line WLam, a second end connected to the node Nad, and a gate to which a signal Radq is supplied. The row selection transistor T_raup includes a first end connected to the word line WLam, a second end connected to a node Nau, and a gate to which a signal Raup is supplied. The row selection transistor T_rauq includes a first end connected to the word line WLau, a second end connected to the node Nau, and a gate to which a signal Rauq is supplied.

Similarly, word lines WLbd, WLbm, and WLbu connect between a memory cell array 10b and a row selection circuit 11b. The row selection circuit 11b includes row selection transistors T_rbdp, T_rbdq, T_rbup, and T_rbuq. The row selection transistor T_rbdp includes a first end connected to the word line WLbd, a second end connected to a node Nbd, and a gate to which a signal Rbdp is supplied. The row selection transistor T_rbdq includes a first end connected to the word line WLbm, a second end connected to the node Nbd, and a gate to which a signal Rbdq is supplied. The row selection transistor T_rbup includes a first end connected to the word line WLbm, a second end connected to a node Nbu, and a gate to which a signal Rbup is supplied. The row selection transistor T_rbuq includes a first end connected to the word line WLbu, a second end connected to the node Nbu, and a gate to which a signal Rbuq is supplied.

In a layer selection circuit 13, a first end of a layer selection transistor T_al1 is connected to the node Nau, and a first end of a layer selection transistor T_al2 is connected to the node Nad. In addition, a first end of a layer selection transistor T_bl1 is connected to the node Nbd, and a first end of a layer selection transistor T_bl2 is connected to the node Nbu.

The write circuit 15ad includes a transistor T_wad and a write driver WDad. The transistor T_wad includes a first end connected to the node Nad, a second end connected to the write driver WDad, and a gate to which a signal Wad is supplied. The write driver WDad has a function of supplying a write current to the memory cells MCadp and MCadq in the memory cell array 10a, for example.

The write circuit 15au includes a transistor T_wau and a write driver WDau. The transistor T_wau includes a first end connected to the node Nau, a second end connected to the write driver WDau, and a gate to which a signal Wau is supplied. The write driver WDau has a function of supplying a write current to the memory cells MCaup and MCauq in the memory cell array 10a, for example.

Similarly, the write circuit 15bd includes a transistor T_wbd and a write driver WDbd. The transistor T_wbd includes a first end connected to the node Nbd, a second end connected to the write driver WDbd, and a gate to which a signal Wbd is supplied. The write driver WDbd has a function of supplying a write current to the memory cells MCbdp and MCbdq in the memory cell array 10b, for example.

The write circuit 15bu includes a transistor T_wbu and a write driver WDbu. The transistor T_wbu includes a first end connected to the node Nbu, a second end connected to the write driver WDbu, and a gate to which a signal Wbu is supplied. The write driver WDbu has a function of supplying a write current to the memory cells MCbup and MCbuq in the memory cell array 10b, for example.

The read circuit 16 is configured in the same manner as that in the first embodiment described above with reference to FIG. 6 and thus descriptions thereof will be omitted.

6.1.3 Configuration of Circuits Connected in Column Direction to Memory Cell Arrays Next, a configuration of circuits connected in the column direction to the memory cell arrays 10 configured as described above according to the first modification will be described with reference to FIG. 35. FIG. 35 shows an example of a configuration of circuits connected in the row direction in each of the memory cell arrays 10a and 10b.

As shown in FIG. 35, a plurality of bit lines BLap (BLap<0>, . . . , and BLap<N>) and BLaq (BLaq<0>, . . . , and BLaq<N>) connect between the memory cell array 10a and a column selection circuit 12a. The column selection circuit 12a includes a plurality of column selection transistors T_cap (T_cap<0>, . . . , and T_cap<N>) and T_caq (T_caq<0>, . . . , and T_caq<N>). The plurality of column selection transistors T_cap<0>, T_cap<N>, T_caq<0>, . . . , and T_caq<N> includes first ends respectively connected to the bit line BLap<0>, . . . , BLap<N>, BLaq<0>, and BLaq<N>, second ends connected in common to a global bit line GBLa, and gates to which signals Cp (Cp<0>, . . . , and Cp<N>) and Cq (Cq<0>, . . . , and Cq<N>) are supplied respectively.

Similarly, the plurality of bit lines BLbp (BLbp<0>, . . . , and BLbp<N>) and BLbq (BLbq<0>, . . . , and BLbq<N>) connects between the memory cell array 10b and the column selection circuit 12b. The column selection circuit 12b includes a plurality of column selection transistors T_cbp (T_cbp<0>, . . . , and T_cbp<N>) and T_caq (T_cbq<0>, . . . , and T_cbq<N>). The plurality of column selection transistors T_cbp<0>, T_cbp<N>, T_cbq<0>, . . . , and T_cbq<N> includes first ends respectively connected to the bit line BLbp<0>, . . . , BLbp<N>, BLbq<0>, . . . , and BLbq<N>, second ends connected in common to a global bit line GBLb, and gates to which signals Cp (Cp<0>, . . . , and Cp<N>) and Cq (Cq<0>, and Cq<N>) are supplied respectively.

The connection relationship between the global bit lines GBLa and GBLb and constant voltage sources Va and Vb are the same as that in the first embodiment described above with reference to FIG. 7, and thus descriptions thereof will be omitted.

6.1.4 Current Paths at Read Operation

Next, current paths at the read operation in the magnetic storage device according to the first modification will be described with reference to FIGS. 36 to 39.

Figure 37:
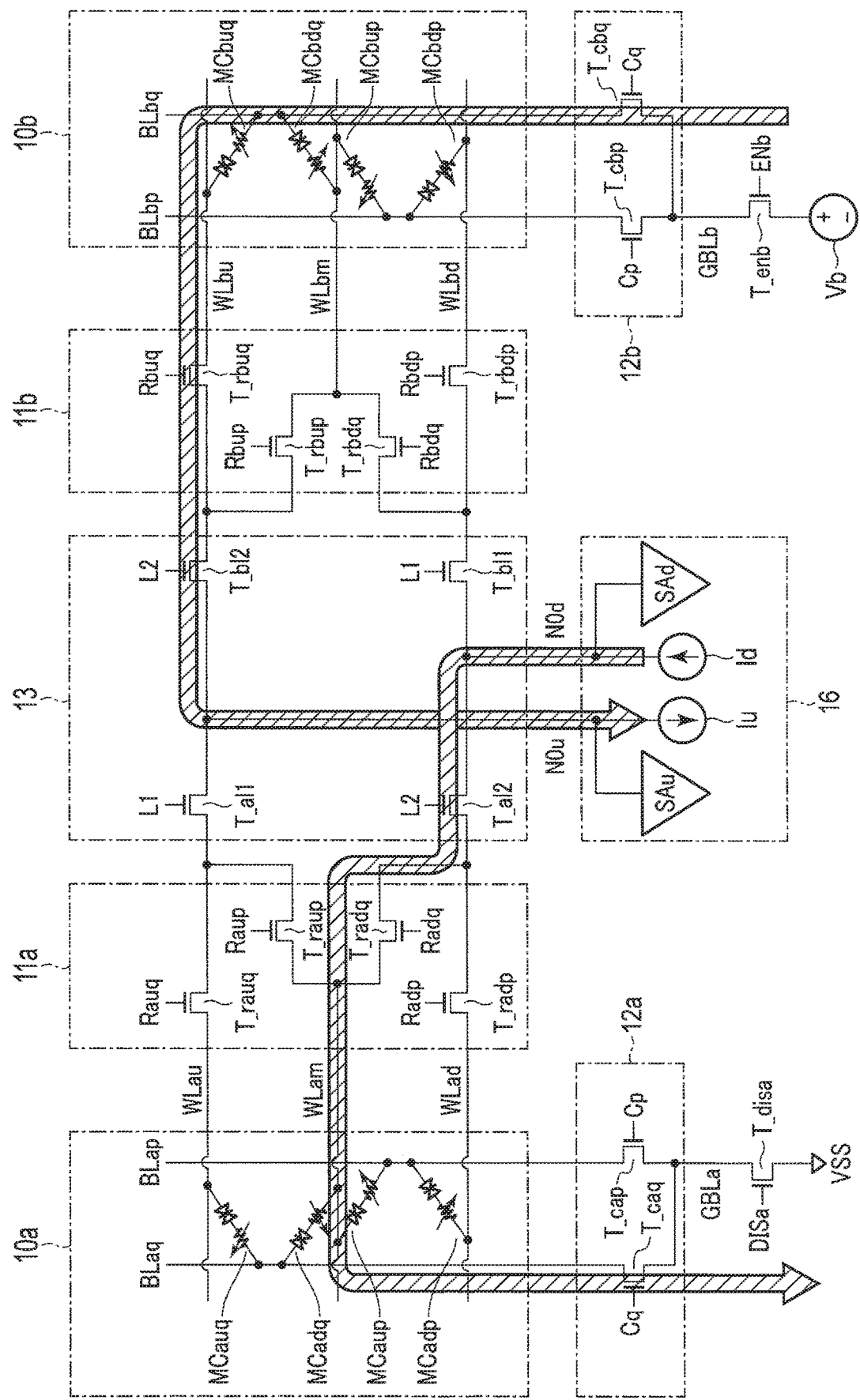
FIG. 37 is a schematic view for explaining current paths at a read operation in the magnetic storage device according to the first modification.
Figure 38:
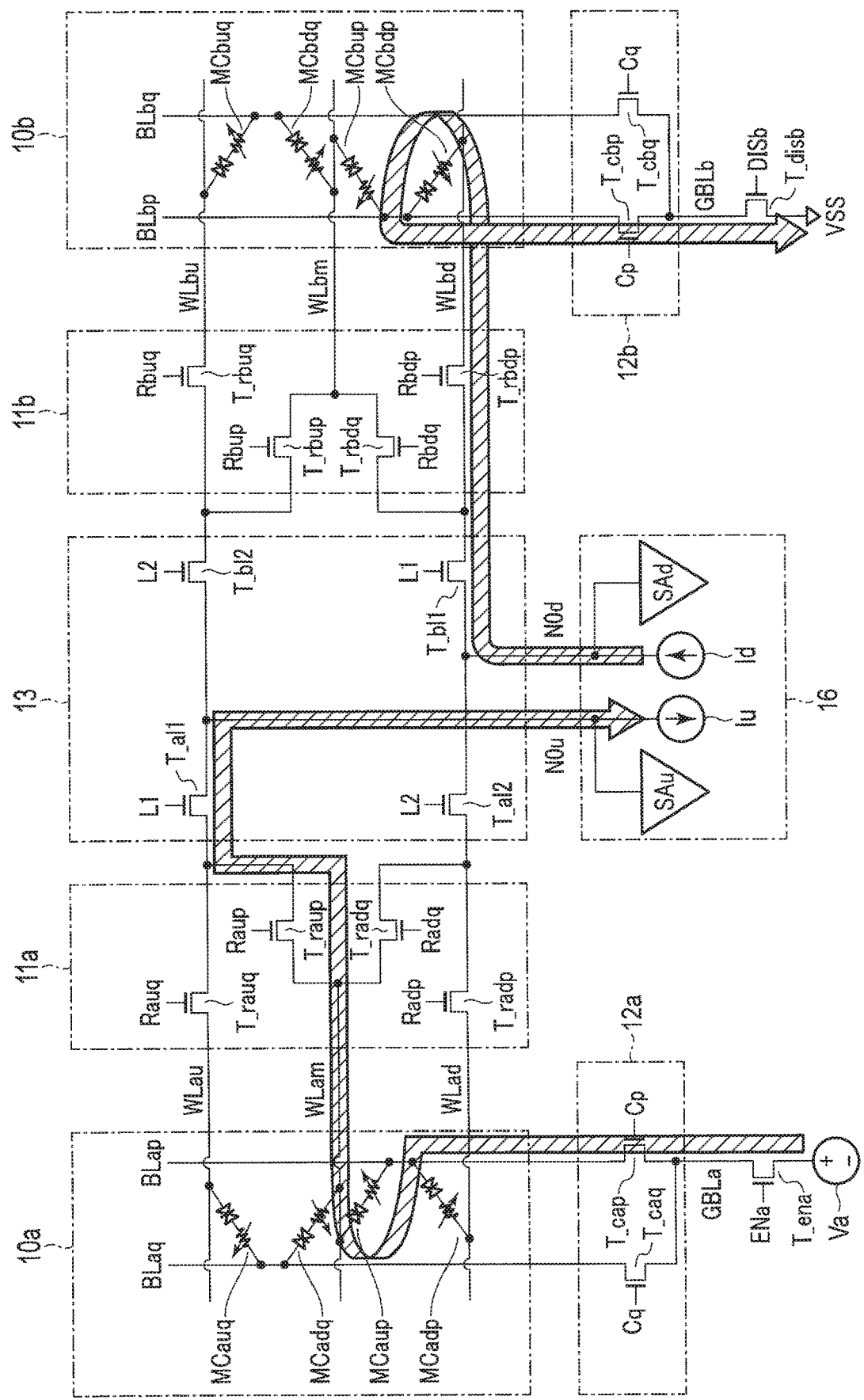
FIG. 38 is a schematic view for explaining current paths at a read operation in the magnetic storage device according to the first modification.

FIGS. 36 to 39 are schematic views showing an outline of current paths at the read operation in the magnetic storage device according to the first modification. FIGS. 36 and 37 schematically show current paths by arrows when a sense amplifier SAu is used to read data from the memory cell array 10b and a sense amplifier SAd is used to read data from the memory cell array 10a. More specifically, FIG. 36 shows the case where data is read from the memory cells MCbup and MCadp, and FIG. 37 shows the case where data is read from the memory cells MCbuq and MCadq. FIGS. 38 and 39 schematically show current paths by arrows when the sense amplifier SAu is used to read data from the memory cell array 10a and the sense amplifier SAd is used to read data from the memory cell array 10b. More specifically, FIG. 38 shows the case where data is read from the memory cells MCbdp and MCaup, and FIG. 39 shows the case where data is read from the memory cells MCbdq and MCauq.

First, the current paths at the time of reading data from the memory cells MCbup and MCadp will be described with reference to FIG. 36.

As shown in FIG. 36, the layer selection circuit 13 inputs "L" level to the signal L1, for example, to turn off the layer selection transistors T_al1 and T_bl1. The layer selection circuit 13 also inputs "H" level into the signal L2, for example, to turn on the layer selection transistors T_al2 and T_bl2.

The row selection circuits 11a and 11b select respectively the word lines WLad and WLbm. Specifically, the row selection circuit 11a inputs "H" level to the signal Radp to turn on the row selection transistor T_radp and inputs "L" level to other signals Rauq, R_aup, and R_adq to turn off the row selection transistors T_rauq, T_raup, and T_radq. The row selection circuit 11b inputs "H" level to the signal Rbup to turn on the row selection transistor T_roup, and inputs "L" level to other signals Rbuq, R_bdq, and R_bdp to turn off the row selection transistors T_rbuq, T_rbdq, and T_radp.

Accordingly, the word line WLad is charged with current of a constant magnitude flowing from the constant current source Id, and the word line WLbm is charged with current of a constant magnitude flowing into the constant current source Iu.

In addition, the column selection circuits 12a and 12b select the bit lines BLap and BLbp at the same time. That is, the column selection circuits 12a and 12b turn on the row selection transistors T_cap and T_cbp by the signal Cp at "H" level based on the same column address. The global bit line GBLa is connected to the voltage VSS via the transistor T_disa, and the global bit line GBLb is connected to the constant voltage source Vb via the transistor T_enb.

Thus, the global bit line GBLa and the bit line BLap are charged with the voltage VSS, and the global bit line GBLb and the bit line BLbp are charged with the constant voltage source Vb.

Accordingly, a read current flows into the memory cell MCadp from the word line WLad to the global bit line GBLa. The sense amplifier SAd can read data from the selected memory cell MCadp based on the current of constant magnitude flowing from the constant current source Id.

Similarly, the read current flows into the memory cell MCbup from the global bit line GBLb to the word line WLbm. The sense amplifier SAu can read data from the selected memory cell MCbup based on the current of constant magnitude flowing into the constant current source Iu.

Accordingly, the action of reading data from the memory cells MCadp and MCbup is finished.

Next, the current paths at the time of reading data from the memory cells MCbuq and MCadq will be described with reference to FIG. 37.

As shown in FIG. 37, the operation of the layer selection circuit 13 is the same as that shown in FIG. 36 and thus descriptions thereof will be omitted.

The row selection circuits 11a and 11b select respectively the word lines WLam and WLbu. Specifically, the row selection circuit 11a inputs "H" level to the signal Radq to turn on the row selection transistor T_radq and inputs "L" level to other signals Rauq, R_aup, and R_adp to turn off the row selection transistors T_rauq, T_raup, and T_radp. The row selection circuit 11b inputs "H" level to the signal Rbuq to turn on the row selection transistor T_rbuq, and inputs "L" level to other signals R_bdq, R_bup, and R_bdp to turn off the row selection transistors T_rbdq, T_rbup, and T_rbdp.

Accordingly, the word line WLam is charged with current of a constant magnitude flowing from the constant current source Id, and the word line WLbu is charged with current of a constant magnitude flowing into the constant current source Iu.

In addition, the column selection circuits 12a and 12b select the bit lines BLaq and BLbq at the same time. That is, the column selection circuits 12a and 12b turn on the row selection transistors T_caq and T_cbq by the signal Cq at "H" level based on the same column address. The global bit line GBLa is connected to the voltage VSS via the transistor T_disa, and the global bit line GBLb is connected to the constant voltage source Vb via the transistor T_enb.

Thus, the global bit line GBLa and the bit line BLaq are charged with the voltage VSS, and the global bit line GBLb and the bit line BLbq are charged with the constant voltage source Vb.

Accordingly, a read current flows into the memory cell MCadq from the word line WLam to the global bit line GBLa. The sense amplifier SAd can read data from the selected memory cell MCadq based on the current of constant magnitude flowing from the constant current source Id.

Similarly, a read current flows in the memory cell MCbuq from the global bit line GBLb to the word line WLbu. The sense amplifier SAu can read data from the selected memory cell MCbuq based on the current of constant magnitude flowing into the constant current source Iu.

Accordingly, the operation of reading data from the memory cells MCbuq and MCadq is terminated.

Next, the current paths at the time of reading data from the memory cells MCbdp and MCaup will be described with reference to FIG. 38.

As shown in FIG. 38, the layer selection circuit 13 inputs "H" level to the signal L1, for example, to turn on the layer selection transistors T_al1 and T_bl1. The layer selection circuit 13 also inputs "L" level to the signal L2, for example, to turn off the layer selection transistors T_al2 and T_bl2.

The row selection circuits 11a and 11b select respectively the word lines WLam and WLbd. Specifically, the row selection circuit 11a inputs "H" level to the signal Raup to turn on the row selection transistor T_raup and inputs "L" level to other signals Rauq, R_adq, and R_adp to turn off the row selection transistors T_rauq, T_radq, and T_radp. The row selection circuit 11b inputs "H" level to the signal Rbdp to turn on the row selection transistor T_rbdp, and inputs "L" level to other signals Rbuq, R_bup, and R_bdq to turn off the row selection transistors T_rbuq, T_rbup, and T_rbdq.

Accordingly, the word line WLam is charged with current of a constant magnitude flowing into the constant current source Iu, and the word line WLbd is charged with current of a constant magnitude flowing from the constant current source Id.

In addition, the column selection circuits 12a and 12b select the bit lines BLap and BLbp at the same time. That is, the column selection circuits 12a and 12b turn on the row selection transistors T_cap and T_cbp by the signal Cp at "H" level based on the same column address. The global bit line GBLa is connected to the constant voltage source Va via the transistor T_ena, and the global bit line GBLb is connected to the voltage VSS via the transistor T_disb.

Thus, the global bit line GBLa and the bit line BLap are charged with the constant voltage source Va, and the global bit line GBLb and the bit line BLbp are charged with the voltage VSS.

Accordingly, a read current flows into the memory cell MCaup from the global bit line GBLa to the word line WLam. The sense amplifier SAu can read data from the selected memory cell MCaup based on the current of constant magnitude flowing into the constant current source Iu.

Similarly, a read current flows into the memory cell MCbdp from the word line WLbd to the global bit line GBLb. The sense amplifier SAd can read data from the selected memory cell MCbdp based on the current of constant magnitude flowing from the constant current source Id.

Accordingly, the operation of reading data from the memory cells MCbdp and MCaup is finished.

Next, the current paths at the time of reading data from the memory cells MCbdq and MCauq will be described with reference to FIG. 39.

As shown in FIG. 39, the operation of the layer selection circuit 13 is the same as that shown in FIG. 38 and thus descriptions thereof will be omitted.

The row selection circuits 11a and 11b select respectively the word lines WLau and WLbm. Specifically, the row selection circuit 11a inputs "H" level to the signal Rauq to turn on the row selection transistor T_rauq and inputs "L" level to other signals Raup, R_adq, and R_adp to turn off the row selection transistors T_raup, T_radq, and T_radp. The row selection circuit 11b inputs "H" level to the signal Rbdq to turn on the row selection transistor T_rbdq, and inputs "L" level to other signals Rbuq, R_bup, and R_bdp to turn off the row selection transistors T_rbuq, T_rbup, and T_rbdp.

Accordingly, the word line WLau is charged with current of a constant magnitude flowing into the constant current source Iu, and the word line WLbm is charged with current of a constant magnitude flowing from the constant current source Id.

In addition, the column selection circuits 12a and 12b select the bit lines BLaq and BLbq at the same time. That is, the column selection circuits 12a and 12b turn on the row selection transistors T_caq and T_cbq by the signal Cq at "H" level based on the same column address. The global bit line GBLa is connected to the constant voltage source Va via the transistor T_ena, and the global bit line GBLb is connected to the voltage VSS via the transistor T_disb.

Thus, the global bit line GBLa and the bit line BLaq are charged with the constant voltage source Va, and the global bit line GBLb and the bit line BLbq are charged with the voltage VSS.

Accordingly, a read current flows into the memory cell MCauq from the global bit line GBLa to the word line WLau. The sense amplifier SAu can read data from the selected memory cell MCauq based on the current of constant magnitude flowing into the constant current source Iu.

Similarly, a read current flows into the memory cell MCbdq from the word line WLbm to the global bit line GBLb. The sense amplifier SAd can read data from the selected memory cell MCbdq based on the current of constant magnitude flowing from the constant current source Id.

Accordingly, the operation of reading data from the memory cells MCbdq and MCauq is finished.

Next, current paths in memory cells at the read operation in the magnetic storage device according to the first modification will be described with reference to FIG. 40.

FIG. 40 is a schematic view showing an outline of current paths in memory cells at the read operation in the magnetic storage device according to the first modification. FIG. 40 schematically shows current paths at the time of reading data from the memory cells MCdp, MCup, MCdq, and MCuq by arrows in the cross-section view taken along the XZ plane including the memory cells MCdp, MCup, MCdq, and MCuq.

As shown in FIG. 40, when data is read from the memory cell MCdp, a read current flows from the word line WLd to the bit line BLp, that is, from the reference layer RL to the storage layer SL in the magnetoresistive effect element MTJdp. Therefore, the flowing direction of the read current into the memory cell MCdp constitutes the writing direction of the data "1" at the write operation.

In addition, when data is read from the memory cell MCup, a read current flows from the bit line BLp to the word line WLm, that is, from the reference layer RL to the storage layer SL in the magnetoresistive effect element MTJup. Therefore, the flowing direction of the read current into the memory cell MCup constitutes the writing direction of the data "1" at the write operation.

Similarly, when data is read from the memory cell MCdq, a read current flows from the word line WLm to the bit line BLq, that is, from the reference layer RL to the storage layer SL in the magnetoresistive effect element MTJdq. Therefore, the flowing direction of the read current into the memory cell MCdq constitutes the writing direction of the data "1" at the write operation.

In addition, when data is read from the memory cell MCuq, a read current flows from the bit line BLq to the word line WLu, that is, from the reference layer RL to the storage layer SL in the magnetoresistive effect element MTJuq. Therefore, the flowing direction of the read current into the memory cell MCuq constitutes the writing direction of the data "1" at the write operation.

6.1.5 Further Modification of First Modification

In the first modification described above, data is read from the memory cells with the same index "p" (a pair of the memory cells MCadp and MCbup or the like) or the memory cells with the same index "q" (a pair of the memory cells MCadq and MCbuq or the like) in the memory cell array 10a and the memory cell array 10b. However, the first modification is not limited to the foregoing example. Specifically, data can be read at the same time from all combinations of the two memory cells MC with different indexes "d" and "u" in the memory cell arrays 10a and 10b.

More specifically, as shown in FIG. 36, for example, data is read from the memory cell MCadp and data is read from the memory cell MCbup at the same time. However, the present invention is not limited to this but data may be read from the memory cell MCadp and data may be read from the memory cell MCbuq at the same time.

Figure 41:
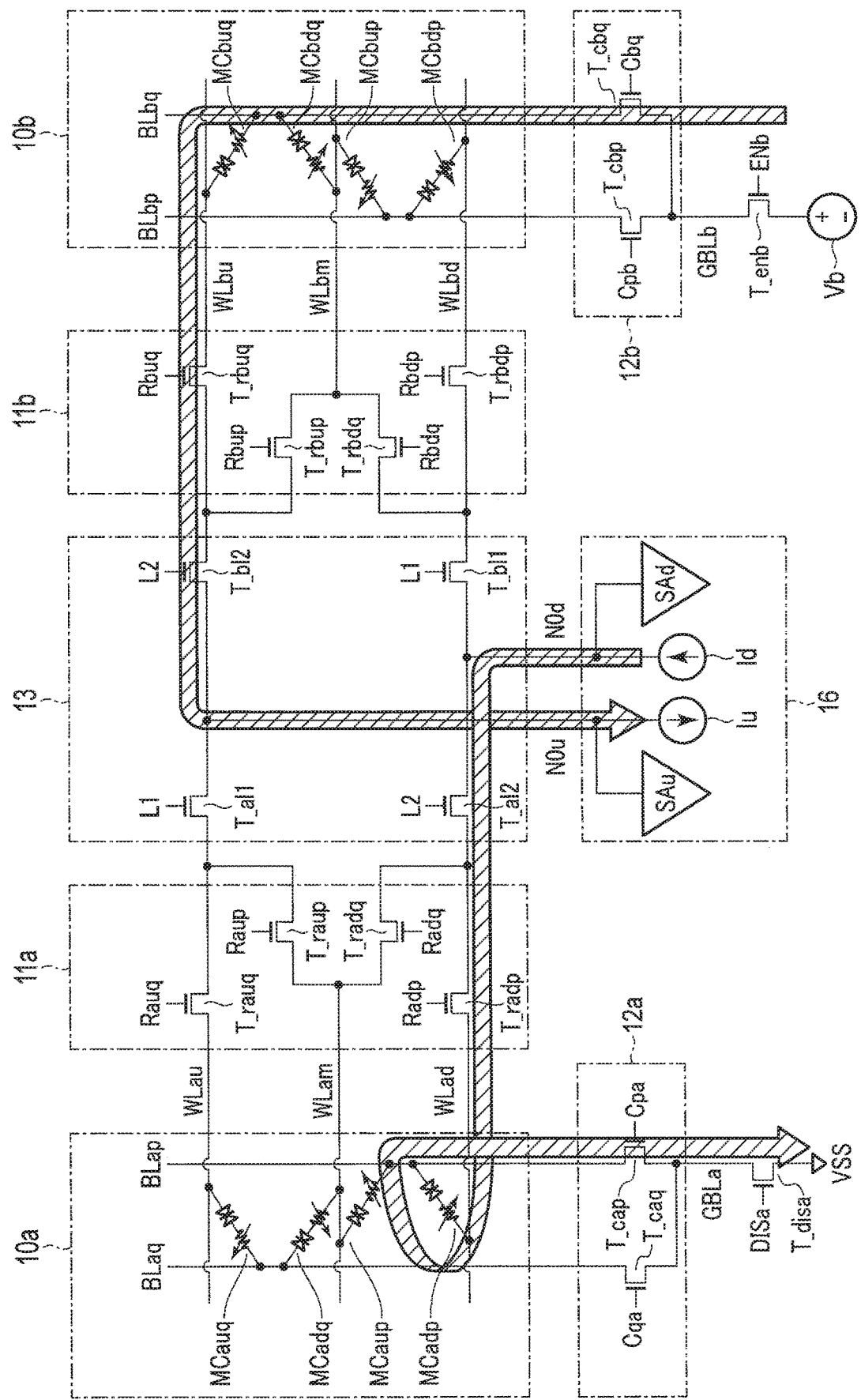
FIG. 41 is a schematic view for explaining current paths at a read operation in the magnetic storage device according to a further modification of the first modification.

FIG. 41 is a schematic view showing an outline of a current path at the read operation in a magnetic storage device according to a further modification of the first modification. FIG. 41 shows the case where data is read from memory cells MCbuq and MCadp. Hereinafter, operations different from those shown in FIG. 36 will be described. As shown in FIG. 41, the operation of a layer selection circuit 13 is the same as that shown in FIG. 36 and thus descriptions thereof will be omitted.

The row selection circuits 11a and 11b select respectively the word lines WLad and WLbu. Specifically, the row selection circuit 11a inputs "H" level to the signal Radp to turn on the row selection transistor T_radp and inputs "L" level to other signals Rauq, R_aup, and R_adq to turn off the row selection transistors T_rauq, T_raup, and T_radq. The row selection circuit 1ib inputs "H" level tot a signal Rbuq to turn on the row selection transistor T_rbuq, and inputs "L" level to other signals R_bdq, R_bup, and R_bdp to turn off the row selection transistors T_rbdq, T_bup, and T_rbdp.

Accordingly, the word line WLad is charged with current of a constant magnitude flowing from the constant current source Id, and the word line WLbu is charged with current of a constant magnitude flowing into the constant current source Iu.

In addition, column selection circuits 12a and 12b select bit lines BLap and BLbq at the same time. That is, the column selection circuits 12a and 12b turn on row selection transistors T_cap and T_cbq by supplying signals Cpa and Cqb at "H" level based on the same column address. The global bit line GBLa is connected to the voltage VSS via the transistor T_disa, and the global bit line GBLb is connected to the constant voltage source Vb via the transistor T_enb.

Thus, the global bit line GBLa and the bit line BLap are charged with the voltage VSS, and the global bit line GBLb and the bit line BLbq are charged with the constant voltage source Vb.

Accordingly, a read current flows into the memory cell MCadp from the word line WLad to the global bit line GBLa. The sense amplifier SAd can read data from the selected memory cell MCadp based on the current of constant magnitude flowing from the constant current source Id.

Similarly, a read current flows in the memory cell MCbuq from the global bit line GBLb to the word line WLbu. The sense amplifier SAu can read data from the selected memory cell MCbuq based on the current of constant magnitude flowing into the constant current source Iu.

Accordingly, the operation of reading data from the memory cells MCadp and MCbuq is finished.

6.1.6 Advantageous Effects of Present Modification

According to the first modification and the further modification of the first modification, the four memory cells MCdp, MCup, MCdq, and MCuq can be selected by a group of the three word lines WLd, WLm, and WLu and the two bit lines BLp and BLq. In this instance, to read data from the memory cells MCdp and MCdq, the sense amplifier SAd and the constant current source Id are used, and to read data from the memory cells MCup and MCuq, the sense amplifier SAu and the constant current source Iu are used. Further, the memory cell array 10a and 10b share the sense amplifier SAd and the constant current source Id, and share the sense amplifier SAu and the constant current source Iu. Accordingly, it is possible to read data from one of the memory cells MCadp and MCadq in the memory cell array 10a while reading data from one of the memory cell MCbup and MCbuq in the memory cell array 10b. Similarly, it is possible to read data from one of the memory cell MCaup and MCauq in the memory cell array 10a while reading data from one of the memory cell MCbdp and MCbdq in the memory cell array 10b.

6.2 Second Modification

Next, a second modification will be described. In the second modification described below, the role of the word line WLm in the first modification is played by two word lines WL (WLup and WLdq).

6.2.1 Configuration of Memory Cell Array

A configuration of memory cell array in a magnetic storage device according to the second modification will be described.

Figure 42:
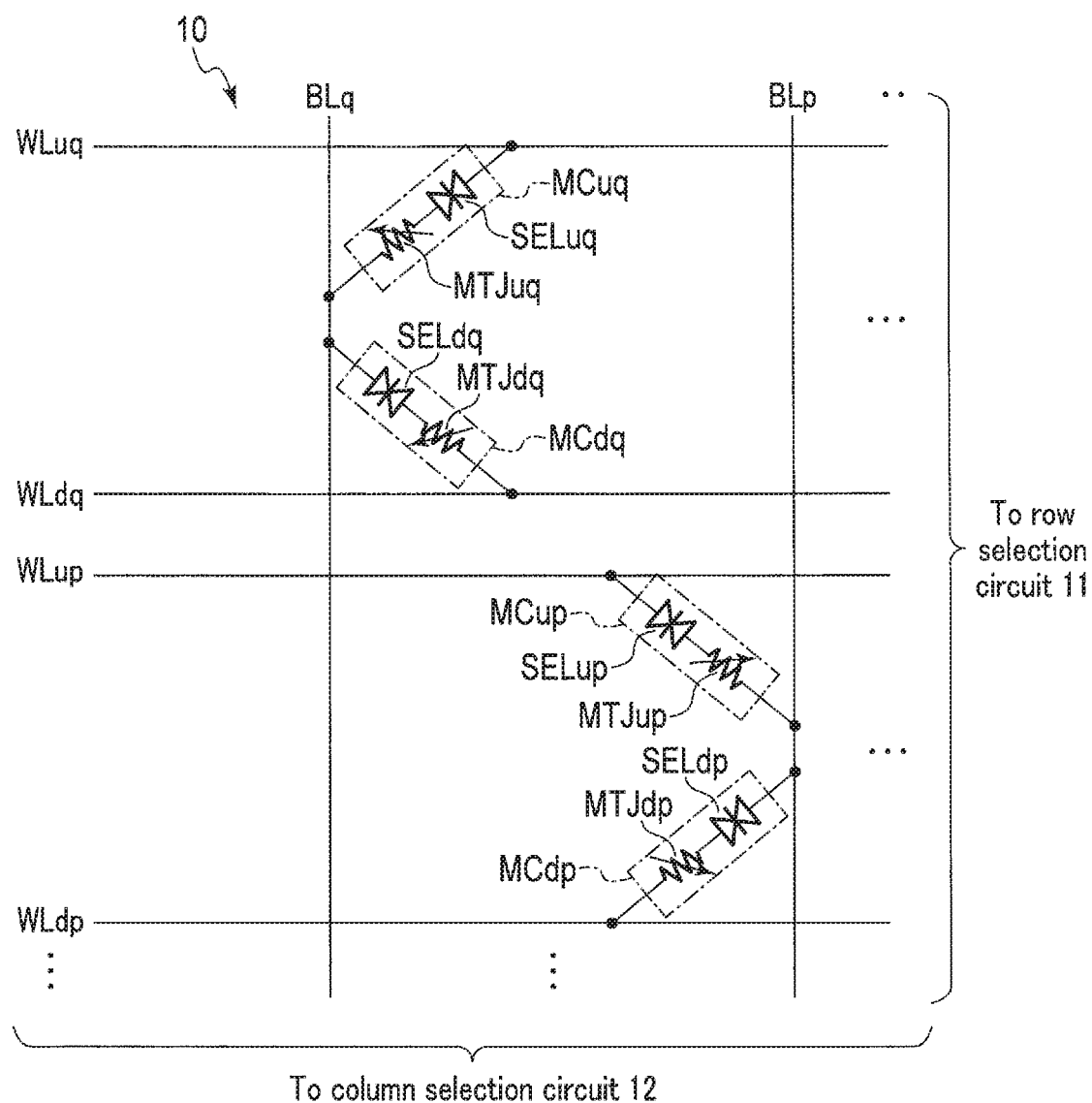
FIG. 42 is a circuit diagram for explaining a configuration of a memory cell array in a magnetic storage device according to a second modification.

FIG. 42 is a circuit diagram showing a configuration of the memory cell array in the magnetic storage device according to the second modification.

As shown in FIG. 42, the memory cell MC is associated with a pair of one of the bit lines BLp and BLq and one of the word lines WLuq, WLdq, WLup, and WLdp. Specifically, the memory cell MCdp connects between the word line WLdp and the bit line BLp, and the memory cell MCup connects between the word line WLup and the bit line BLp. The memory cell MCdq connects between the word line WLdq and the bit line BLq, and the memory cell MCuq connects between the word line WLuq and the bit line BLq.

Figure 43:
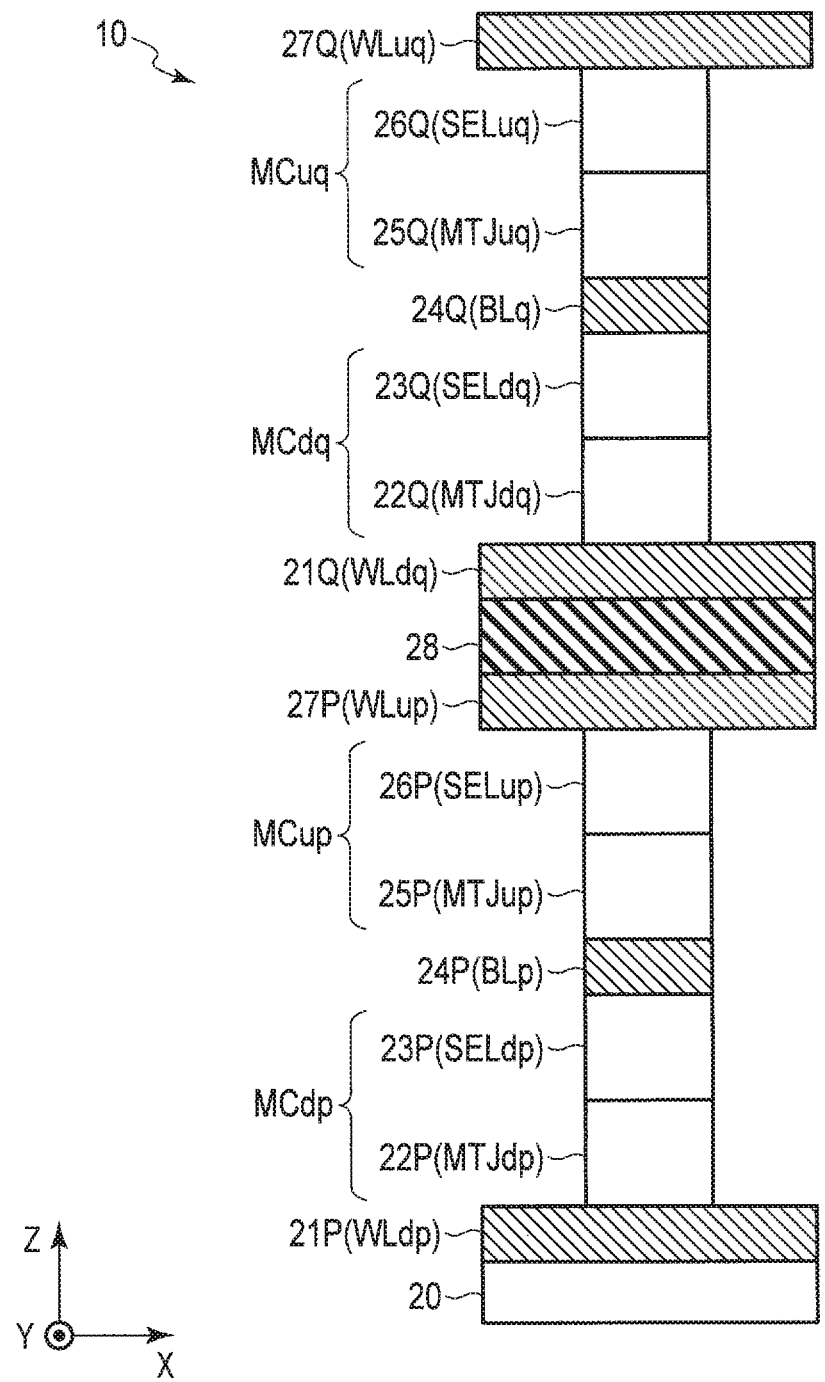
FIG. 43 is a cross-sectional view for explaining a memory cell in the magnetic storage device according to the second modification.

Next, a cross section structure of the memory cell array 10 will be described with reference to FIG. 43. FIG. 43 shows an example of a cross section structure of the memory cell array in the magnetic storage device according to the second modification.

As shown in FIG. 43, on a semiconductor substrate 20, a conductor 21P functioning as a word line WLdp is provided, for example. The conductor 21P extends along the X direction, for example. On the conductor 21P, an element 22P, an element 23P, a conductor 24P, an element 25P, and an element 26P are provided in the same manner as in the first modification shown in FIG. 33.

On the insulator 26P, a conductor 27P functioning as the word line WLup is provided. The conductor 27P extends along the X direction, for example. On the conductor 27P, an insulator 28 is provided. On the insulator 28, a conductor 21Q functioning as the word line WLdq is provided. The conductor 21Q extends along the X direction, for example.

On the conductor 21Q, an element 22Q, an element 23Q, a conductor 24Q, an element 25Q, and an element 26Q are provided in the same manner as in the first modification shown in FIG. 33. On the insulator 26Q, a conductor 27Q functioning as the word line WLuq is provided. The conductor 27Q extends along the X direction, for example.

By being configured as described above, the memory cell array 10 has a cross-point structure in which the four memory cells MCdp, MCup, MCdq, and MCuq are layered in the Z direction corresponding to the four word lines WLdp, WLup, WLdq, and WLuq and the two bit lines BLp and BLq.

6.2.2 Configuration of Circuits Connected in Row Direction to Memory Cell Arrays Next, a configuration of circuits connected in the row direction to the memory cell arrays 10 configured as described above according to the second modification will be described with reference to FIG. 44.

As shown in FIG. 44, word lines WLadp, WLaup, WLadq, and WLauq connect between a memory cell array 10a and a row selection circuit 11a. The row selection circuit 11a includes row selection transistors T_radp, T_radq, T_raup, and T_rauq. The row selection transistor T_radp includes a first end connected to the word line WLadp, a second end connected to a node Nad, and a gate to which a signal Radp is supplied. The row selection transistor T_radq includes a first end connected to the word line WLadq, a second end connected to the node Nad, and a gate to which a signal Radq is supplied. The row selection transistor T_raup includes a first end connected to the word line WLaup, a second end connected to a node Nau, and a gate to which a signal Raup is supplied. The row selection transistor T_rauq includes a first end connected to the word line WLauq, a second end connected to the node Nau, and a gate to which a signal Rauq is supplied.

Similarly, word lines WLbdp, WLbup, WLbdq, and WLbuq connect between a memory cell array 10b and a row selection circuit 11b. The row selection circuit 11b includes row selection transistors T_rbdp, T_radq, T_rbup, and T_rbuq. The row selection transistor T_rbdp includes a first end connected to the word line WLbdp, a second end connected to a node Nbd, and a gate to which a signal Rbdp is supplied. The row selection transistor T_rbdq includes a first end connected to the word line WLbdq, a second end connected to the node Nbd, and a gate to which a signal Rbdq is supplied. The row selection transistor T_rbup includes a first end connected to the word line WLbup, a second end connected to a node Nbu, and a gate to which a signal Rbup is supplied. The row selection transistor T_rbuq includes a first end connected to the word line WLbuq, a second end connected to the node Nbu, and a gate to which a signal Rbuq is supplied.

A layer selection circuit 13, write circuits 15ad, 15au, 15bd, and 15bu, and a read circuit 16 are configured in the same manner as in the first modification shown in FIG. 34.

6.2.3 Advantageous Effects of Present Modification

According to the second modification, the four memory cells MCdp, MCup, MCdq, and MCuq can be selected by a group of the four word lines WLdp, WLup, WLdq, and WLuq and the two bit lines BLp and BLq. In this instance, to read data from the memory cells MCdp and MCdq, the sense amplifier SAd and the constant current source Id are used, and to read data from the memory cells MCup and MCuq, the sense amplifier SAu and the constant current source Iu are used. Further, the memory cell array 10a and 10b share the sense amplifier SAd and the constant current source Id, and share the sense amplifier SAu and the constant current source Iu. Accordingly, as in the first modification and the further modification of the first modification, it is possible to read data from one of the memory cells MCadp and MCadq in the memory cell array 10a while reading data from one of the memory cell MCbup and MCbuq in the memory cell array 10b. In addition, it is possible to read data from one of the memory cells MCaup and MCauq in the memory cell array 10a while reading data from one of the memory cells MCbdp and MCbdq in the memory cell array 10b.

6.3 Others

Besides, the foregoing embodiments and modifications can be modified as described below, for example.

In the first modification and the second modification, a plurality of configurations in which two memory cells MC are associated with one bit line BL is layered. However, the present invention is not limited to this. As shown in FIG. 27, for example, a plurality of configurations in which one memory cell MC is associated with one bit line BL may be layered.

In each of the memory cells MC according to the foregoing embodiments and modifications, the selector SEL is provided above the magnetoresistive effect element MTJ but the present invention is not limited to this. For example, in the memory cell MC, the magnetoresistive effect element MTJ may be provided above the selector SEL.

The magnetoresistive effect elements MTJ according to the foregoing embodiments and modifications are of a top-free type except for the magnetoresistive effect element MTJu according to the third embodiment, but the present invention is not limited to this. For example, the magnetoresistive effect element MTJ may be of a bottom-free type. In that case, however, the magnetoresistive effect element MTJu according to the third embodiment is of a top-free type.

The magnetoresistive effect elements MTJ according to the foregoing embodiments and modifications are perpendicular magnetized MTJ. However, the present invention is not limited to this but the magnetoresistive effect elements MTJ may be horizontal magnetized MTJ elements with horizontal magnetic anisotropy.

In the foregoing embodiments and modifications, an MRAM storing data using the magnetic tunnel junction (MTJ) element as a resistive change element is taken as an example, but the present invention is not limited to this.

The embodiments are applicable to all memories that have a storage element sensing a difference in resistance between resistive change elements by converting it into a difference in current or voltage.

In other words, the embodiments are applicable to semiconductor storage devices that can store data by resistive changes resulting from application of a current or a voltage or can read stored data by converting a difference in resistance resulting from resistive changes into a difference in current or voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a first memory cell and a second memory cell each of which includes a resistive change element and a selector;
a first conductor electrically coupled to a first end of the first memory cell;
a second conductor which electrically couples between a second end of the first memory cell and a first end of the second memory cell;
a third conductor electrically coupled to a second end of the second memory cell;
a first constant current source which is capable of coupling electrically to the first memory cell via the first conductor;
a second constant current source which is capable of coupling electrically to the second memory cell via the third conductor;
a first sense amplifier configured to read data from the first memory cell based on a current flowing from the first constant current source to the first memory cell; and
a second sense amplifier configured to read data from the second memory cell based on a current flowing from the second memory cell to the second constant current source.

2. The device of claim 1, further comprising
a first memory cell array and a second memory cell array each of which includes the first memory cell, the second memory cell, the first conductor, the second conductor, and the third conductor.

3. The device of claim 2, wherein
the first sense amplifier is configured to read data based on a current flowing from the first constant current source to the first memory cell in the first memory cell array or a current flowing from the first constant current source to the first memory cell in the second memory cell array, and
the second sense amplifier is configured to read data based on a current flowing from the second memory cell in the first memory cell array to the second constant current source or a current flowing from the second memory cell in the second memory cell array to the second constant current source.

4. The device of claim 3, wherein, during an operation of reading data from the first memory cell array and the second memory cell array, the second conductor in the first memory cell array and the second conductor in the second memory cell array are selected together.

5. The device of claim 3, wherein,
during an operation of reading data from the first memory cell array and the second memory cell array,
the first conductor in the first memory cell array and the third conductor in the second memory cell array are selected together, and
the third conductor in the first memory cell array and the first conductor in the second memory cell array are selected together.

6. The device of claim 1, further comprising:
a third memory cell and a fourth memory cell each of which includes the resistive change element and the selector;
a fourth conductor which electrically couples between a second end of the third memory cell and a first end of the fourth memory cell; and
a fifth conductor electrically coupled to a second end of the fourth memory cell, wherein
the third conductor electrically couples between the second end of the second, memory cell and a first end of the third memory cell,
the first constant current source is capable of coupling electrically to the third memory cell via the third conductor,
the second constant current source is capable of coupling electrically to the fourth memory cell via the fifth conductor,
the first sense amplifier is configured to read data from the third memory cell based on a current flowing from the first constant current source to the third memory cell, and
the second sense amplifier is configured to read data from the fourth memory cell based on a current flowing from the fourth memory cell to the second constant current source.

7. The device of claim 6, further comprising
a first memory cell array and a second memory cell array each of which includes the first memory cell, the second memory cell, the third memory cell, the fourth memory cell, the first conductor, the second conductor, the third conductor, the fourth conductor, and the fifth conductor.

8. The device of claim 7, wherein
the first sense amplifier is configured to read data based on a current flowing from the first constant current source to the first memory cell in the first memory cell array, a current flowing from the first constant current source to the third memory cell in the first memory cell array, a current flowing from the first constant current source to the first memory cell in the second memory cell array, or a current flowing from the first constant current source to the third memory cell in the second memory cell array, and the second sense amplifier is configured to read data based on a current flowing from the second memory cell in the first memory cell array to the second constant current source, a current flowing from the fourth memory cell in the first memory cell array to the second constant current source, a current flowing from the second memory cell in the second memory cell array to the second constant current source, or a current flowing from the fourth memory cell in the second memory cell array to the second constant current source.

9. The device of claim 8, wherein, during an operation of reading data from the first memory cell array and the second memory cell array, the second conductor in the first memory cell array and the second conductor in the second memory cell array are selected together, and the fourth conductor in the first memory cell array and the fourth conductor in the second memory cell array are selected together.

10. The device of claim 8, wherein, during an operation of reading data from the first memory cell array and the second memory cell array, the second conductor in the first memory cell array and the fourth conductor in the second memory cell array are selected together, and the fourth conductor in the first memory cell array and the second conductor in the second memory cell array are selected together.

11. The device of claim 8, wherein during an operation of reading data from the first memory cell array by the first sense amplifier and reading data from the second memory cell array by the second sense amplifier, one of the first conductor and the third conductor in the first memory cell array and one of the third conductor and the fifth conductor in the second memory cell array are selected together, and during an operation of reading data from the second memory cell array by the first sense amplifier and reading data from the first memory cell array by the second sense amplifier, one of the third conductor and the fifth conductor in the first memory cell array and one of the first conductor and the third conductor in the second memory cell array are selected together.

12. The device of claim 1, further comprising:

a third memory cell and a fourth memory cell each of which includes the resistive change element and the selector;

a fourth conductor electrically coupled to a first end of the third memory cell;

a fifth conductor which electrically couples between a second end of the third memory cell and a first end of the fourth memory cell; and a sixth conductor electrically coupled to a second end of the fourth memory cell, wherein the first constant current source is capable of coupling electrically to the third memory cell via the fourth conductor, the second constant current source is capable of coupling electrically to the fourth memory cell via the sixth conductor, the first sense amplifier is configured to reads data from the third memory cell based on a current flowing from the first constant current source to the third memory cell, and the second sense amplifier is configured to read data from the fourth memory cell based on a current flowing from the fourth memory cell to the second constant current source.

13. The device of claim 12, further comprising a first memory cell array and a second memory cell array each of which includes the first memory cell, the second memory cell, the third memory cell, the fourth memory cell, the first conductor, the second conductor, the third conductor, the fourth conductor, the fifth conductor, and the sixth conductor.

14. The device of claim 13, wherein, during an operation of reading data from the first memory cell array and the second memory cell array, the second conductor in the first memory cell array and the second conductor in the second memory cell array are selected together, and the fifth conductor in the first memory cell array and the fifth conductor in the second memory cell array are selected together.

15. The device of claim 13, wherein, during an operation of reading data from the first memory cell array and the second memory cell array, the second conductor in the first memory cell array and the fifth conductor in the second memory cell array are selected together, and the fifth conductor in the first memory cell array and the second conductor in the second memory cell array are selected together.

16. The device of claim 13, wherein during an operation of reading data from the first memory cell array by the first sense amplifier and reading data from the second memory cell array by the second sense amplifier, one of the first conductor and the fourth conductor in the first memory cell array and one of the third conductor and the sixth conductor in the second memory cell array are selected together, and during an operation of reading data from the second memory cell array by the first sense amplifier and reading data from the first memory cell array by the second sense amplifier, one of the third conductor and the sixth conductor in the first memory cell array and one of the first conductor and the fourth conductor in the second memory cell array are selected together.

17. A semiconductor storage device comprising:

a first memory cell and a second memory cell each of which includes a resistive change element and a selector;

a first conductor electrically coupled to a first end of the first memory cell;

a second conductor which electrically couples between a second end of the first memory cell and a first end of the second memory cell;

a third conductor electrically coupled to a second end of the second memory cell;

a constant current source which is capable of coupling electrically to the first memory cell via the first conductor and is capable of coupling electrically to the second memory cell via the third conductor; and a sense amplifier, wherein the sense amplifier is configured to read data from the first memory cell based on a current flowing from the constant current source to the first memory cell via the first conductor, and the sense amplifier is configured to read data from the second memory cell based on a current flowing from the constant current source to the second memory cell via the third conductor.

18. The device of claim 17, wherein
the resistive change element includes a first ferromagnetic material, a second ferromagnetic material, and a nonmagnetic material disposed between the first ferromagnetic material and the second ferromagnetic material, and
in the resistive change element in the first memory cell and the resistive change element in the second memory cell, the first ferromagnetic material, the nonmagnetic material, and the second ferromagnetic material are stacked in a same direction.

19. The device of claim 17, wherein
the resistive change element includes a first ferromagnetic material, a second ferromagnetic material, and a nonmagnetic material disposed between the first ferromagnetic material and the second ferromagnetic material, and
in the resistive change element in the first memory cell and the resistive change element in the second memory cell, the first ferromagnetic material, the nonmagnetic material, and the second ferromagnetic material are stacked in a opposite direction.

20. A semiconductor storage device comprising:
a first memory cell and a second memory cell each of which includes a resistive change element and a selector;
a first conductor electrically coupled to a first end of the first memory cell;
a second conductor which electrically couples between a second end of the first memory cell and a first end of the second memory cell;
a third conductor electrically coupled to a second end of the second memory cell;
a constant current source which is capable of coupling electrically to the first memory cell via the first conductor and is capable of coupling electrically to the second memory cell via the second conductor; and
a sense amplifier, wherein
the sense amplifier is configured to read data from the first memory cell based on a current flowing from the constant current source to the first memory cell via the first conductor, and
the sense amplifier is configured to read data from the second memory cell based on a current flowing from the constant current source to the second memory cell via the second conductor.

* * * * *